(12) United States Patent
New

(10) Patent No.: US 6,346,824 B1
(45) Date of Patent: Feb. 12, 2002

(54) DEDICATED FUNCTION FABRIC FOR USE IN FIELD PROGRAMMABLE GATE ARRAYS

(75) Inventor: Bernard J. New, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/627,247

(22) Filed: Jul. 27, 2000

Related U.S. Application Data

(63) Continuation-in-part of application No. 09/049,966, filed on Mar. 27, 1998, now Pat. No. 6,154,049, and a continuation-in-part of application No. 09/105,188, filed on Jun. 26, 1998, now Pat. No. 6,184,709, which is a continuation-in-part of application No. 08/631,298, filed on Apr. 9, 1996, now Pat. No. 5,796,269.

(51) Int. Cl.⁷ .............................................. G06F 7/38
(52) U.S. Cl. ............................. 326/39; 326/40; 326/41
(58) Field of Search ............................. 326/38, 39, 40, 326/41

(56) References Cited

U.S. PATENT DOCUMENTS

| | | | |
|---|---|---|---|
| 4,825,414 A | | 4/1989 | Kawata |
| 5,042,004 A | | 8/1991 | Agrawal et al. |
| 5,343,406 A | | 8/1994 | Freeman |
| 5,414,377 A | | 5/1995 | Freidin |
| 5,483,178 A | * | 1/1996 | Costello et al. ............... 326/41 |
| 5,565,793 A | * | 10/1996 | Pedersen ..................... 326/41 |
| 5,583,450 A | | 12/1996 | Trimberger et al. |
| 5,629,886 A | * | 5/1997 | New ......................... 364/787 |
| 5,689,195 A | * | 11/1997 | Cliff et al. .................... 326/41 |
| 5,764,079 A | * | 6/1998 | Patel et al. ................... 326/40 |
| 5,796,269 A | | 8/1998 | New |
| 5,880,597 A | | 3/1999 | Lee |
| 5,898,319 A | | 4/1999 | New |
| 5,910,732 A | | 6/1999 | Trimberger |

OTHER PUBLICATIONS

Xilinx, Inc., The Programmable Logic Data Book (1994), pp. 2–20 thru 2–21.
Xilinx, Inc., The Programmable Logic Data Book (1994), pp. 2–5 thru 2–102.
Xilinx, Inc., The Programmable Logic Data Book (1996), pp. 4–21 thru 4–23.
Xilinx, Inc., The Programmable Logic Data Book (Sep. 1996), pp. 4–5 thrugh 4–96.
Xilinx, Inc., XC4000 Series, Feb. 2, 1996.

\* cited by examiner

Primary Examiner—Michael Tokar
(74) Attorney, Agent, or Firm—Bever Hoffman & Harms, LLP

(57) ABSTRACT

A programmable logic device, such as a field programmable gate array (FPGA) which includes an array of configurable logic elements (CLEs) and a corresponding array of dedicated function blocks. The CLEs can be operated as conventional configurable logic elements, completely disconnected from the array of function blocks. However, selected CLEs can also be coupled to selected function blocks, thereby creating a relatively high density circuit to implement the dedicated function. The function blocks can be selectively coupled to one another, such that the function blocks are connected to form a relatively large circuit. The desired input signals are routed into the function blocks from associated CLEs. Similarly, the resulting output signals are routed from the function blocks to associated CLEs. In this manner, the FPGA is capable of implementing a relatively large circuit having the dedicated function in an efficient manner.

7 Claims, 31 Drawing Sheets

|   |   |   | X3 | X2 | X1 | X0 |   |
|---|---|---|---|---|---|---|---|
|   |   | * | Y3 | Y2 | Y1 | Y0 |   |
|   |   |   | X3Y0 | X2Y0 | X1Y0 | X0Y0 | ← 101 |
|   |   | X3Y1 | X2Y1 | X1Y1 | X0Y1 | ---- | ← 102 |
|   | X3Y2 | X2Y2 | X1Y2 | X0Y2 | ---- | ---- | ← 103 |
| X3Y3 | X2Y3 | X1Y3 | X0Y3 | ---- | ---- | ---- | ← 104 |
| P7 | P6 | P5 | P4 | P3 | P2 | P1 | P0 |

|   |   |   |   | X3 | X2 | X1 | X0 |   |
|---|---|---|---|---|---|---|---|---|
|   |   |   | * | Y3 | Y2 | Y1 | Y0 |   |
|   |   |   |   | X3Y0 | X2Y0 | X1Y0 | X0Y0 | ← 101 |
|   |   |   | X3Y1 | X2Y1 | X1Y1 | X0Y1 | ∅ | ← 102 |
|   |   | C4 | C3 | C2 | C1 | ∅ | ∅ |   |
|   |   | C4 | PP2 | PP1 | PP0 | P1 | P0 |   |
|   |   | X3Y2 | X2Y2 | X1Y2 | X0Y2 | ∅ | ∅ | ← 103 |
|   | C8 | C7 | C6 | C5 | ∅ | ∅ | ∅ |   |
|   | C8 | PP5 | PP4 | PP3 | P2 | P1 | P0 |   |
|   | X3Y3 | X2Y3 | X1Y3 | X0Y3 | ∅ | ∅ | ∅ | ← 104 |
| C12 | C11 | C10 | C9 | ∅ | ∅ | ∅ | ∅ |   |
| P7 | P6 | P5 | P4 | P3 | P2 | P1 | P0 | ← P |

FIG. 1B
(PRIOR ART)

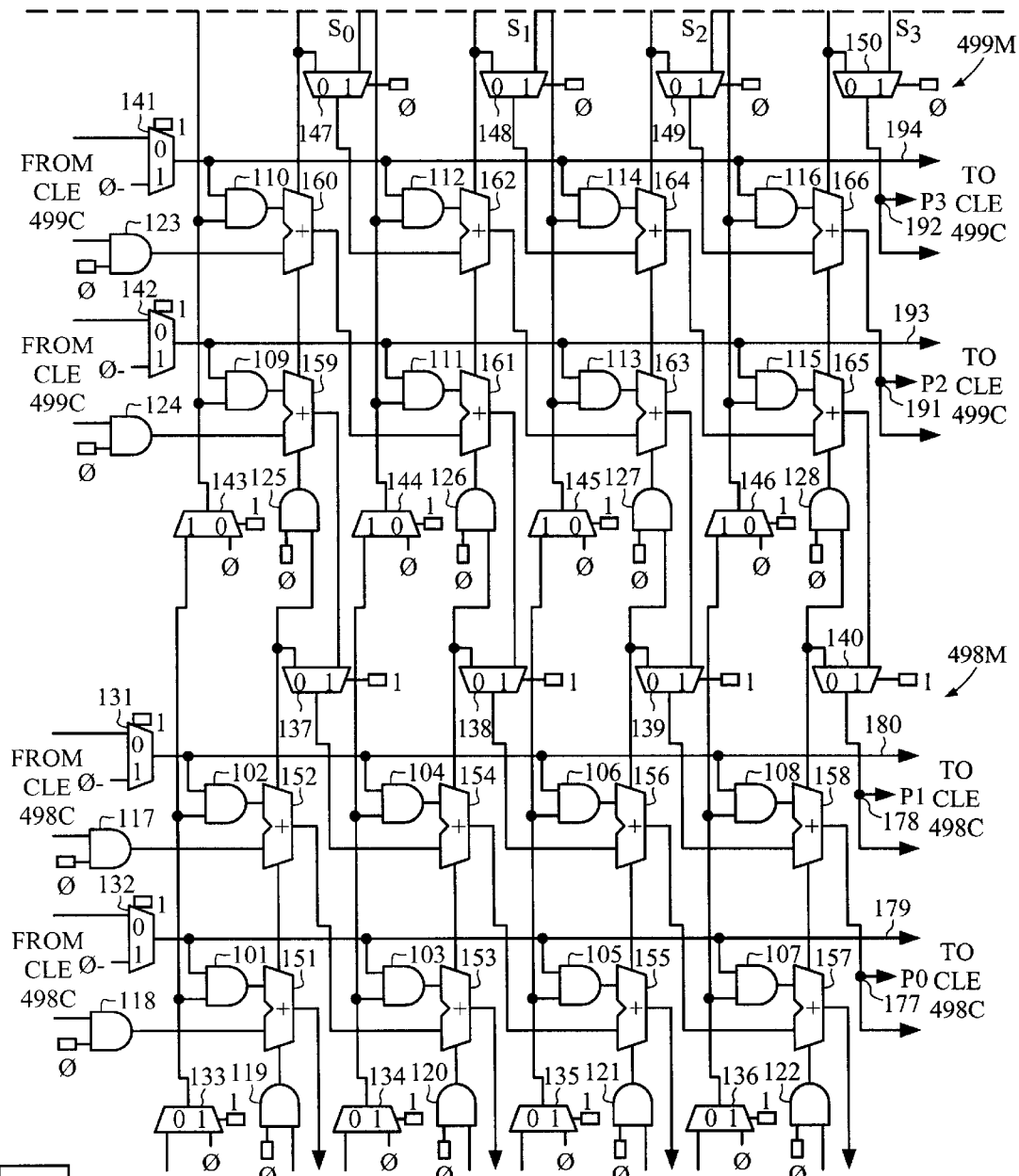
FIG. 9 | FIG. 9A

US 6,346,824 B1

DEDICATED FUNCTION FABRIC FOR USE IN FIELD PROGRAMMABLE GATE ARRAYS

RELATED APPLICATIONS

The present application is a continuation-in-part of U.S. patent application Ser. No. 09/049,966 filed Mar. 27, 1998 now U.S. Pat. No. 6,154,049, and U.S. patent application Ser. No. 09/105,188, filed Jun. 26, 1998, now U.S. Pat. No. 6,184,709 which is a continuation-in-part of Ser. No. 08/631,298 filed Apr. 9, 1996 now U.S. Pat. No. 5,796,269, each of which are hereby incorporated by reference in their entirety.

BACKGROUND OF THE INVENTION

1. Field of the Invention

The present invention relates to an architecture for a field programmable gate array (FPGA). More specifically, the present invention relates to an FPGA that includes a plurality of configurable logic blocks (CLBs), each having a configurable logic element (CLE) and an associated function block.

2. Related Art

FIG. 1A is a representation of the binary multiplication of a 4-bit multiplicand number x with a 4-bit multiplier word Y. Multiplicand number X includes bits X3, X2, X1 and X0 (X3 being the most significant bit and X0 being the least significant bit). Similarly, multiplier word Y includes bits Y3, Y2, Y1 and Y0 (Y3 being the most significant bit and Y0 being the least significant bit). Each bit of multiplicand number x is multiplied by each bit of multiplier word Y as illustrated, thereby creating four partial products 101–104. The first partial product 101 includes each bit of multiplicand number X multiplied by Y0. The second partial product 102 includes each bit of multiplier number X multiplied by Y1. The second partial product 102 is shifted left one place with respect to the first partial product 101, thereby providing the appropriate weight to these partial products. The third and fourth partial products 103 and 104 are created and weighted in a similar manner. The aligned columns of partial products 101–104 are added to create product bits P7–P0. Product bits P7–P0 represent the product P of multiplicand number x and multiplier word Y.

FIG. 1B illustrates the addition of partial products 101–104 in more detail. As illustrated in FIG. 1B, the first and second partial products 101 and 102 are initially added. The values in each column are added, thereby generating six sum signals (C4, PP2, PP1, PP0, P1 and P0) and four carry signals (C1–C4) as illustrated. The sum and carry signals for each column are generated in response to the three input signals associated with the column. The generation of sum and carry signals in response to three generic input signals A, B and C is summarized below in Table 1.

TABLE 1

| A | B | C | SUM | CARRY |
|---|---|---|-----|-------|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Carry signal C1 is the carry result from the addition of X1Y0, X0Y1 and "0". Similarly, carry signal C2 is the carry result from the addition of X2Y0, X1Y1 and C1. Carry signal C3 is the carry result from the addition of X3Y0, X2Y1 and C2. Finally, carry signal C4 is the carry result from the addition of X3Y1, C3 and "0".

Six sum signals (C4, PP2, PP1, PP0, P1 and P0) result from the addition of partial products 101 and 102. Sum signal P0 (which is also product bit P0) is equal to X0Y0. Sum signal P1 (which is also product bit P1) is the sum result of X1Y0, X0Y1 and "0". Sum signal PP0 is the sum result of X2Y0, X1Y1 and C1. Sum signal PP1 is the sum result of X3Y0, X1Y1 and C2. Sum signal PP2 is the sum result of X3Y1 and C3.

Partial product 103 is added to the six sum signals that result from the addition of partial products 101 and 102. Seven sum signals (C8, PP5, PP4, PP3, P2, P1 and P0) and four carry signals (C5–C8) are generated by this addition operation as illustrated. Partial product 104 is then added to the seven sum signals resulting from the addition of partial products 101, 102 and 103. Sum signals (i.e., the product bits P7–P0) and carry signals C9–C12 are generated during this addition operation as illustrated.

FIG. 2 is a circuit diagram of a conventional 4×4 bit multiplier circuit 200 for implementing the multiplication operation illustrated in FIGS. 1A and 1B. Multiplier circuit 200 includes AND gates 201–216 and adder circuits 221–236. Each of adder circuits 221–236 provides a sum signal and a carry signal in response to three input signals in the manner set forth in Table 1. Each of AND gates 201–216 has a first input terminal which is coupled to receive a selected one of the multiplicand bits X3–X0. Similarly, each of AND gates 201–216 has a second input terminal which is coupled to receive a selected one of the multiplier bits Y3–Y0. AND gates 201–216 operate to multiply the X and Y bits. The truth tables for the logical AND of two bits and the arithmetic product of two bits are identical, the result being a logic "1" value only if both bits have logic "1" values, the result being a logic "0" otherwise. As a result, AND gates 201–216 provide the terms of partial products 101, 102, 103 and 104. More specifically, AND gates 201–204 provide the terms of partial product 101; AND gates 205–208 provide the terms of partial product 102; AND gates 209–212 provide the terms of partial product 103; and AND gates 213–216 provide the terms of partial product 104. The terms of partial products 101–104 are provided to adder circuits 221–236 as illustrated. Note that the terms of partial products 101–104 are shifted down in successive columns, thereby providing the appropriate weighting to the partial products. Adder circuits 221–236 add partial products 101–104 in the manner illustrated in FIG. 1B, thereby creating product bits P7–P0. The carry signals C1–C12 and sum signals PP0–PP5 previously described in connection with FIG. 1B are illustrated in FIG. 2, thereby showing the manner in which multiplier circuit 200 implements the multiplication operation of FIG. 1B.

FIG. 3, which includes FIGS. 3A and 3B, is a circuit diagram illustrating the implementation of multiplier circuit 200 in an FPGA. The FPGA includes an array of configurable logic blocks (CLBS), which includes CLBs 301–316. Programmable interconnect resources extend between the CLBs, thereby allowing the illustrated connections to be made. The resources present within each CLB can be configured to implement either a pair of adder circuits or a pair of AND gates. For example, CLB 302 is configured to implement AND gates 201 and 202, and CLB 304 is configured to implement adder circuits 221 and 222. A total of eight CLBs (i.e., CLBs 301–302, 305–306, 309–310 and 313–314) are required to implement AND gates 201–216. A total of eight CLBs (i.e., CLBs 303–304, 307–308, 311–312 and 315–316) are required to implement adder circuits 221–236. As a result, at least sixteen CLBs are required to implement multiplier circuit 200. This typically represents a significant portion of the FPGA resources. As a result, it is fairly inefficient to implement multiplier circuit 200 in an FPGA.

Some FPGAs enable one or more of AND gates 201–202 to be implemented in CLB 304. However, even if both of AND gates 201–202 are implemented in CLB 304, at least eight CLBs are required to implement multiplier circuit 200. This still represents a significant portion of the FPGA resources. In general, multiplier circuits cannot be implemented efficiently in a conventional FPGA because of the relatively large number of CLBs required to form the multiplier circuit.

It would therefore be desirable to have an FPGA which is capable of efficiently performing multiplication operations.

Furthermore, within an FPGA, each CLB includes logic which is programmed to perform a particular function or functions desired by the user of the FPGA. In particular FPGAs, such as Xilinx's XC4000 family of devices, writable RAM-based look-up tables are included in each CLB. The writable RAM-based look-up tables can be used to create a "user-RAM" array. However, such user-RAM arrays are inefficient because creation of the RAM array detracts from the amount of logic available to perform other operations within the FPGA. That is, when a CLB is used to create user-RAM array, the logic capacity of the CLB is lost.

Moreover, the RAM arrays which can be conveniently created using the writable RAM-based look-up tables are relatively small (e.g., capable of storing only 16 to 32 bytes). To expand a RAM array (e.g., to more than 16 or 32 bytes), function generators of additional CLBs are required to perform a multiplexing function between the several smaller RAM arrays. As a result, the complexity of the signal routing for the RAM array increases, the amount of logic required by the RAM array increases, and the speed of the RAM array decreases.

For example, when implementing a 256-byte RAM, the CLB area consumed is roughly equivalent to the area of a conventional FPGA. While a 256-byte RAM may seem like a large memory to implement using a FPGA, such a RAM is still relatively small.

Moreover, the layout area required to make each RAM-based look-up table writable is not an insignificant percentage of the layout area of each CLB. This area penalty is incurred by each CLB, irrespective of whether it is used to create a user-RAM array. The total area penalty for a FPGA depends on the size of the FPGA and can be equal to the area of 100 or more CLBs.

Accordingly, it would be desirable to have a FPGA which implements a user-RAM array and overcomes the problems previously discussed.

SUMMARY

Accordingly, the present invention provides a programmable logic device (PLD), such as an FPGA, which includes an array of configurable logic elements (CLEs) and a corresponding array of dedicated function blocks. In one embodiment, the dedicated function blocks are multiplier tiles, thereby enabling the programmable logic device to efficiently implement a multiplier function. In another embodiment, the dedicated function blocks are memory tiles, thereby enabling the programmable logic device to efficiently provide a memory function.

When the dedicated function blocks are multiplier tiles, each of the CLEs includes circuitry that can be programmed to implement various logic functions. Each of the multiplier tiles includes a dedicated multiplier array having a predetermined size (e.g., a 2×4 bit multiplier array). Programmable interconnect resources can be programmed to selectively connect the CLEs to the multiplier tiles. The programmable interconnect resources can also be programmed to selectively connect the CLEs to one another, and to selectively connect the multiplier tiles to one another. In one embodiment, the programmable interconnect resources include a plurality of multiplexers.

As a result, the CLEs can be operated as conventional configurable logic elements, completely disconnected from the array of multiplier tiles by the programmable interconnect resources.

Alternatively, selected multiplier tiles can be connected to one another by the programmable interconnect resources, thereby creating a relatively high density multiplier circuit. Selected CLEs are coupled to these multiplier tiles, thereby providing an interface to this multiplier circuit. In general, the desired multiplier and multiplicand bits are routed from the CLEs to the multiplier tiles. The resulting product bits are routed from the multiplier tiles to associated CLEs. In this manner, the FPGA is capable of implementing a relatively large multiplier circuit in a resource efficient manner.

Various multiplier architectures can be used to form the multiplier tiles. These multiplier architectures can be capable of performing signed and/or unsigned multiplication operations, as well as signed/unsigned multiplication operations. Similarly, carry-propagate or carry-save multiplier architectures can be used. When a carry-save multiplier architecture is used, selected multiplier tiles will provide carry and sum signals that must be added to create the final product bits. In this embodiment, these carry and sum signals are routed into the CLE associated with the multiplier tile, and then added within this CLE.

In accordance with another embodiment, the dedicated function blocks are memory tiles. The dedicated memory tiles have a relatively high density when compared with the density of writable RAM-based look-up tables typically present in CLEs. The PLD also includes an array of CLEs, wherein each of the CLEs in the array is coupled to a corresponding one of the memory tiles. The composable RAM array is accessed through the CLEs. That is, the input signals required by the memory tiles are routed through the corresponding CLEs. Similarly, the output signals provided by the memory tiles are routed out through the corresponding CLEs.

Each CLE can be configured to operate as a conventional CLE (i.e., ignore its corresponding memory tile). Alternatively, each CLE can be configured to provide an interface to its corresponding memory tile. To help achieve this, each CLE comprises a set of multiplexers for selectively routing data output signals provided by the corresponding memory tile or output signals provided by the CLE.

In addition, each memory tile is capable of being selectively coupled to one or more adjacent memory tiles, thereby allowing the size of the composable RAM array to be selected by the circuit designer. This capability also allows the composable RAM array to be configured to form a plurality of separate and independent memories.

The present invention will be more fully understood in view of the following description and drawings.

BRIEF DESCRIPTION OF THE DRAWINGS

FIGS. 1A and 1B are representations of the binary multiplication of a 4-bit multiplicand X with a 4-bit multiplier Y;

FIG. 9, which includes FIGS. 9A and 9B, is a circuit diagram illustrating the multiplier tiles of FIG. 8;

DETAILED DESCRIPTION

Figure 4:
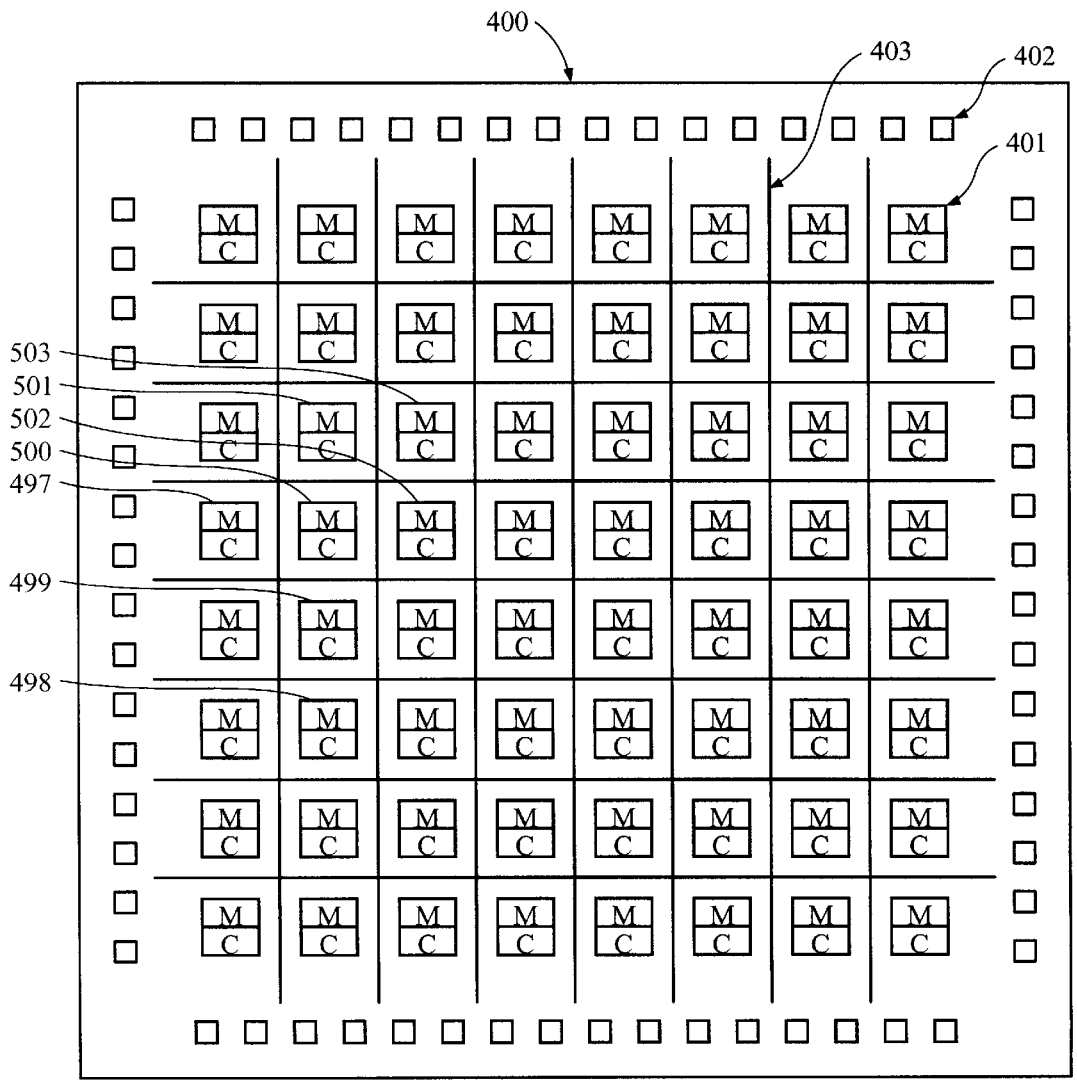
FIG. 4 is a block diagram of a field programmable gate array (FPGA) in accordance with one embodiment of the present invention.

FIG. 4 is a block diagram of a field programmable gate array (FPGA) 400 in accordance with one embodiment of the present invention. FPGA 400 includes a centrally located array 401 of configurable logic blocks (CLBs) and a plurality of programmable input/output blocks (IOBs) 402 located around the perimeter of FPGA 400. CLB array 401 includes a plurality CLBs, such as CLBs 497–503, which are arranged in a plurality of rows and columns. Each of the CLBs in CLB array 401 includes a configurable logic element (CLE) and a multiplier tile. These CLEs and multiplier tiles are labeled with C's and M's, respectively, in FIG. 4. As described in more detail below, programmable interconnect resources 403 extend between the various CLEs, multiplier tiles and IOBs, thereby providing programmable routing paths between these elements.

In general, the CLEs of CLB array 401 provide functional elements for constructing a logic circuit. In addition, these CLEs provide an interface for accessing the multiplier tiles. The multiplier tiles, in turn, are high density multiplier circuits, which can be interconnected to form relatively large multiplier circuits. IOBs 402 provide an interface between the external pins of FPGA 400 and CLB array 401. Customized configuration of FPGA 400 is achieved by programming internal static configuration memory cells that determine the logic functions and interconnections of CLBs 401, IOBs 402 and programmable interconnect resources 403.

Figure 5:
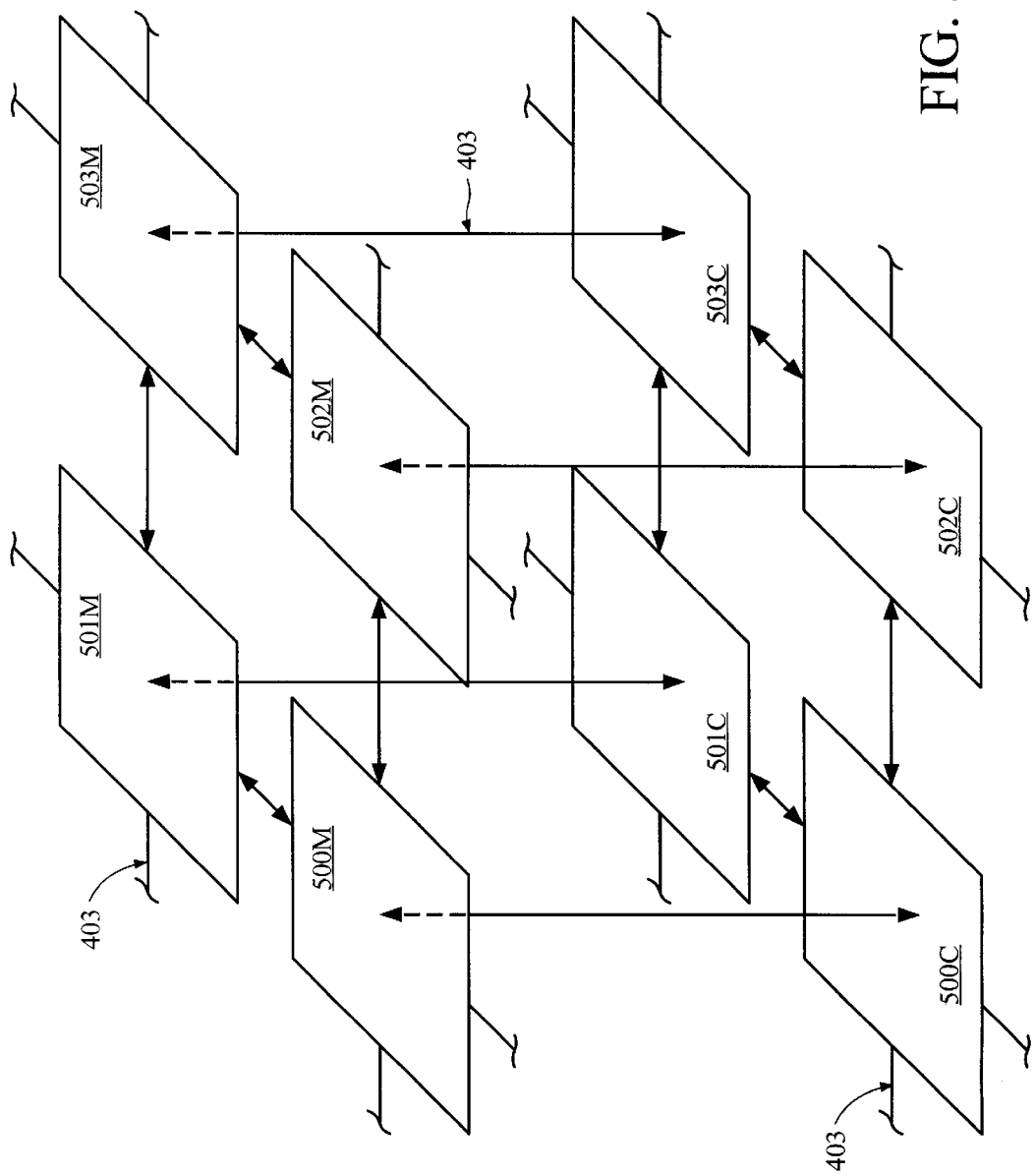
FIG. 5 is a schematic diagram illustrating the programmable interconnect resources coupled to configurable logic blocks (CLBS) in the FPGA of FIG. 4.

FIG. 5 is a schematic diagram illustrating the programmable interconnect resources 403 that are coupled to CLBs 500–503. In FIG. 5, the CLEs associated with CLBs 500–503 are labeled as CLEs 500C–503C, respectively. Similarly, the multiplier tiles associated with CLBs 500–503 are labeled as multiplier tiles 500M–503M.

General purpose programmable interconnect resources 403 extend between CLEs 500C–503C, thereby enabling various CLEs to be coupled to one another during the configuration of the FPGA 400. Although programmable interconnect resources are only shown extending between adjacent CLEs, it is understood that programmable interconnect resources also extend between non-adjacent CLEs. A more detailed description of programmable interconnect resources extending between CLEs is found in *The Programmable Logic Data Book*, (PN0401253) (1994) pp. 2-5 to 2-102, available from Xilinx, Inc., 2100 Logic Drive, San Jose, Calif., and in *The Programmable Logic Data Book*, (PN0010303) (1996) pp. 4-5 to 2-96, also available from Xilinx, Inc., both of which are hereby incorporated by reference. The programmable interconnect resources extending between CLEs is largely conventional, and is therefore not described here in detail.

Dedicated programmable interconnect resources 403 also extend between adjacent multiplier tiles 500M–503M. As described in more detail below, any number of the multiplier tiles can be coupled to form a multiplier circuit. For example, multiplier tiles 500M–503M can be coupled to form a multiplier circuit. In another example, most, if not all, of the multiplier tiles of FPGA 400 can be connected to form a single large multiplier circuit. In another example, a plurality of smaller multiplier circuits can be implemented by selectively coupling smaller groups of multiplier tiles. Each of the multiplier tiles includes dedicated multiplier circuitry. The dedicated nature of this multiplier circuitry results in the multiplier circuits having a relatively high circuit density and speed.

The programmable interconnect circuitry 403 also extends between CLEs 500C–503C and their associated multiplier tiles 500M–503M, respectively. As described in more detail below, this allows the multiplier and multiplicand to be routed from the CLEs to the multiplier tiles, and allows the product to be routed from the multiplier tiles to the CLEs.

Conceptually, FPGA 400 can be thought of as a conventional FPGA with an array of multiplier tiles located "above" the array of CLEs. Adjacent multiplier tiles can be selectively coupled together to form one or more multiplier circuits. CLEs are coupled to the multiplier tiles to provide the multiplier and multiplicand bits to the appropriate multiplier tiles, and to receive the resulting product bits from the appropriate multiplier tiles. As will become apparent in view of the disclosure below, the only CLEs that must be coupled to their associated multiplier tiles are those CLEs associated with multiplier tiles located at the periphery of a multiplier circuit. For example, if an 8×8 array of multiplier tiles are coupled to form a multiplier circuit, then many of the CLEs associated with the centrally located multiplier tiles need not be coupled to their associated multiplier tiles. This advantageously allows these CLEs to be used for other purposes.

Figure 6:
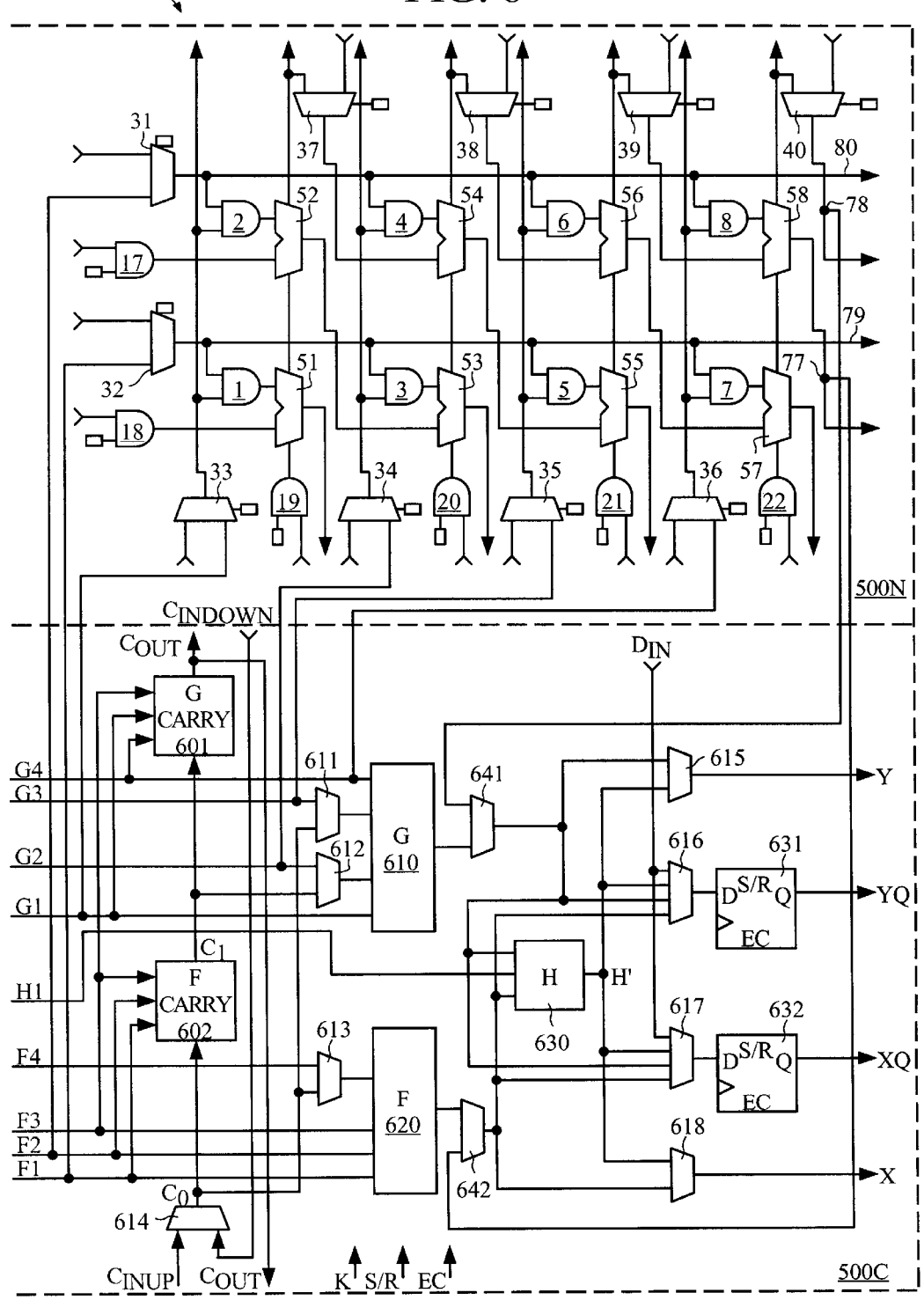
FIG. 6 is a schematic diagram of a CLB in accordance with one embodiment of the present invention.

FIG. 6 is a schematic diagram of CLB 500 in accordance with one embodiment of the present invention. As previously described, CLB 500 includes configurable logic element (CLE) 500C and multiplier tile 500M. These elements are described in more detail below.

CLE 500C includes G carry logic 601, F carry logic 602, G function generator 610, F function generator 620, H function generator 630, multiplexers 611–618, flip flops 631–632 and multiplexers 641–642. CLE 500C can be configured to receive input signals F1–F4, G1–G4, H1, K (clock), S/R (set/reset), EC (enable clock), $C_{IN\ UP}$ (carry in up) and $C_{IN\ DOWN}$ (carry in down). CLE 500C can also be configured to provide output signals X, Y, XQ, YQ and $C_{OUT}$ (carry out). All of the elements of CLE 500C are conventional elements which are found in the XC4000 family of FPGAs available from Xilinx, Inc., and described in more detail in *The Programmable Logic Data Book,* (PN0401253) (1994) pp. 2-5 to 2-102, and in *The Programmable Logic Data Book,* (PN0010303) (1996) pp. 4-5 to 2-96.

A general description of the conventional elements of CLE 500C is provided below. In general, the input and output terminals of CLE 500C are connected to the programmable interconnect resources 403 of FPGA 400. Multiplexer 614 routes either the $C_{IN\ UP}$ or the $C_{IN\ DOWN}$ signal as carry signal $C_0$. F carry logic 602 receives the F1–F3 input signals and the $C_0$ signal as routed by multiplexer 614. In response, F carry logic 602 provides carry signal $C_1$ to G carry logic 601 and to multiplexer 612. G carry logic 601 also receives the G1, G4 and F3 input signals. In response to these input signals, G carry logic 601 provides the carry output signal $C_{OUT}$.

F function generator 620 receives the F1–F3 input signals and either the F4 input signal or the $C_0$ carry signal as routed by multiplexer 613. In response, F function generator 620 generates an output signal F'. G function generator 610 receives the G1 input signal, the G4 input signal, the G2 input signal or the $C_1$ carry signal as routed by multiplexer 612, and the G3 input signal or the $C_0$ carry signal as routed by multiplexer 611. In response, G function generator 610 generates an output signal G'. Each of function generators 610 and 620 is capable of implementing any arbitrarily defined Boolean function of its four input signals. H function generator 630 receives input signals F', G' and H1, and in response, provides an output signal H' which can be any Boolean function of these three input signals.

Multiplexers 615–618 are controlled to route the various signals out of the CLE 500C to programmable interconnect resources 403 as illustrated. Multiplexers (not shown) are controlled to route the K signal or the inverse of the K signal to the clock input terminals of flip-flops 631 and 632. Similarly, multiplexers (not shown) are controlled to route the EC signal or a default logic '1' value to flip flops 631 and 632. Set/reset signals are provided to flip flops 631 and 632 by control circuits (not shown) which operate in response to the S/R input signal.

As described in more detail below, multiplexers 641 and 642, which are non-conventional elements within CLE 500C, are configured to route either the G' and F' output signals, respectively, or two signals received from multiplier tile 500M.

The previously described multiplexers, function generators and carry logic circuits are configured by programming configuration memory cells associated with CLE 500C, in a manner known to those of ordinary skill in the art. Although the present invention is described in connection with a particular CLE circuit, it is understood that other CLE circuits can be used, and are considered to be within the scope of the present invention.

In addition to the previously described elements, CLB 400 includes multiplier tile 500M. Multiplier tile 500M includes AND gates 1–8 and 17–22, two-to-one multiplexers 31–40 and adder circuits 51–58.

Multiplexers 32 and 31 are coupled to receive the F1 and F2 input signals, respectively, from CLE 500C. Multiplexers 32 and 31 can be configured to pass the F1 and F2 input signals, respectively. The second input terminals of multiplexers 31 and 32 are coupled to corresponding output terminals of the left adjacent multiplier tile in CLB 497 (See, FIG. 4). Multiplexers 31 and 32 are controlled by configuration data values that are programmed in attached configuration memory cells. The output terminal of multiplexer 31 is coupled to input terminals of AND gates 2, 4, 6 and 8, and to output terminal 80. The output terminal of multiplexer 32 is coupled to input terminals of AND gates 1, 3, 5 and 7, and to output terminal 79.

AND gates 17 and 18 each have a first input terminal coupled to the left adjacent multiplier tile in CLB 497 (FIG. 4), and a second input terminal coupled to a configuration memory cell. The output terminals of AND gates 17 and 18 are coupled to input terminals of adder circuits 51 and 52, respectively. Multiplexers 33–36 are coupled to receive the G1–G4 input signals, respectively, from CLE 500C. Multiplexers 33–36 can be configured to pass the G1–G4 signals, respectively. The other input terminals of multiplexers 33–36 are coupled to corresponding output terminals of a lower adjacent multiplier tile in CLB 499 (FIG. 4).

Each of multiplexers 33–36 is controlled to pass one of the two applied input signals in response to a configuration data value programmed in an associated configuration memory cell. The output terminal of multiplexer 33 is coupled to input terminals of AND gates 1–2. The output terminal of multiplexer 34 is coupled to input terminals of AND gates 3–4. The output terminal of multiplexer 35 is coupled to input terminals of AND gates 5–6. The output terminal of multiplexer 36 is coupled to input terminals of AND gates 7–8.

Each of AND gates 19–22 has a first input terminal coupled to the lower adjacent multiplier tile in CLB 499 (FIG. 4), and a second input terminal coupled to a configuration memory cell. The output terminals of AND gates 19, 20, 21 and 22 are coupled to carry input terminals of adder circuits 52, 54, 56 and 58, respectively.

The output terminals of AND gates 1–8 are coupled to input terminals of adder circuits 51–58, respectively. The output terminals of adder circuits 51, 53, 55 and 57 are routed to the lower adjacent multiplier tile in CLB 499 (FIG. 4). The output terminals of adder circuits 52, 54 and 56 are routed to input terminals of adder circuits 53, 55 and 57, respectively. The output terminal of adder circuit 58 is coupled to an output terminal 77 and to an input terminal of multiplexer 642 in CLE 500C. Output terminal 77 is coupled to the right adjacent multiplier tile in CLB 502 (FIG. 4).

The carry output terminals of adder circuits 51, 53, 55 and 57 are connected to the carry input terminals of adder circuits 52, 54, 56 and 58, respectively. The carry output terminals of adder circuits 52, 54, 56 and 58 are coupled to input terminals of multiplexers 37, 38, 39 and 40, respectively, and to the upper adjacent multiplier tile in CLB 501 (FIG. 4). The other input terminals of multiplexers 37–40 are coupled to the upper adjacent multiplier tile in CLB 501. The output terminals of multiplexers 37, 38 and 39 are coupled to input terminals of adder circuits 54, 56 and 58, respectively. The output terminal of multiplexer 40 is coupled to output terminal 78 and to an input terminal of multiplexer 641 in CLE 500C. The output terminal 78 is coupled to the right adjacent multiplier tile in CLB 502 (FIG. 4).

In addition to their normal selection functions, multiplexers 31–40 are programmable to drive an arbitrary static signal onto their respective output terminals when multiplier tile 500M is not used. This arbitrary static signal reduces or eliminates unnecessary power dissipation in multiplier tile 500M when multiplier tile 500M is not used. The arbitrary static signal can be, for example, the ground supply voltage. This static signal is not shown in the Figures for purposes of clarity.

Figure 7:
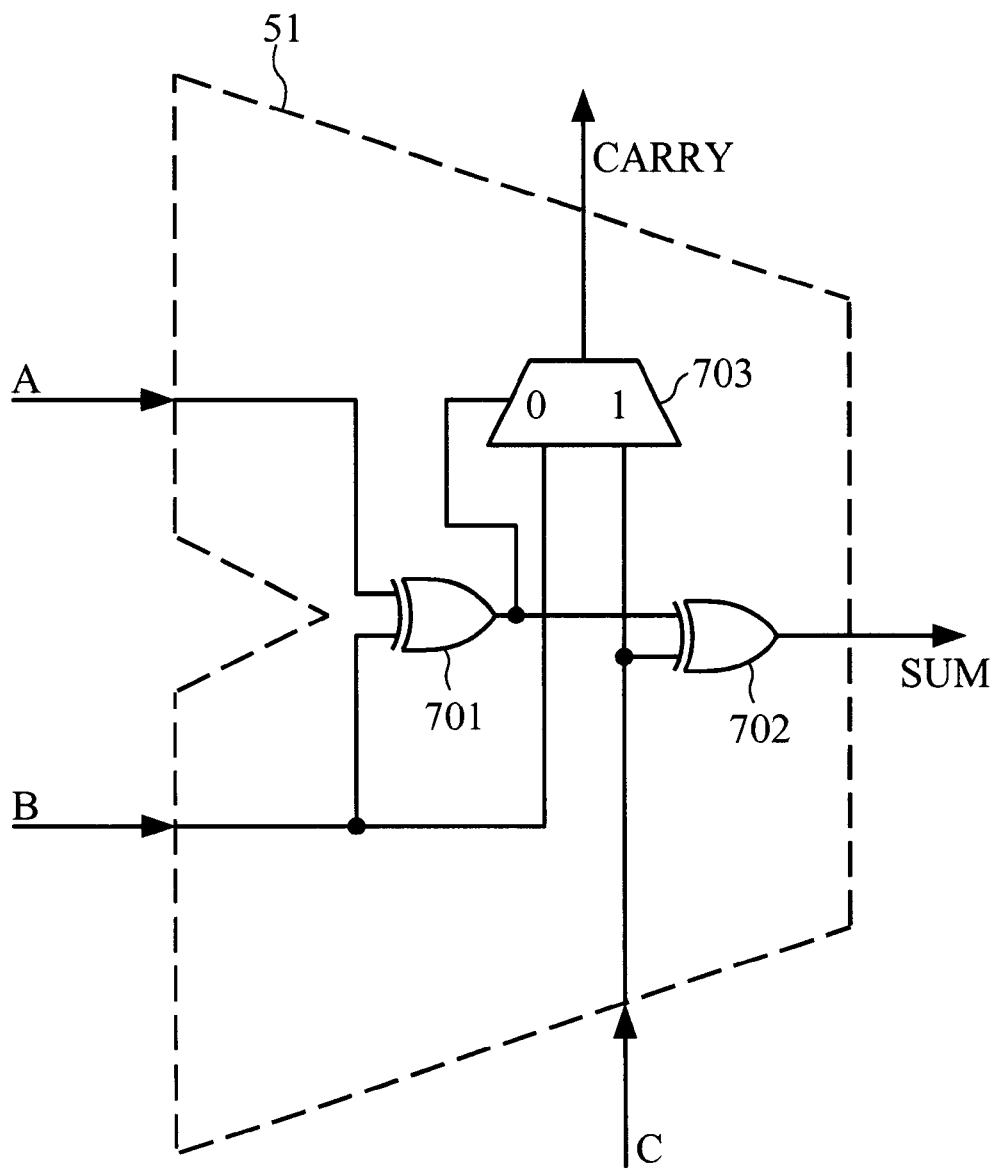
FIG. 7 is a circuit diagram of an adder circuit used in various embodiments of the present invention.

FIG. 7 is a circuit diagram of adder circuit 51. Adder circuits 52–58 are identical to adder circuit 51. Adder circuit 51 includes exclusive OR gates 701–702 and multiplexer 703, which are coupled as illustrated. Adder circuit 51 generates a SUM output signal and a CARRY output signal in response to the three input signals A, B and C. Exclusive OR gates 701–702 and multiplexer 703 are coupled to generate the SUM and CARRY signals in accordance with Table 1.

Multiplier tile 500M provides a structure that facilitates a 2×4 bit multiplication operation. In the XC4000 family of FPGAS, arithmetic data paths are typically implemented with two bits per CLB row. To match this bit pitch for multiplicand input signals and product output signals, multiplier tile 500M supports two bits per row. As a compromise between density and granularity, multiplier tile 500M supports four bits (i.e., multiplier input signals) per CLB column. It is understood that in other embodiments, multiplier tile 500M can have other dimensions.

In general, multiplier and multiplicand bits are provided to multiplier tile 500M by programming multiplexers 31–36. The programmed multiplexers provide closed electrical connections between CLE 500C and multiplier tile 500M. As a result, the F1–F2 and G1–G4 input signals provided to CLE 500C are routed through multiplexers 31–36, respectively, of multiplier tile 500M. The F1–F2 input signals are selected to correspond with a 2-bit multiplicand value, and the G1–G4 input signals are selected to correspond with a 4-bit multiplier value.

Alternatively, a 2-bit multiplicand value can be routed into multiplier tile 500M from a left adjacent multiplier tile in CLB 497. Similarly, a 4-bit multiplier value can be routed into multiplier tile 500M from a lower adjacent multiplier tile in CLB 499.

In general, product bits are routed from multiplier tile 500M to CLE 500C by programming multiplexers 40 and 58 to provide closed electrical connections between multiplier tile 500M and CLE 500C. As a result, two product bits are routed from multiplexers 40 and 58 to multiplexers 641 and 642, respectively, of CLE 500C. These product bits can be routed out of CLE 500C to programmable interconnect resources 403 by configuring multiplexers 615–618. For example, multiplexer 615 can be programmed to route one product bit as the Y output signal, and multiplexer 618 can be configured to route the other product bit as the X output signal. These product bits can alternatively be routed through multiplexers 616–617 and flip-flops 631–632 as the output signals YQ and XQ.

Alternatively, these product bits can be routed from multiplier tile 500M to a right adjacent multiplier tile in CLB 502 on output terminals 77 and 78.

Figure 8:
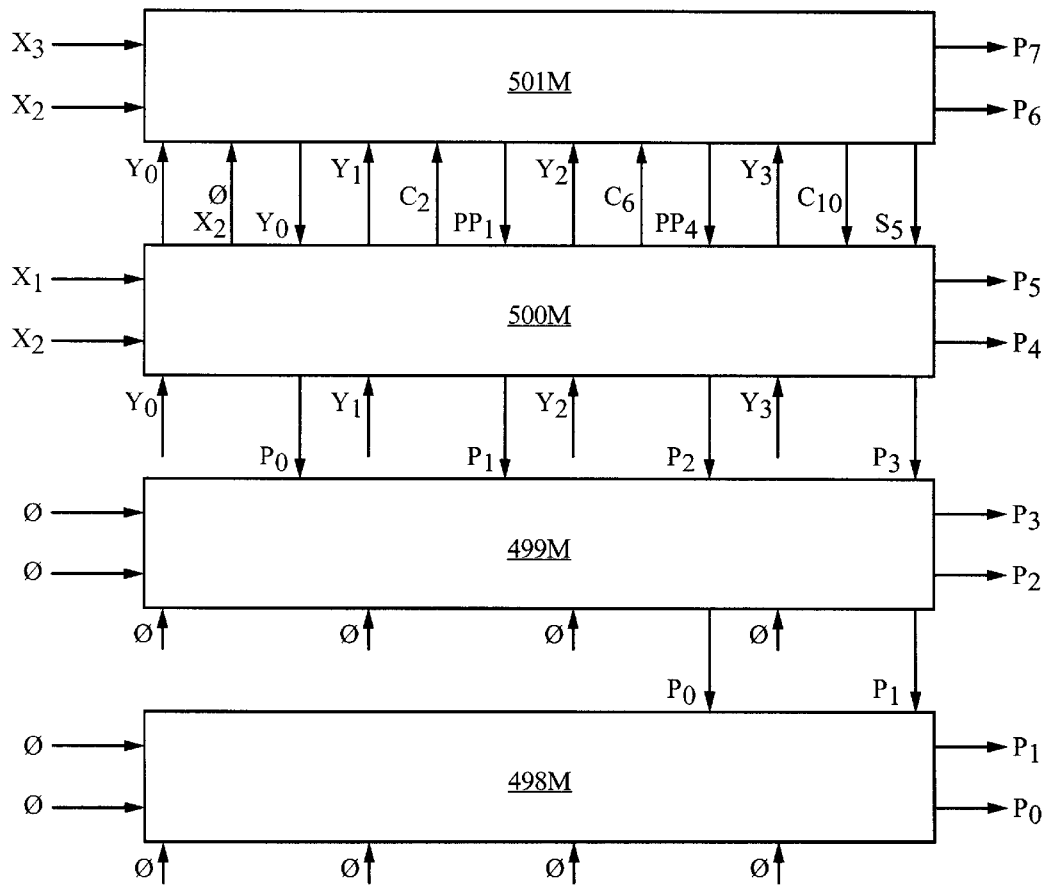
FIG. 8 is a block diagram illustrating multiplier tiles coupled to create a 4×4 bit unsigned carry-propagate multiplier in accordance with one embodiment of the present invention.

The operation of multiplier tile 500M will now be described in connection with a specific example, which is illustrated in FIGS. 8 and 9. In this example, a 4×4 bit multiplication is performed using an unsigned 4-bit multiplier Y3–Y0 and an unsigned 4-bit multiplicand X3–X0. Because this operation is similar to the 4×4 bit multiplication operation previously described in connection with FIG. 1B, similar reference numbers are used in FIGS. 1B, 8 and 9.

FIG. 8 is a block diagram illustrating multiplier tiles 498M–501M, which are coupled to create the 4×4 bit multiplier. Multiplier tile 500M receives multiplicand bits X1–X0 from its associated CLE 500C. Similarly, multiplier tile 501M receives multiplicand bits X3–X2 from its associated CLE 501C. Multiplier bits Y3–Y0 are applied to multiplier tile 500M through its associated CLE 500C. These multiplier bits Y3–Y0 are propagate up through multiplier tile 501M. Multiplier tiles 500M and 501M provide product bits P7–P0 in response to multiplicand bits X3–X0 and multiplier bits Y3–Y0. Note that multiplier tile 501M receives carry bits 0, C2, C6 and C10 from multiplier tile 500M, and provides sum signals X2Y0, PP1, PP4 and P5 (as defined in FIG. 1B) to multiplier tile 500M in accordance with the multiplication operation. Product bits P3 and P2 are routed in from the top and out through the right side of multiplier tile 499M. Product bits P1 and P0 are routed through multiplier tile 499M to multiplier tile 498M, and then out through the right side of multiplier tile 498M.

Product bits P7–P6 and P5–P4 are routed from multiplier tiles 501M and 500M, respectively, to CLEs 501C and 500C, respectively. Because each CLB can only output two product bits, two additional multiplier tiles 499M and 498M are used to output the least significant product bits P3–P0. More specifically, product bits P3–P2 are routed from multiplier tile 499M into its associated CLE 499C. Similarly, product bits P1–P0 are routed from multiplier tile 498M into its associated CLE 498. As described in more detail below, product bits P3–P0 are shifted out of multiplier tiles 499M and 498M by applying logic "0" values to the multiplicand and multiplier input terminals of multiplier tiles 499M and 498M.

Figure 9B:
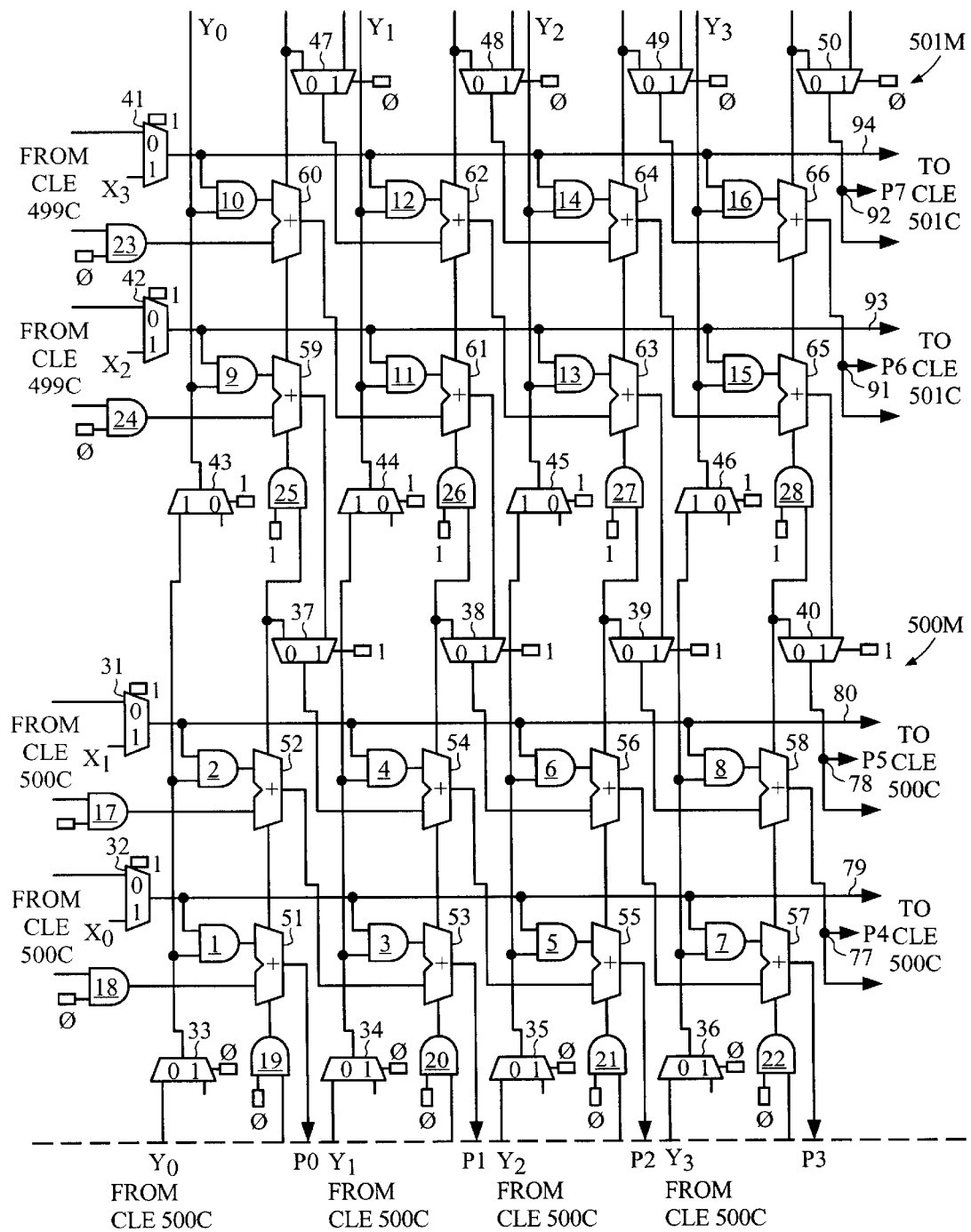

FIG. 9, which includes FIGS. 9A and 9B, is a circuit diagram that illustrates the multiplier tiles 498M–501M of FIG. 8 in more detail. Multiplier tile 500M was described above in connection with FIG. 6. Multiplier tiles 498M, 499M and 501M are identical to the previously described multiplier tile 500M. However, multiplier tiles 498M, 499M and 501M are labeled with different reference numbers to help clarify the discussion below. Thus, multiplier tile 501M includes AND gates 9–16 and 23–28, multiplexers 41–50, adder circuits 59–66 and output terminals 91–94. Multiplier tile 499M includes AND gates 109–116 and 123–128, multiplexers 141–150, adder circuits 159–166 and output terminals 191–194. Multiplier tile 498M includes AND gates 101–108 and 117–122, multiplexers 131–140, adder circuits 151–158 and output terminals 177–180.

Within multiplier tiles 501M, 500M, 499M and 498M, multiplexers 31–36, 41–46, 131–136 and 141–146 are programmed to provide electrical connections to the associated CLEs 501C, 500C, 499C and 498C, respectively. Multiplicand bits X3–X2 are routed from CLE 501C through multiplexers 41–42, respectively. Multiplicand bits X1–X0 are routed from CLE 500C through multiplexers 31–32, respectively. Logic "0" bits are routed from CLEs 499C and 498C through multiplexers 141–142 and 131–132.

Within multiplier tile 500M, multiplexers 33–36 are configured to provide electrical connections to the associated CLE 500C. The four multiplier bits Y3–Y0 are routed from CLE 500C, through multiplexers 33–36, respectively.

Within multiplier tiled 498M and 499M, multiplexers 133–136 and 143–146 are configured to provide electrical connections to their associated CLEs 498C and 499C, respectively. Four logic "0" bits are routed from each of CLEs 498C and 499C, through multiplexers 133–136 and 143–146, respectively.

In the foregoing manner, the four multiplier bits Y3–Y0 are provided to the multiplier circuit through a single CLE (i.e., CLE 500C), and subsequently propagate vertically within the adjacent multiplier tiles.

The configuration memory cells attached to AND gates 17–24 and 117–128 are programmed to provide logic "0" values, thereby initializing the carry input signals. The configuration memory cells attached to AND gates 25–28 are programmed to provide logic "1" values, thereby enabling these AND gates to pass the carry signals received from adder circuits 52, 54, 56 and 58. Multiplexers 37–40 are configured to pass the output signals received from adder circuits 59, 61, 63 and 65, respectively. Multiplexers 47–50 are configured to pass the carry output signals received from adder circuits 60, 62, 64 and 66.

Figure 2:
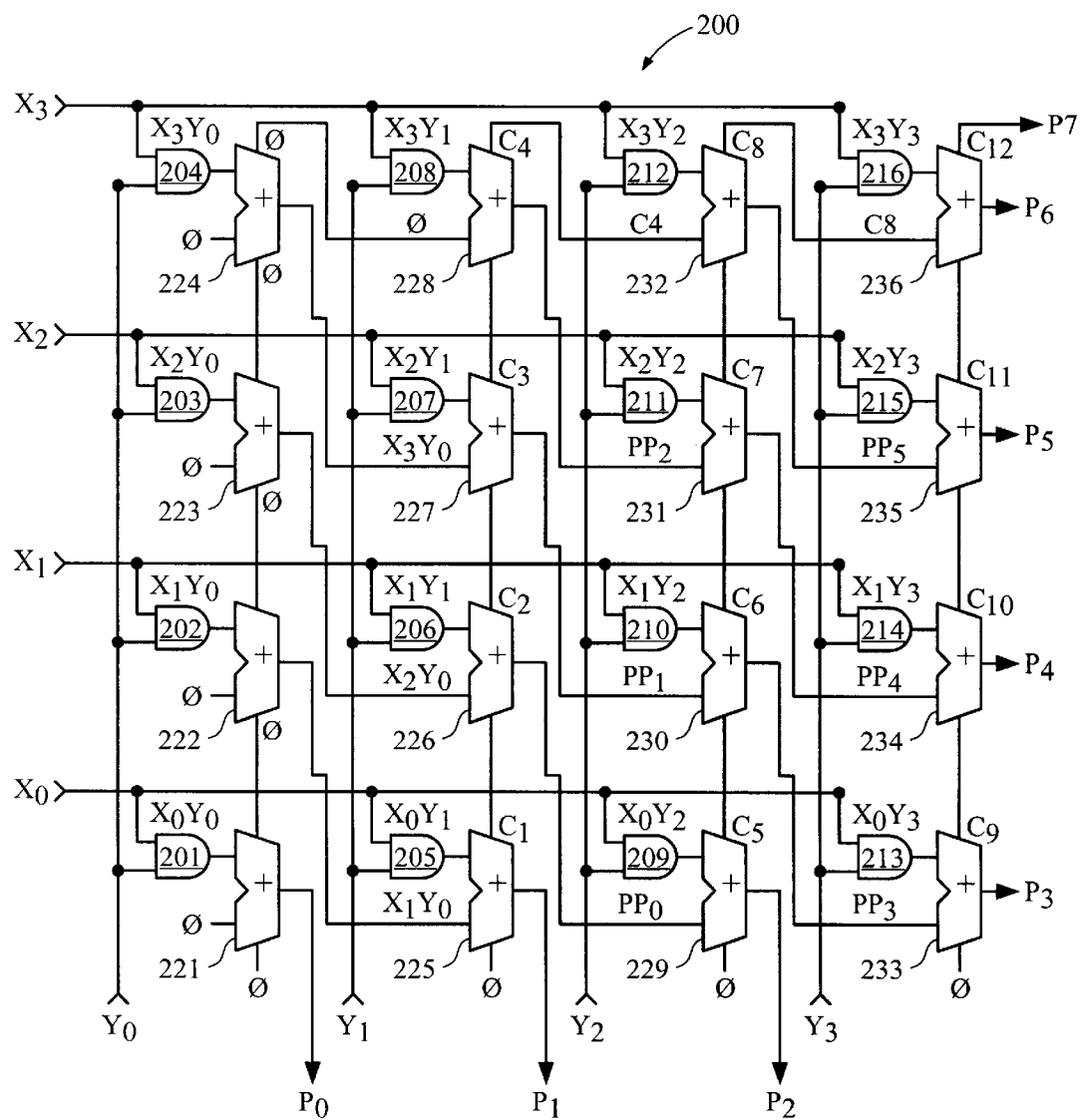
FIG. 2 is a circuit diagram of a conventional 4×4 bit multiplier circuit for implementing the multiplication operation illustrated in FIGS. 1A and 1B.
Figures 3, 3A:
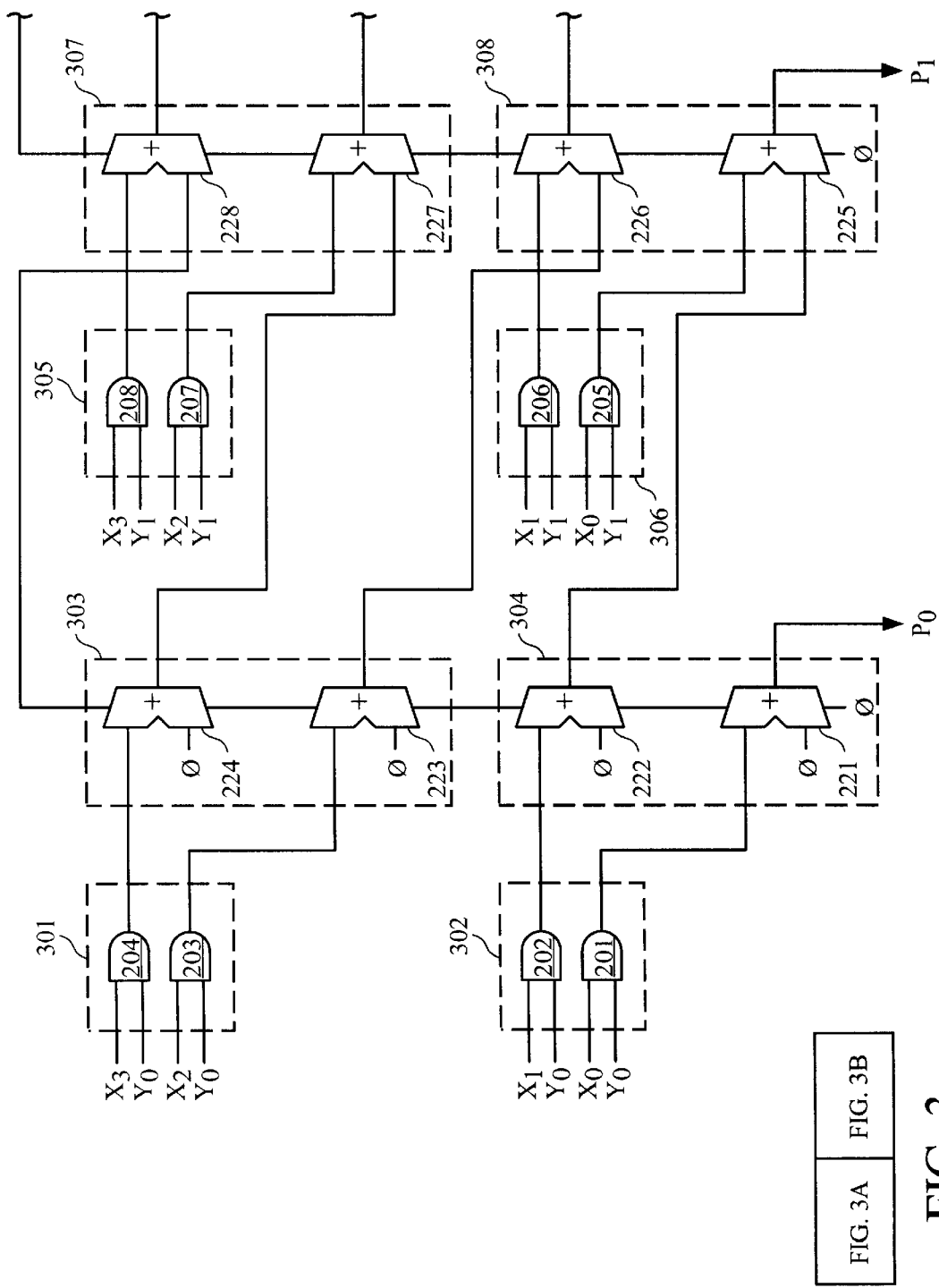
FIG. 3, which includes
FIGS. 3A and 3B, is a circuit diagram illustrating the conventional implementation of the multiplier circuit of FIG. 2 in an FPGA.
Figure 3B:
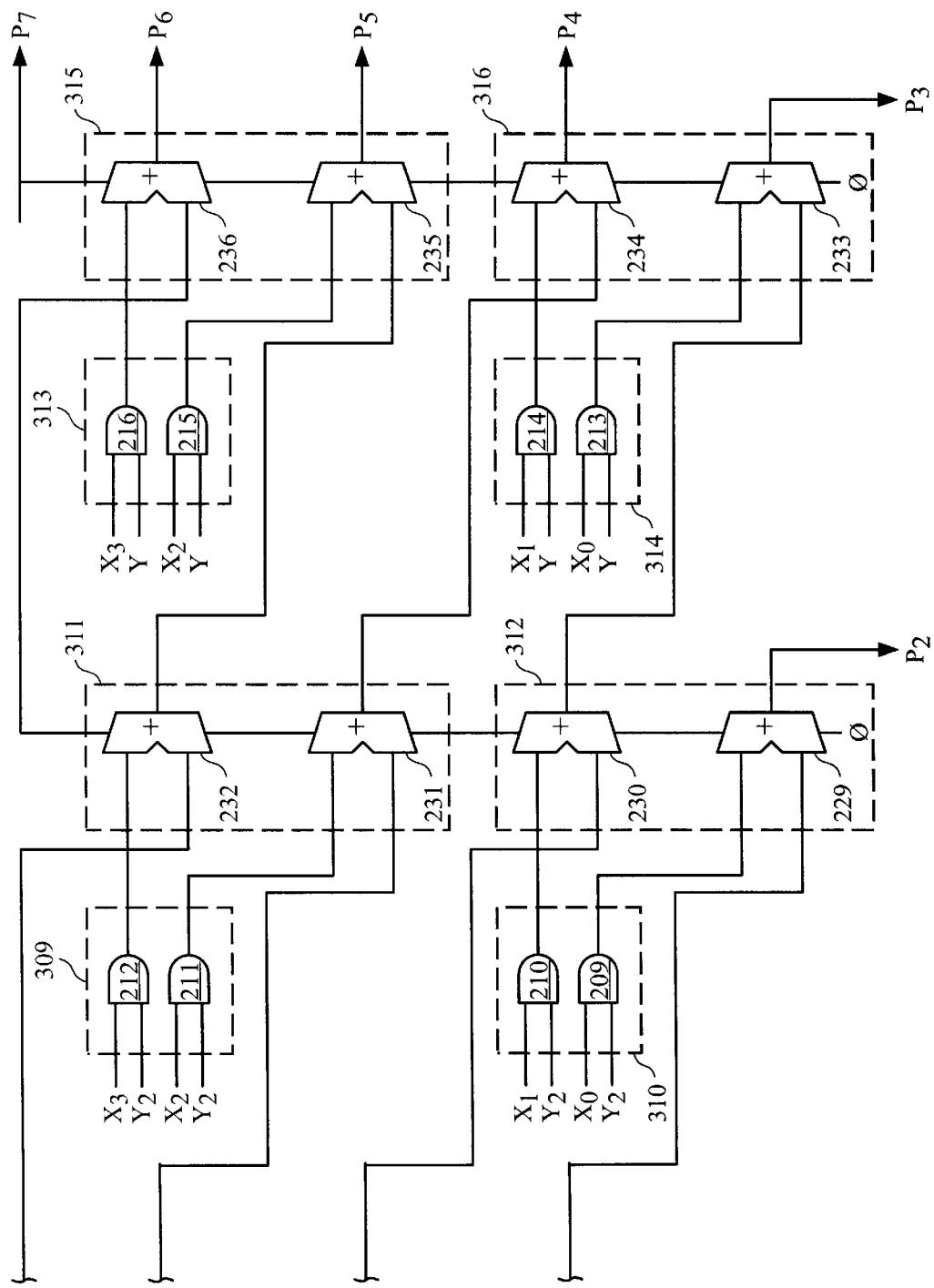

When configured in the foregoing manner, multiplier tiles 501M and 500M form a multiplier circuit that operates in the same manner as multiplier circuit 200 (FIG. 2). Consequently, multiplier tiles 501M and 500M provide product bits P7–P0 as illustrated.

Product bits P7–P6 are routed to output terminals 91 and 92, respectively, and are output through the associated CLE 501C. Similarly, product bits P5–P4 are routed to output terminals 77 and 78, respectively, and are output through the associated CLE 500C.

Product bits P3–P0 are routed from multiplier tile 500M down into multiplier tile 499M. Multiplexers 147–150 are configured to pass these product bits P3–P0. After passing through multiplexer 150, product bit P3 is routed to output terminal 192, and is output through the associated CLE 499C. After passing through multiplexer 149, product bit P2 is routed to an input terminal of adder 166. Because each of AND gates 109–116 receives a logic "0" multiplicand bit, each of AND gates 109–116 provides a logic "0" signal to its associated adder circuit. Thus, AND gate 116 provides a logic "0" signal to the other input terminal of adder 166. Consequently, adder circuit 166 provides product bit P2 as an output signal. This product bit P2 is routed to output terminal 191, and is output through the associated CLE 499C.

The logic "0" signals provided by AND gates 114 and 115 allow product bit P1 to propagate through adder circuits 164 and 165 to multiplexer 140 of multiplier tile 498M. Similarly, the logic "0" signals provided by AND gates 112 and 113 allow product bit P0 to propagate through adder circuits 162 and 163 to multiplexer 139 of multiplier tile 498M.

Multiplexers 139 and 140 are configured to pass product bits P0 and P1, respectively. Product bit P1 is routed from multiplexer 140 to output terminal 178, and is output through the associated CLE 498C. Product bit P0 is routed from multiplexer 139 to an input terminal of adder circuit 158. Each of AND gates 101–108 provides a logic "0" output signal in response to the applied logic "0" multiplicand bits provided by multiplexers 131 and 132. As a result, AND gate 108 provides a logic "0" signal to the other input terminal of adder circuit 158. As a result, adder circuit 158 provides the product bit P0 as an output signal on output terminal 177. Product bit P0 is passed to output terminal 178, and is output through the associated CLE 498C.

In the foregoing manner, product bits P7–P0 are routed out through the underlying CLEs 498C–501C.

Figure 10:
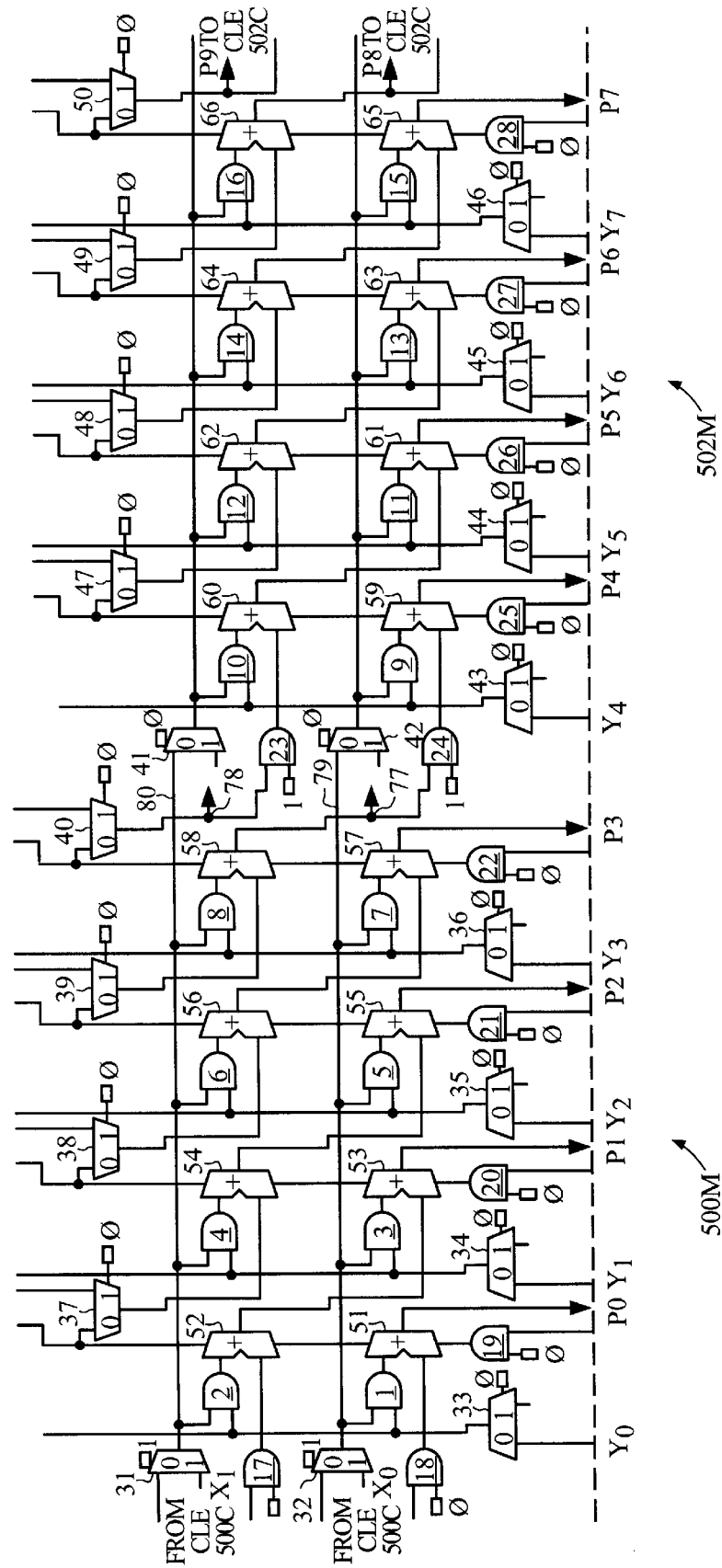
FIG. 10 is a circuit diagram illustrating the coupling of two multiplier tiles located in adjacent columns.

Although the example listed above only uses one column of multiplier tiles, any number of columns of multiplier tiles can be used to create a multiplier circuit. FIG. 10 illustrates the coupling of multiplier tiles 500M and 502M, which are located in adjacent columns (FIG. 4). Because multiplier tile 502M is identical to multiplier tile 501M (FIG. 8B), similar elements in multiplier tiles 501M and 502M are labeled with similar reference numbers. Multiplier tiles 500M and 502M are coupled to form a 2×8 bit multiplier circuit which multiplies 2-bit multiplicand X1–X0 and 8-bit multiplier Y7–Y0. Note that multiplicand bits X1 and X0 propagate horizontally to multiplexers 41 and 42 of multiplier tile 502M. Multiplexers 41 and 42 are configured to pass these multiplicand bits X1 and X0. Note also that output terminals 78 and 77 are connected to AND gates 23 and 24, respectively. AND gates 23 and 24 are configured to pass the signals received on output terminals 78 and 77 (by programming the other terminal of AND gates 23 and 24 to receive logic "1" values). The multiplier tiles required to bring out the least significant product bits P7–P0 are not shown in FIG. 10 for purposes of clarity.

Figure 11:
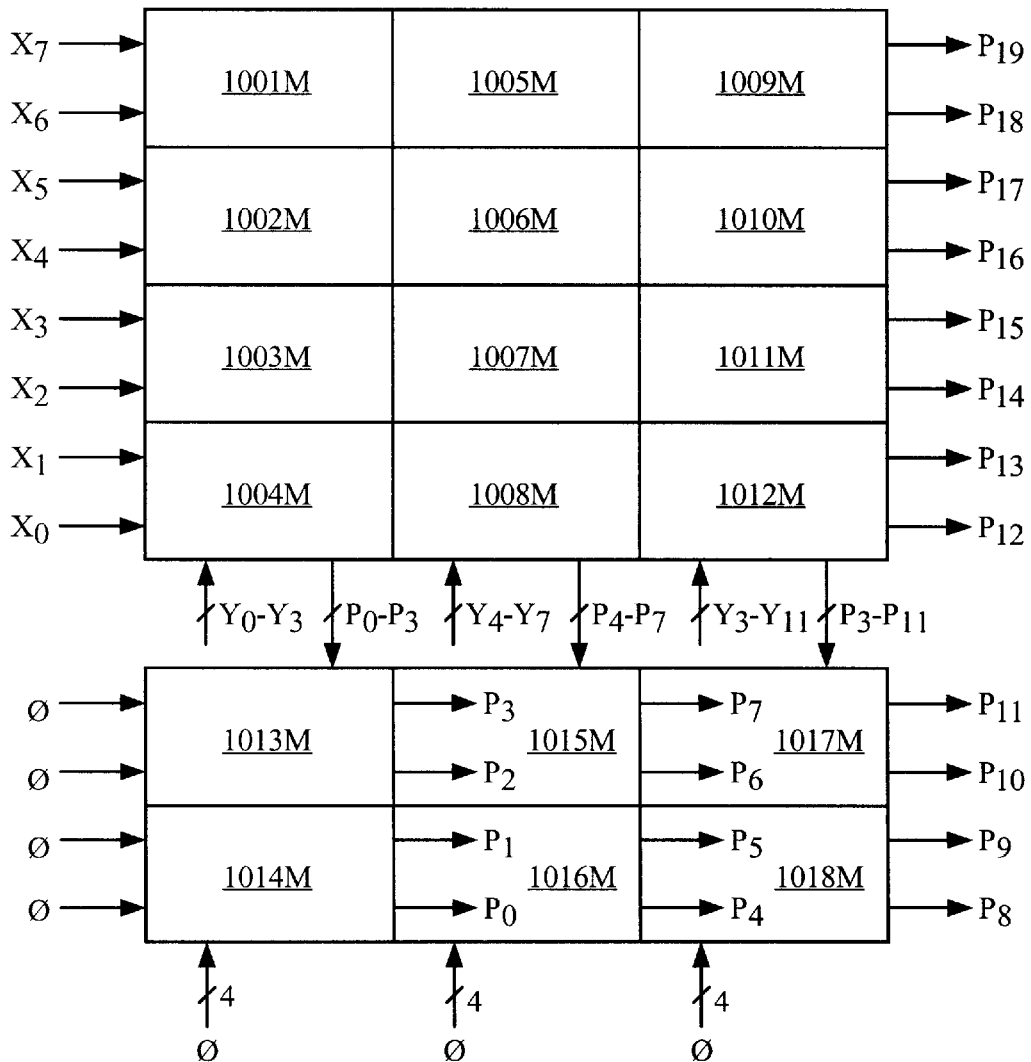
FIG. 11 is a block diagram illustrating a multiplier circuit which multiplies an 8-bit multiplicand and a 12-bit multiplier using eighteen multiplier tiles.

It is important to note that only two additional rows of multiplier tiles are required to route the least significant product bits, regardless of the size of the multiplier. FIG. 11 is a block diagram illustrating an 8×12 bit multiplier circuit which multiplies multiplicand X7–X0 and multiplier Y11–Y0 using multiplier tiles 1001M–1018M. Multiplier tiles 1001M–1012M generate product bits P19–P0. Product bits P19–P12 are routed from multiplier tiles 1009M–1012M out to the CLEs (not shown) associated with multiplier tiles 1009M–1012M. Product bits P11–P8 are routed from multiplier tile 1012M to lower adjacent multiplier tile 1017M. Product bits P11–P10 and P9–P8 are then routed through multiplier tiles 1017M–1018M to the associated CLEs (not shown) in the manner previously described in connection with FIG. 9.

In a similar manner, product bits P7–P4 are routed from multiplier tile 1008M out through the CLEs associated with multiplier tiles 1015M and 1016M. In addition, product bits P3–P0 are routed form multiplier tile 1004M out through the CLEs associated with multiplier tiles 1013M–1014M. Thus, only two additional rows of multiplier tiles are required to bring out the least significant product bits P11–P0.

It is also important to note that not all of the CLEs associated with multiplier tiles 1001M–1018M are required to form the resulting multiplier circuit. More specifically, the CLEs associated with multiplier tiles 1005M–1007M are not required to create the described multiplier circuit. This is because these CLEs do not have any required connections to their associated multiplier tiles 1005M–1007M. As a result, these CLEs can be used to implement other logic functions in the FPGA.

The previous examples described multiplier circuits that performed unsigned multiplication (i.e., the multiplication of two unsigned numbers). As described in more detail below, the multiplier tiles can be modified in other embodiments, thereby enabling 2's complement signed multiplication (i.e., the multiplication of two signed numbers) and 2's complement signed/unsigned multiplication (i.e., the multiplication of a signed number with an unsigned number).

Figure 12:
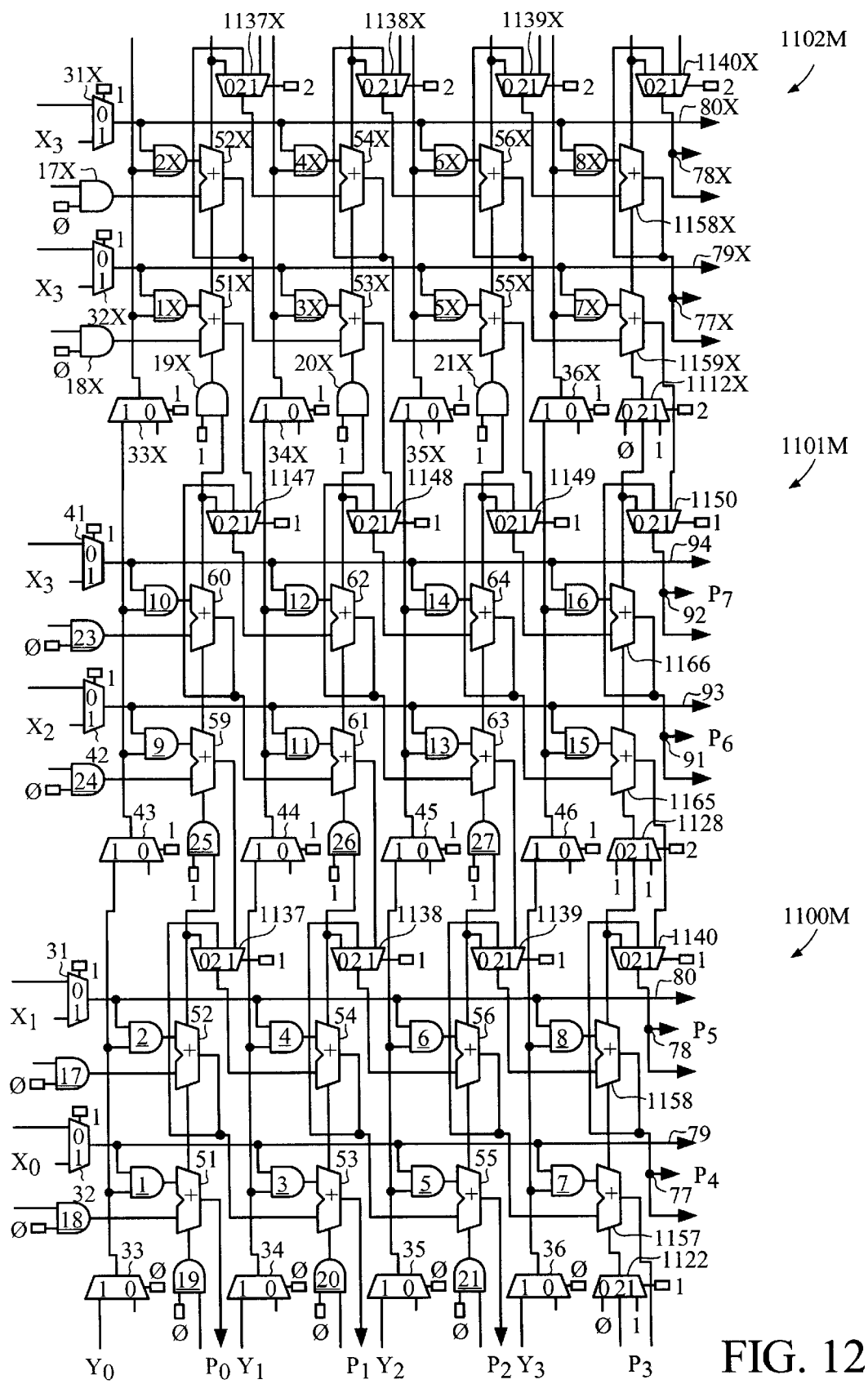
FIG. 12 is a circuit diagram of three identical multiplier tiles in accordance with an embodiment which supports signed carry-propagate multiplication.

FIG. 12 is a circuit diagram of three identical multiplier tiles 1100M, 1101M and 1102M in accordance with another embodiment of the present invention. These multiplier tiles are coupled to corresponding CLEs (not shown) in the same manner previously described in connection with FIGS. 5 and 6. Because multiplier tiles 1100M and 1101M are similar to multiplier tiles 500M and 501M (FIG. 9B), similar elements in FIGS. 9B and 12 are labeled with similar reference numbers. Multiplier tile 1102M, which is an extra multiplier tile used to handle the sign extension of a signed multiplication operation, is labeled with reference numbers that are similar to the reference numbers of multiplier tile 1100M, but followed by the letter "X" (for sign extension).

Multiplier tiles 1100M and 1101M replace the adder circuits 57–58 and 65–66 of multiplier tiles 500M and 501M with adder/subtractor circuits 1157–1158 and 1165–1166. Multiplier tile 1102M similarly includes adder/subtractor circuits 1157X and 1158X. Multiplier tiles 1100M and 1101M further replace AND gates 22 and 28 of multiplier tiles 500M and 501M with three-to-one multiplexers 1122 and 1128. Multiplier tile 1102M includes a similar three-to-one multiplexer 1112X. As described in more detail below, adder/subtractor circuits 1157–1158, 1165–1166 and 1157X–1158X and multiplexers 1122, 1128 and 1122X allow the multiplier Y3–Y0 to be an unsigned or signed (2's complement) number.

Multiplier tiles 1100M and 1101M further replace multiplexers 37–40 and 47–50 of multiplier tiles 500M and 501M with three-to-one multiplexers 1137–1140 and 1147–1150. Two input terminals of each of the three-to-one multiplexers 1137–1140 and 1147–1150 are connected in the same manner as the input terminals of multiplexers 37–40 and 47–50. The third input terminals of three-to-one multiplexers 1137–1140 are connected to the output terminals of adder circuits 52, 54, 56, and adder/subtractor circuit 1158, respectively. Similarly, the third input terminals of three-to-one multiplexers 1147–1150 are connected to the output terminals of adder circuits 60, 62, 64 and adder/subtractor circuit 1166, respectively. Multiplier tile 1102M includes three-to-one multiplexers 1137X–1140X, which are coupled in a similar manner. As described in more detail below, multiplexers 1137–1140, 1147–1150 and 1137X–1140X enable the multiplicand X to be a signed (2's complement) number.

Figure 13:
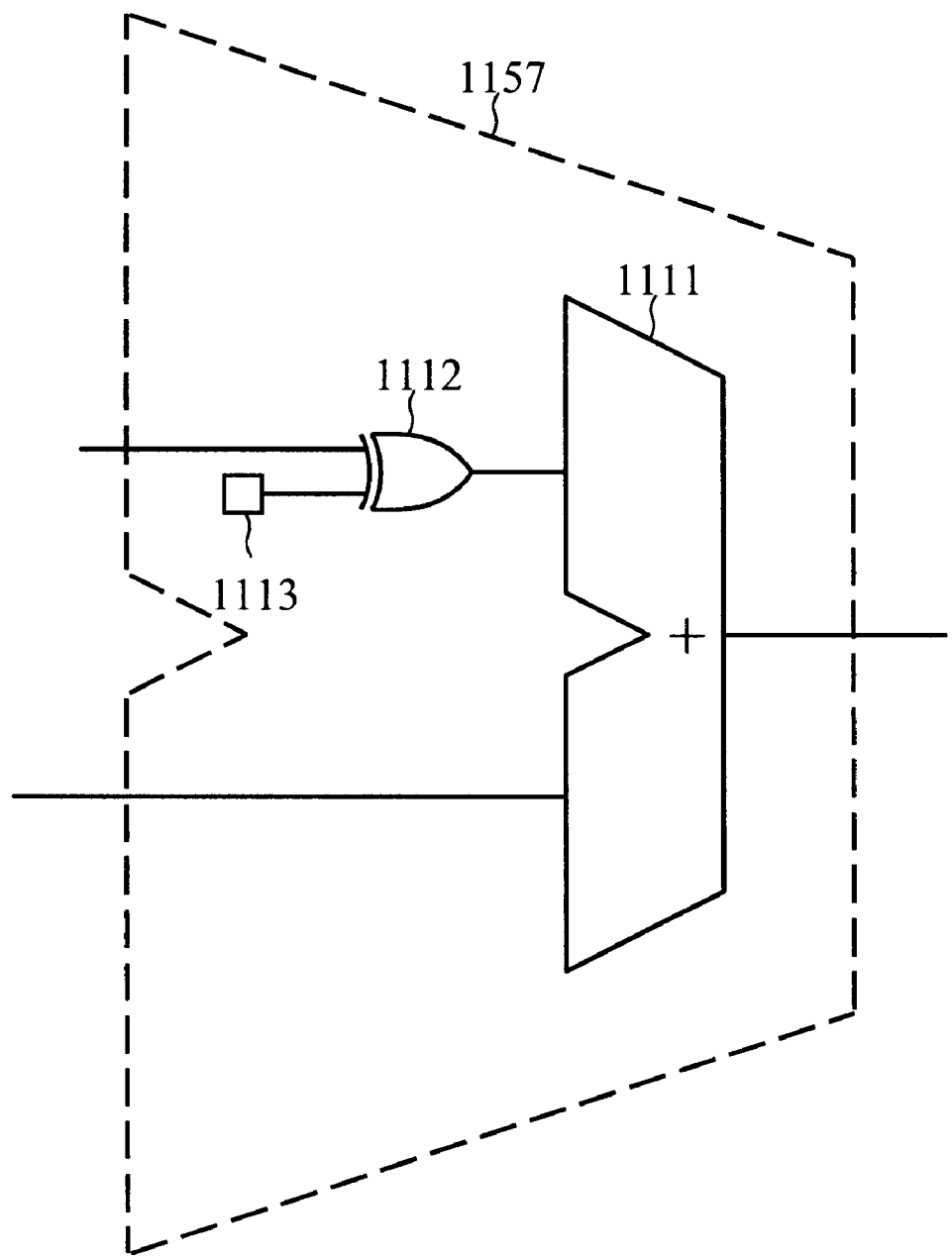
FIG. 13 is a circuit diagram of an adder/subtractor circuit used in various embodiments of the present invention.

FIG. 13 is a circuit diagram of adder/subtractor circuit 1157. Adder/subtractor circuits 1158, 1165–1166 and 1157X–1158X are identical to adder/subtractor circuit 1157. As illustrated in FIG. 13, adder/subtractor circuit 1157 includes an adder circuit 1111 (See, FIG. 7) having an input terminal coupled to an exclusive OR gate 1112. One input terminal of the exclusive OR gate 1112 is coupled to configuration memory cell 1113, and the other input terminal of exclusive OR gate 1112 is coupled to receive a first input signal. When adder/subtractor circuit 1157 is to operate as an adder circuit, configuration memory cell 1113 is programmed to provide a logic "0" value. This logic "0" value causes the first input signal to be routed to adder circuit 1111. Conversely, when adder/subtractor circuit 1157 is to operate as a subtractor circuit, configuration memory cell 1113 is programmed to provide a logic "1" value. This logic "1" value causes the inverse of the first input signal to be provided to adder circuit 1111. Because subtraction comprises adding the inverse of a value, the definition of the carry in and carry out signals remain unchanged.

It is noted that multiplier tiles 1100M–1102M (plus one additional identical multiplier tile) can be configured in the same manner as the previously described multiplier tiles 498M–501M (See, FIG. 9). Thus, multiplier tiles 1100M–1102M (and the additional identical multiplier tile) can be configured to perform unsigned multiplication in the same manner previously described for multiplier tiles 498M–501M.

In addition, multiplier tiles 1100M–1102M can be configured to perform signed multiplication. As illustrated in FIG. 12, multiplier tiles 1100M–1102M are configured to multiply a 4-bit signed multiplicand X3–X0 and a 4-bit signed multiplier Y3–Y0. The 4-bit signed multiplier Y3–Y0 is routed into multiplexers 33–36 of multiplier tile 1100M from the CLE (not shown) associated with multiplier tile 1100M in the same manner as previously described in connection with FIG. 9. The least significant product bits P3–P0 are routed out through two lower adjacent multiplier tiles (not shown) in the manner previously described in connection with FIG. 9.

Multiplexers 43–46 and 33X–36X are programmed to propagate the multiplier bits Y3–Y0 through multiplier tiles 1100M–1102M. The carry input signals provided to adder circuits 51, 53 and 55 are initialized to have logic "0" values by programming the configuration memory cells associated with AND gates 19–21 to provide logic "0" values. Three-to-one multiplexer 1122 is programmed to route a logic "1" value to the carry input terminal of adder/subtractor circuit 1157.

AND gates 25–27 and 19X–21X are programmed to receive logic "1" values from their associated configuration memory cells, thereby causing these AND gates to pass carry signals through multiplier tiles 1100M-1102M. Similarly, three-to-one multiplexers 1128 and 1112X are configured to pass carry signals through multiplier tiles 1100M–1102M. Adder/subtractor circuits 1157–1158, 1165–1166 and 1157X–1158X are all configured as subtractor circuits in the manner previously described in connection with FIG. 13.

Multiplexers 1137–1140 are configured to pass the output signals received from adder circuits 59, 61, 63 and adder/subtractor circuit 1165, respectively. Similarly, multiplexers 1147–1150 are configured to pass the output signals received from adder circuits 51X, 53X, 55X and adder/subtractor circuit 1159X, respectively.

Multiplexers 1137X and 1138X are configured to route the sum output signals provided by adder circuits 52X and 54X to input terminals of adder circuits 54X and 56X, respectively. Multiplexer 1139X is configured to route the sum output signal provided by adder circuit 56X to an input terminal of adder/subtractor circuit 1158X. Finally, multiplexer 1140X is configured to route the sum output signal provided by adder/subtractor circuit 1158X to output terminal 78X.

Multiplicand bits X3–X0 are routed from the associated CLEs (not shown) through programmed multiplexers 31–32, 41–42 and 31X–32X as illustrated. Note that multiplier tile 1102M receives the X3 multiplicand bit through multiplexers 31X and 32X. AND gates 17–18, 23–24 and 17X–18X are configured to receive logic "0" values from their associated configuration memory cells, thereby initializing the second input terminals of adder circuits 51–52, 59–60 and 51X–52X. Output terminals 92, 91, 78 and 77 provide product bits P7–P4 to the CLEs associated with multiplier tiles 1100M and 1101M. Output terminals 77X–78X can also provide sign extension bits to the CLE associated with multiplier tile 1102M.

Once configured as described above, multiplier tiles 1100M–1102M multiply signed multiplicand X3–X0 and signed multiplier Y3–Y0. The product is provided in the form of a signed product P7–P0.

In the above-described signed multiplier circuit, multiplier tile 1102M is required because multiplicand X3–X0 is a signed number. Multiplier tile 1102M provides the sign extension operations which are required because of the signed format of multiplicand X3–X0. Those of ordinary skill in the art understand the use of sign extensions in 2's complement arithmetic operations.

Adder/subtractor circuits 1157–1158, 1165–1166 and 1157X–1158X must be programmed to operate as subtractor circuits, and multiplexer 1122 must be programmed to provide a logic "1" value because multiplier Y3–Y0 is a signed number. The subtractor circuits invert the product term created in response to the most significant multiplier bit Y3 (i.e., the sign bit of multiplier Y). The logic "1" value provided by multiplexer 1122 is added to this inverted product term. This "invert and add one" operation causes the product of Y3 and X to be subtracted. This is necessary because Y3 is negatively weighted as required in signed multiplication, as understood by those of ordinary skill in the art of 2's complement arithmetic.

In one variation of the present invention, multiplier tiles 1100M–1102M are configured to multiply a signed multiplier Y3–Y0 and an unsigned multiplicand X3–X0. To accomplish this, the mechanism that processes the signed portion of multiplicand X3–X0 is disabled. More specifically, multiplexers 31X and 32X are coupled to receive logic "0" values instead of the X3 multiplicand bit. In addition, AND gates 19X–21X are programmed to provide logic "0" signals to the carry input terminals of adders 51X, 53X and 55X, respectively. Multiplexers 1147, 1148 and 1149 are configured to pass the carry signals received from adder circuits 60, 62 and 64, respectively. However, multiplexer 1112X remains programmed to route the carry signal provided by adder/subtractor 1166 to adder/subtractor 1157X. Multiplexer 1150 remains programmed to route the output signal provided by adder/subtractor 1157X. Multiplexers 1112X and 1150 are configured in this manner to provide a sign extension of product bit P6 (since the product of an unsigned multiplicand and a signed multiplier can be a signed value). Multiplier tiles 1100M and 1101M are otherwise configured in the manner described above for a signed multiplication operation. Adders 51X–56X and adder/subtractor 1158X are not required when the multiplicand X is unsigned. Thus, if the multiplier circuit is expanded to include multiple columns, an extension multiplier tile such as multiplier tile 1102M is only required in the column which generates the most significant product bit.

In another variation, multiplier tiles 1100M–1102M are configured to multiply an unsigned multiplier Y3–Y0 and a signed multiplicand X3–X0. To accomplish this, the mechanism that processes the signed portion of multiplier Y3–Y0 is disabled. More specifically, adder/subtractor circuits 1157–1158, 1165–1166 and 1157X–1158X are configured to operate as adder circuits, rather than subtractor circuits. In addition, multiplexer 1122 is configured to route a logic "0" value to the carry input terminal of adder/subtractor circuit 1157. As a result, the "invert and add one" function is disabled. Multiplier tiles 1100M–1102M are otherwise configured in the manner described above for a signed multiplication operation.

As previously described, an additional upper adjacent multiplier tile 1102M is required to perform sign extensions at the top of the multiplier circuit when the multiplicand X and the multiplier Y are signed. Because multiplier tile 1102M is coupled to receive the most significant multiplicand bit X3 twice, the sign of the resulting product is extended by two bits, although only one extended sign bit is required. However, any delay caused by the generation of the extra extended sign bit is minimal.

Although multiplier tiles 1100M–1102M have been described as forming 4×4 multiplier circuits, in other embodiments, other numbers of these multiplier tiles can be used to create multiplier circuits of other sizes in accordance with the principles described above.

The above examples describe "carry-propagate" multiplier circuits. The term "carry-propagate" is used because of similarities between the operation of these multiplier circuits and the operation of sequential shift-and-add multipliers, where the carry signal propagates the full length of the adder. Some sequential shift-and-add multipliers use a "carry-save" scheme, where the carry signals do not propagate, but instead, are saved for inclusion in the next addition. The benefit of a carry-save technique is speed, since the accumulator need not wait for the carry signals to propagate. The primary difference between a carry-save multiplier circuit and a carry propagate multiplier circuit is that the carry signals propagate horizontally, rather than vertically, through the multiplier circuit.

Figure 14:
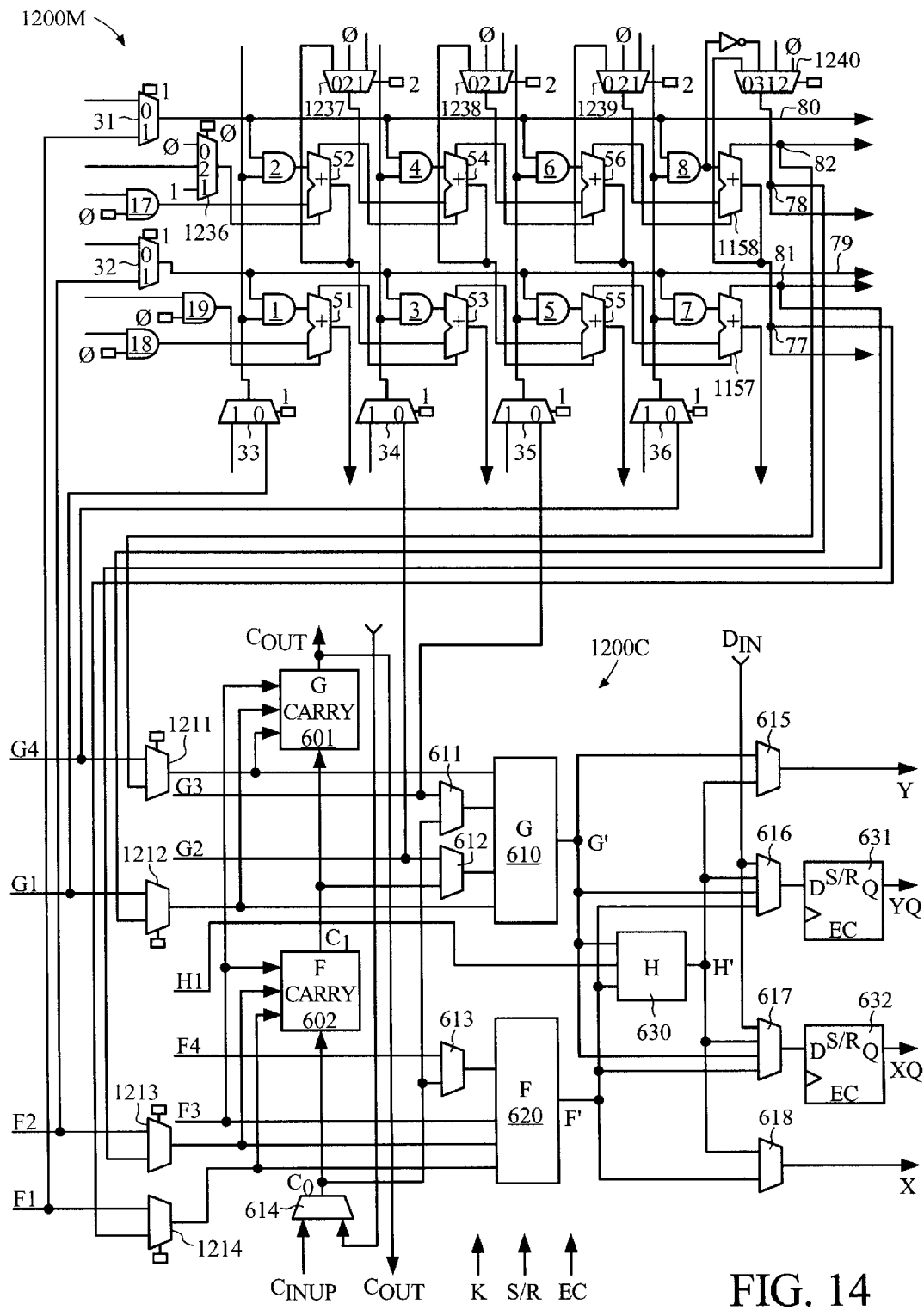
FIG. 14 is a circuit diagram illustrating a CLB having a multiplier tile which supports carry-save multiplication in accordance with another embodiment of the invention.

In another embodiment of the present invention, the previously described multiplier tiles are modified to enable a carry-save multiplier circuit. FIG. 14 is a circuit diagram illustrating a CLB 1200 in accordance with such an embodiment. CLB 1200 includes CLE 1200C and multiplier tile 1200M. Because CLE 1200C is largely identical to CLE 500C (FIG. 6), similar elements in FIGS. 6 and 14 are labeled with similar reference elements. In addition to the previously described elements of CLE 500C, CLE 1200C includes two-to-one multiplexers 1211–1214. When CLE 1200C is not connected to multiplier tile 1200M, multiplexers 1211–1214 are configured to pass the applied input signals F1, F2, G1 and G4. Conversely, when CLE 1200C is connected to multiplier tile 1200M, multiplexers 1211–1214 are configured to pass the signals received from multiplier tile 1200M. The reason for this is will become apparent in view of the subsequent disclosure.

Because multiplier tile 1200M is largely identical to multiplier tile 1100M (FIG. 12), similar elements in FIGS. 12 and 14 are labeled with similar reference elements. Thus, multiplier tile 1200M includes AND gates 1–8 and 17–19, multiplexers 31–36, adder circuits 51–56 and adder/subtractor circuits 1157–1158 and output terminals 77–80. In addition, multiplier tile 1200M includes multiplexers 1236–1240 and output terminals 81–82.

Multiplexers 1237–1240 are coupled to receive the output signals provided by adder circuits 52, 54, 56 and 1158, respectively. Multiplexers 1237–1240 are also coupled to receive a logic "0" signal, as well as a sum output signal from an upper adjacent multiplier tile (not shown). Multiplexer 1240 is also coupled to receive inverse of the signal provided by AND gate 8.

The carry output terminals of adder circuits 51–56 and adder/subtractor circuits 1157–1158 are routed horizontally within multiplier tile 1200M. More specifically, the carry output signals provided by adder circuits 51, 52, 53, 54, 55 and 56 are routed to the carry input terminals of adder circuits 53, 54, 55, 56 and adder/subtractor circuits 1157 and 1158, respectively. The carry output signals provided by adder/subtractor circuits 1157–1158, in turn, are provided as carry output signals on output terminals 81 and 82, respectively. Thus, these carry output signals are not added to their corresponding sum signals within the multiplier tile 1200M. As a result, multiplier tile 1200M provides two additional output signals to the CLE, when compared with the previously described multiplier tiles.

To form the final product, the carry output signal provided by adder/subtractor circuit 1158 must be added to the sum signal received by output terminal 78 (from the upper adjacent multiplier tile (not shown)) in order to create a final product bit. Similarly, the carry output signal provided by adder/subtractor circuit 1157 must be added to the sum signal provided by adder/subtractor circuit 1158 in order to create a final product bit. These addition operations are performed by the associated underlying CLE 1200C. More specifically, the above-described carry and sum signals are routed from output terminals 82, 78, 77 and 81 to multiplexers 1211–1214, respectively of CLE 1200C. Multiplexers 1211–1212, in turn, route the carry and sum signals from output terminals 82 and 78 to G function generator 610 and G carry logic 601. Similarly, multiplexers 1213–1214 route the carry and sum signals from output terminals 77 and 81 to F function generator 620 and F carry logic 602.

The F function generator 620 and F carry logic 602 are configured to perform an addition operation in response to the carry and sum signals received from multiplexers 1213–1214 and the carry signal C0 received from multiplexer 614. F function generator 620 provides the sum output signal, and F carry logic 602 provides the carry output signal. G function generator 610 and G carry logic 601 are configured in a similar manner to add the sum and carry signals received from multiplexers 1211–1212 and the carry signal C1 provided by F carry logic 602. The output signals provided by the F and G function generators 610 and 620 represent final product bits of the multiplication operation. These final product bits can be routed out of CLE 1200C through multiplexers 615–618 and/or flip flops 631–632.

Three-to-one multiplexer 1236 is coupled to selectively route a logic "0", a logic "1" or a carry signal to the carry input terminal of adder circuit 52. As described in more detail below, the logic "1" signal is routed by multiplexer 1236 to provide the required "add one" function when the multiplier is a signed number.

Figure 15:
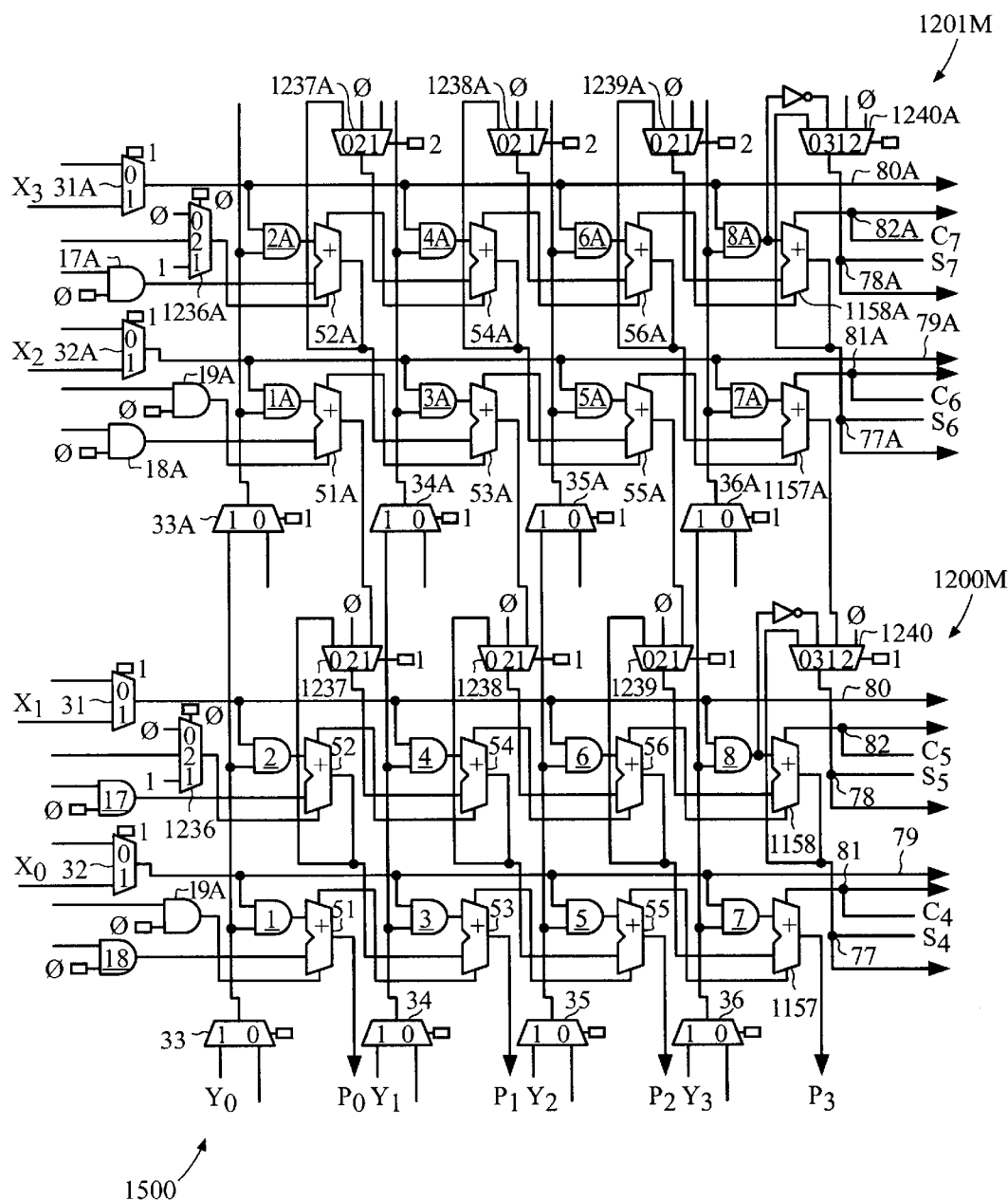
FIG. 15 is a circuit diagram of a 4×4 bit unsigned carry-save multiplier which uses the CLB of FIG. 14.

FIG. 15 is a circuit diagram of a 4×4 unsigned multiplier 1500 that uses multiplier tiles 1200M and 1201M to multiply an unsigned 4-bit multiplicand X3–X0 and a 4-bit unsigned multiplier Y3–Y0. The CLEs associated with multiplier tiles 1200M and 1201M are not illustrated for purposes of clarity. The least significant product bits P3–P0 are routed out of multiplier tile 1200M through two lower adjacent multiplier tiles (not shown) in the manner previously described. Multiplier bits Y3–Y0 are routed into multiplier tile 1200M through the CLE associated with multiplier tile 1200M in the manner previously described.

Because multiplier tile 1200M is identical to multiplier tile 1201M, similar elements in these two multiplier tiles are labeled with similar reference numbers. More specifically, the elements of multiplier tile 1201M are labeled with the same reference numbers as the elements of multiplier tile 1200M, followed by the letter "A".

Multiplier tiles 1200M and 1201M are configured as follows to implement an unsigned multiplier circuit. Multiplexers 31–32 and 31A–32A are programmed to route multiplicand bits X3–X0 from the associated CLEs to multiplier tiles 1200M and 1201M. Multiplexers 1237–1240 are configured to pass the output signals provided by adder circuits 51A, 53A, 55A and 1157A. The configuration memory cells associated with AND gates 17–19 and 17A–19A are programmed to provide logic "0" signals, thereby initializing adder circuits 51–52 and 51A–52A. Multiplexers 1236 and 1236A are configured to route logic "0" signals. Multiplexers 1237A–1240A are also configured to route logic "0" signals. Adder/subtractor circuits 1157–1158 and 1157A–1158A are configured to operate as adder circuits.

In this configuration, multiplier tiles 1200M and 1201M provide sum signals P7–P0 and carry signals C7–C4. Sum signals P3–P0 are routed to the two lower adjacent multiplier tiles (not shown) as the least significant product bits. Carry signal C4 is added to sum signal S4, and carry signal C5 is added to sum signal S5 within CLE 1200C, thereby creating product bits P4 and P5. Similarly, carry signal C6 is added to sum signal S6, and carry signal C7 is added to sum signal S7 within the CLE associated with multiplier tile 1201M, thereby creating product bits P6 and P7.

Multiplier tiles 1200M and 1201M can also be configured to multiply an unsigned multiplicand X3–X0 and a signed multiplier Y3–Y0. The configuration is the same as that described above for unsigned multiplication, except that adder/subtractor circuits 1157–1158 and 1157A–1158A are configured to operate as subtractor circuits, multiplexer 1236A is configured to pass a logic "1" signal, and multiplexer 1240A is configured to pass the inverse of the output signal provided by AND gate 8A. These modifications provide the "invert and add one" function required for the signed multiplier Y3–Y0. Note that the "add one" function is provided by multiplexer 1236A. Inputs to adders 52A and 1157 have the same weight. Thus, "adding one" in either location has the same effect. Routing the inverted output of AND gate 8A provides sign extension in the subtraction.

Figure 16:
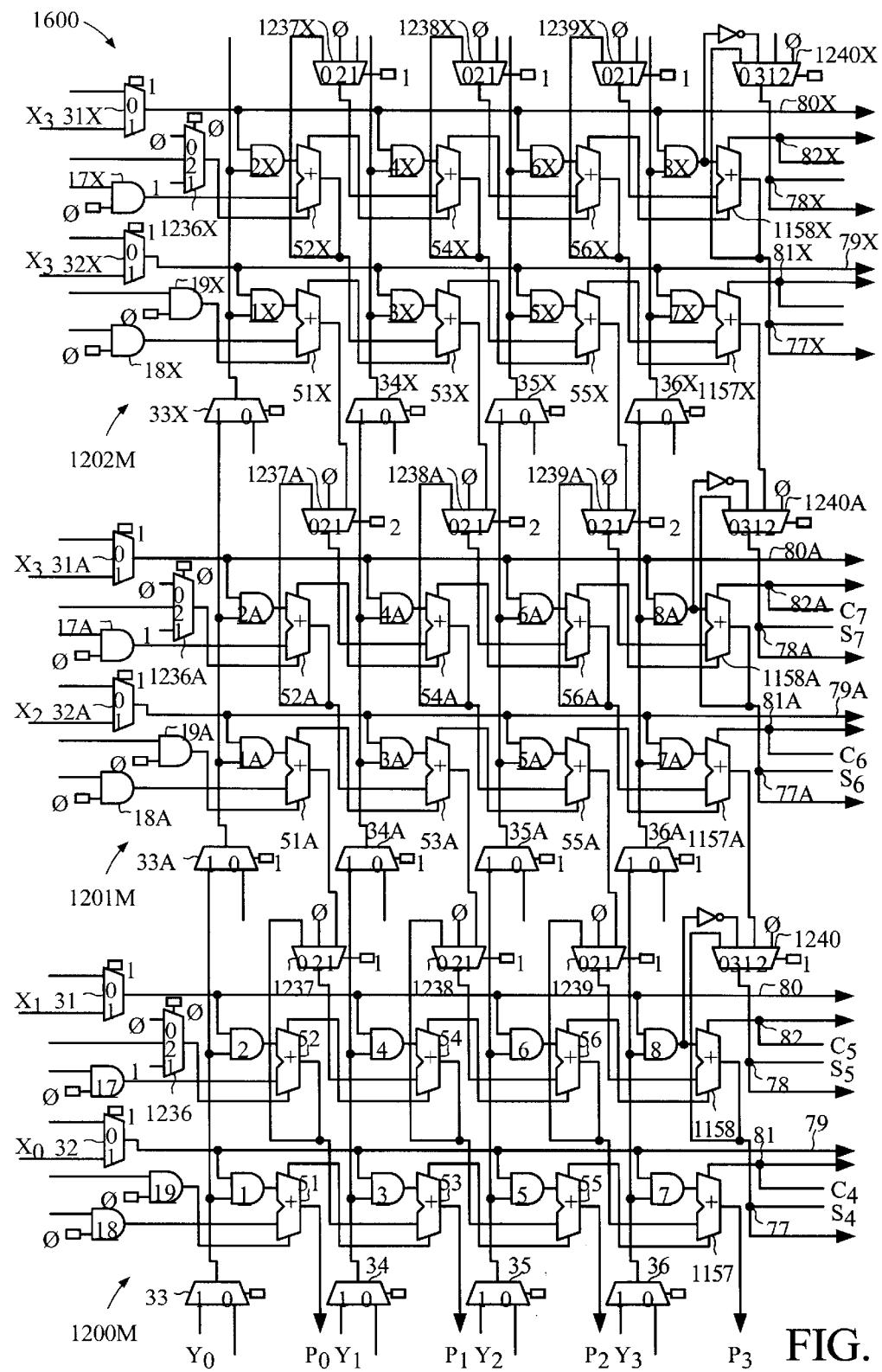
FIG. 16 is a circuit diagram of a 4×4 bit signed carry-save multiplier which uses the CLB of FIG. 14.

FIG. 16 is a circuit diagram of a multiplier 1600 that enables multiplicand X3–X0 to be a signed number. Multiplier circuit 1600 includes a third multiplier tile 1202M, which is identical to multiplier tiles 1200M and 1201M. Because multiplier tile 1200M is identical to multiplier tile 1202M, similar elements in these two multiplier tiles are labeled with similar reference numbers. More specifically, the elements of multiplier tile 1202M are labeled with the same reference numbers as the elements of multiplier tile 1200M, followed by the letter "X".

Multiplier tiles 1200M–1202M are configured as follows to implement a signed multiplier circuit. Multiplexers 31–32, 31A–32A and 31X–32X are programmed to route multiplicand bits X3–X0 from the associated CLEs to multiplier tiles 1200M, 1201M and 1202M. Note that multiplicand bit X3 is applied to multiplexers 31X–32X, thereby allowing multiplier tile 1202M to perform the sign extensions necessitated by the signed nature of multiplicand X3–X0. Multiplexers 1237–1240 are configured to route the output signals provided by adder circuits 51A, 53A, 55A and 1157A. Similarly, multiplexers 1237A–1240A are configured to route the output signals provided by adder circuits 51X, 53X, 55X and 1157X. The configuration memory cells associated with AND gates 17–19, 17A–19A and 17X–19X are programmed to provide logic "0" signals, thereby initializing adder circuits 51–52, 51A–52A and 51X–52X. Multiplexers 1236 and 1236X are configured to pass logic "0" signals. Multiplexer 1236A is configured to pass a logic "1" output signal, thereby providing the "add one" function required by the signed nature of multiplier Y3–Y0. Adder/subtractor circuits 1157–1158, 1157A–1158A and 1157X–1158X are configured to operate as subtractor circuits, thereby providing the "invert" function required by the signed nature of multiplier Y3–Y0. Multiplexers 1237X, 1238X and 1239X are configured to route the output signals provided by adder circuits 52X, 54X and 56X, respectively. Multiplexer 1240X is configured to route the output signal provided by adder/subtractor circuit 1158X.

In this configuration, multiplier tiles 1200M–1202M provide product bits P3–P0, sum signals S7–S4 and carry signals C7–C4. Product bits P3–P0 are routed through two lower adjacent CLBs (not shown). Carry signal C4 is added to sum signal S4, and carry signal C5 is added to sum signal S5 within CLE 1200C, thereby creating two additional product bits P4 and P5. Similarly, carry signal C6 is added to sum signal S6, and carry signal C7 is added to sum signal S7 within the CLE associated with multiplier tile 1201M thereby creating the two most significant product bits P6 and P7.

Multiplier tiles 1200M–1202M can also be configured to multiply a signed multiplicand X3–X0 and an unsigned multiplier Y3–Y0. The configuration is the same as that described above for signed multiplication, except that adder/subtractor circuits 1157–1158, 1157A–1158A and 1157X–1158X are configured to operate as adder circuits, and multiplexer 1236A is configured to pass a logic "0" output signal. These modifications cancel the "invert and add one" function that was required for the signed multiplier Y3–Y0.

Although the present invention has been described in connection with CLBs that include a configurable logic element (CLE) and a corresponding multiplier tile (FIG. 5), in other embodiments of the present invention, the multiplier tiles can be replaced with blocks that perform other general logic functions. For example, the above-described multiplier tiles can be replaced with memory tiles.

An embodiment in which the multiplier tiles are replaced with memory tiles will now be described. This embodiment is also described in commonly-owned co-pending U.S. patent application Ser. No. 09/105,188.

Figure 17:
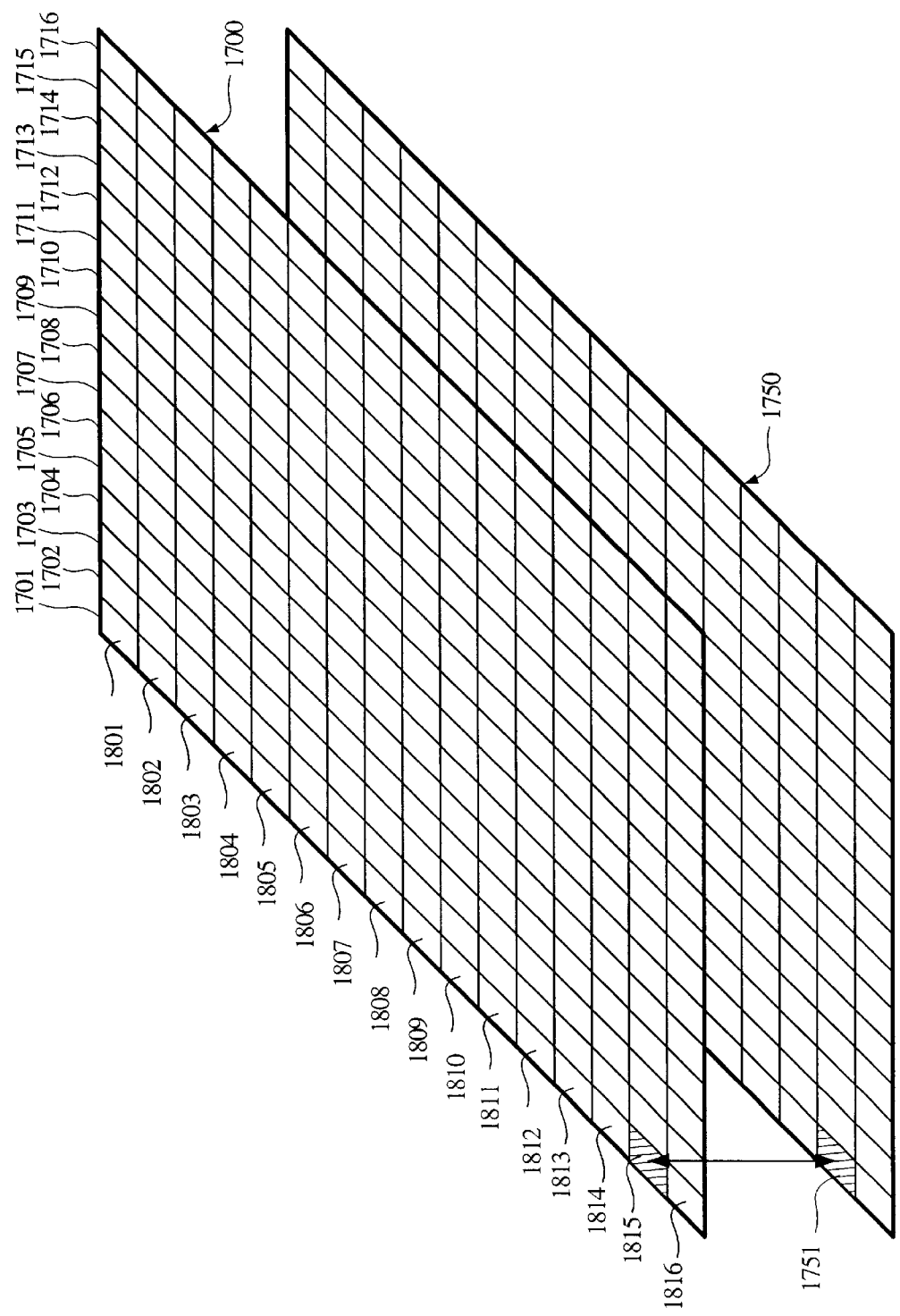
FIG. 17 is a schematic illustration of a composable array of memory tiles and a CLE array in accordance with another embodiment of the present invention.

FIG. 17 is a schematic illustration of a composable array of memory tiles 1700 and an associated array of CLEs 1750 in accordance with the present embodiment. The composable array of memory tiles 1700 includes sixteen composable RAM stripes 1701–1716, each having sixteen memory tiles. For example, composable RAM stripe 1701 includes memory tiles 1801–1816. As a result, there are 256 memory tiles in the described embodiment. CLE array 1750 includes 256 CLEs, arranged in a 16×16 array. Each of the CLEs in CLE array 1750 corresponds with one of the memory tiles in the composable array of memory tiles 1700. For example, CLE 1915 of CLE array 1750 corresponds with memory tile 1815 of composable RAM array 1700. Although the present example describes 16×16 arrays, it is understood that other array sizes can be used in other embodiments.

In FIG. 17, composable RAM array 1700 is illustrated as being located in a first plane, and CLE array 1750 is illustrated as being located in a second plane, even though both RAM array 1700 and CLE array 1750 are located on the same silicon substrate. This illustration is intended to indicate that the planes are separate, but can be selectively coupled to one another through the programmable routing circuitry of the associated programmable logic device when desired.

Figure 18:
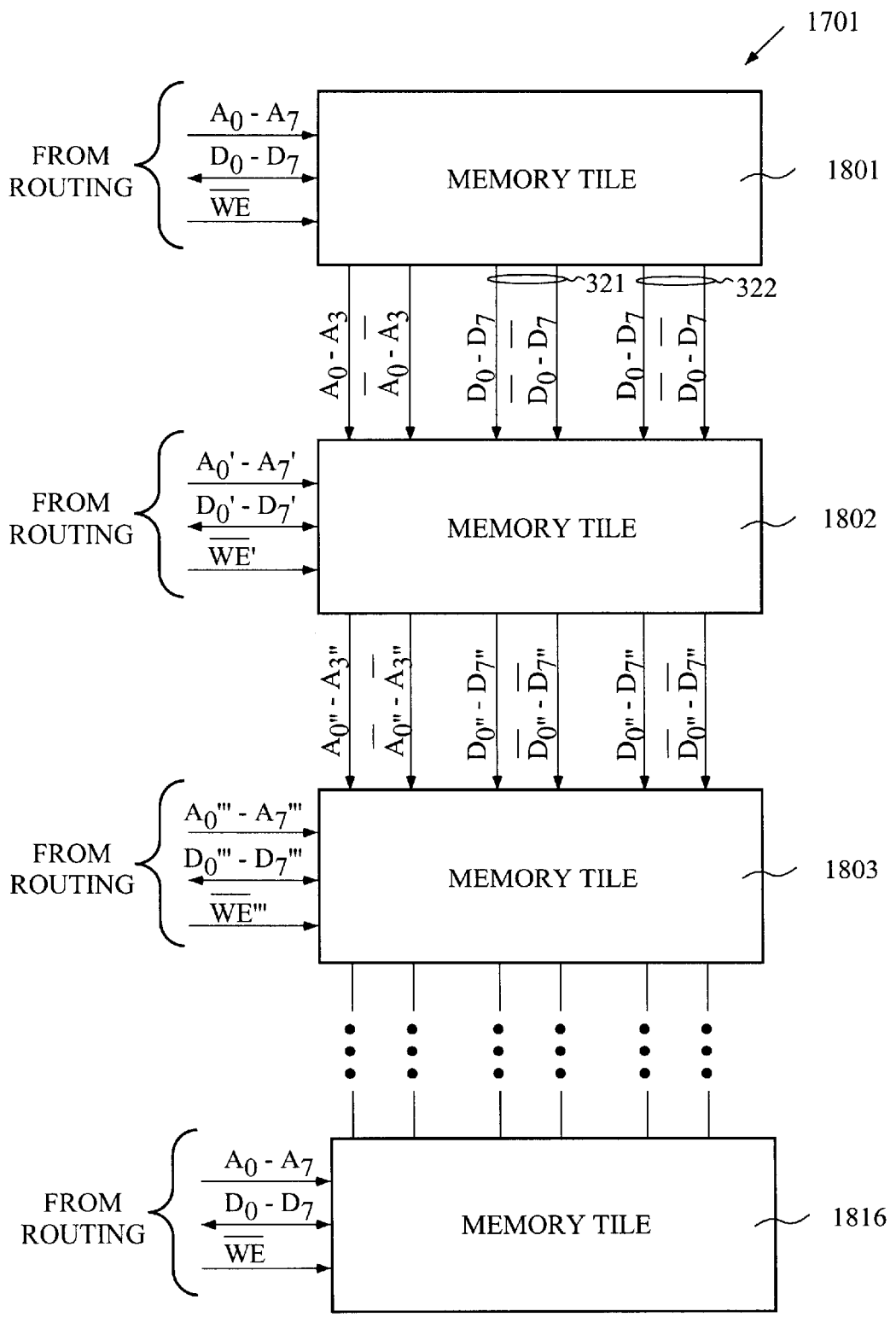
FIG. 18 is a block diagram of a composable RAM stripe of FIG. 17.

FIG. 18 is a block diagram of one composable RAM stripe 1701. Because composable RAM stripes 1702–1716 are identical to composable RAM stripe 1701, only composable RAM stripe 1701 is described in detail. Composable RAM stripe 1701 includes sixteen RAM memory elements, herein referred to as tiles 1801–1816. Each of memory tiles 1801–1816 has a storage capacity of 16 bytes, wherein each byte has 8 bits. Memory tiles 1801–1816 are each coupled to conventional routing circuitry (not shown) within a programmable logic device (PLD), such as an FPGA, such that each of memory tiles 1801–1816 is capable of receiving a set of address signals, a set of data signals and a write enable signal. For example, memory tile 1801 receives address signals $A_0$–$A_7$, data signals $D_0$–$D_7$ and write enable signal WE# from the routing circuitry. (Note that the symbol # is used to identify an active low signal or the inverse of a signal. In the Figures, the # symbol is replaced with an overscore bar.) Because each of memory tiles 1801–1816 is capable of receiving separate address, data and write enable signals from the routing circuitry, each of memory tiles 1801–1816 is capable of operating as an independent 16-byte memory array. Furthermore, two or more of memory tiles 1801–1816 can be concatenated to allow RAM memory stripe 1701 to operate as a single memory having a capacity of up to 256 bytes. For example, to create a 32-byte memory, memory tiles 1801 and 1802 can be concatenated. In such an example, address signals $A_0$–$A_7$, data signals $D_0$–$D_7$ and write enable signal WE# are provided to memory tile 1801. As described in more detail below, circuitry within memory tile 1802 can be programmed to operate in response to the same signals received by memory tile 1801. Any number of consecutive memory tiles 1801–1816 can be concatenated with memory tile 1801 to form a memory array which operates in response to the signals received by memory tile 1801.

Figure 19A:
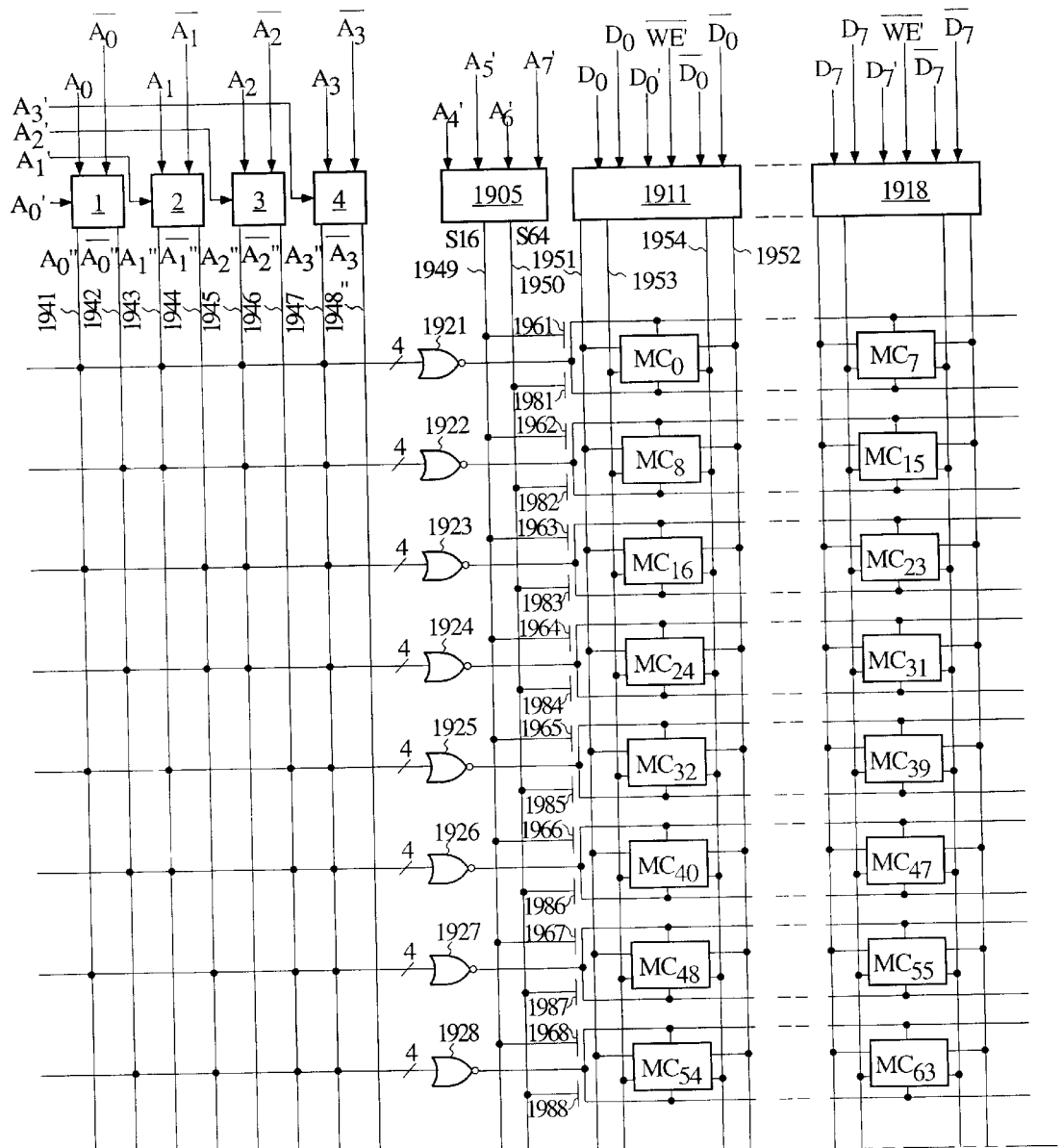
FIG. 19, which consists of FIGS. 19a and 19b, is a schematic diagram of a memory tile in accordance with one embodiment of the invention.
Figure 19B:
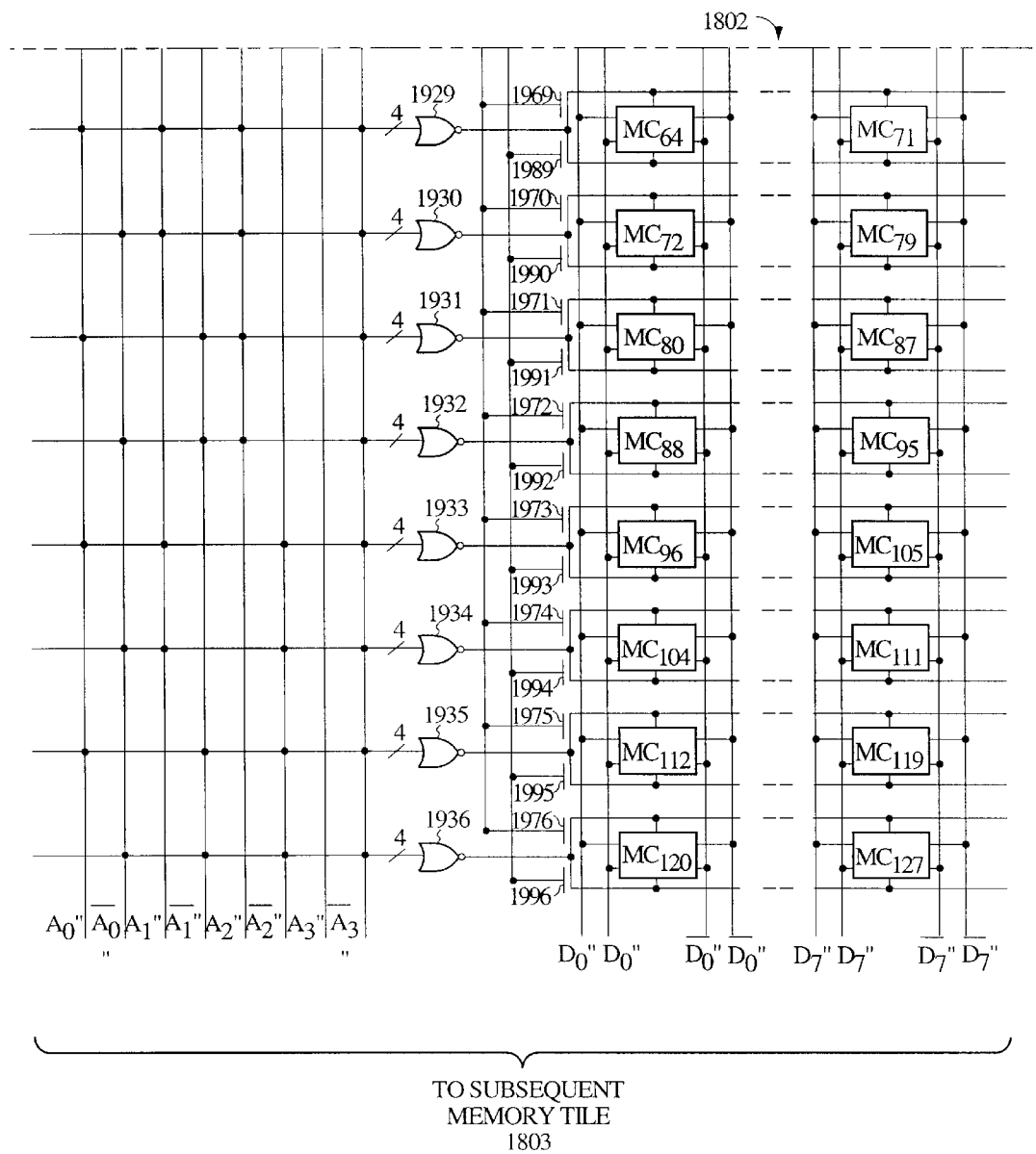

FIG. 19, which consists of FIGS. 19*a* and 19*b* as illustrated, is a schematic diagram of memory tile 1802. Memory tiles 1801 and 1803–1616 are substantially identical to memory tile 1802. Memory tile 1801 does not require all of the circuitry present in memory tiles 1802–1816 because memory tile 1801 does not receive signals directly from a previous memory tile in the same manner as memory tiles 1802–1816. Thus, memory tile 1801 may be fabricated without this additional circuitry. Alternatively, memory tile 1801 may be fabricated with this additional circuitry, but this additional circuitry may be programmed to pass only the signals $A_0$–$A_7$, $D_0$–$D_7$ and WE# received from the routing circuitry. Memory tile 1802 includes a block of inter-tile logic which includes address bit selection circuits 1901–1904, memory tile selection circuit 1905, and bit line selection circuits 1911–1918. Because bit line selection circuits 1911–1918 are substantially identical, only bit line selection circuits 1911 and 1918 are shown for purposes of clarity. Memory tile 1802 also includes NOR gates 1921–1936, dual-port SRAM cells $MC_0$–$MC_{127}$ (only some of which are shown), word select lines 1941–1948, port select lines 1949–1950, data lines 1951–1954 and select transistors 1961–1976 and 1981–1996. Memory tile 1802 receives address signals $A_0$–$A_3$ and $A_0\#$–$A_3\#$ and data signals $D_0$–$D_{7\ and\ D0}\#$–$D_7\#$ from previous memory tile 1801. Memory tile 1802 also receives address signals $A_0'$–$A_7'$, data signals $D_0'$–$D_7'$ and write enable signal WE#' from routing circuitry.

In general, address bit selection circuits 1901–1904 select between the address signals received from memory tile 1801 and the address signals received from the routing circuitry to provide the address signals $A_0"$–$A_3"$ and $A_0"\#$–$A_3"\#$ to word select lines 1941–1948. Address signals $A_0$–$A_3$ and $A_0\#$–$A_3\#$ are decoded by NOR gates 1921–1936 to perform a row selection function.

Memory tile selection circuit 1905 compares address signals $A_4'$–$A_7'$ with a preprogrammed tile address to determine whether memory tile 1802 is being addressed. If memory tile 1802 is being addressed, memory tile selection circuit 1905 also determines whether dual-port SRAM cells $MC_0$–$MC_{127}$ will be accessed through their first or second ports by providing a port selection signal (e.g., S16 or S64) on one of port select lines 1949 and 1950.

Bit line selection circuits 1911–1918 are programmed either to accept data values $D_0'$–$D_7'$ and write enable signal WE#' from the routing circuitry, or to accept data values $D_0$–$D_7$ from previous memory tile 1801. Bit line selection circuits 1911–1918 are also programmed to select the use of a first set of bit lines (e.g., bit lines 1951 and 1952), or a second set bit lines (e.g., bit lines 1953 and 1954). The first set of bit lines are used when a relatively small number of memory tiles are concatenated to form a memory array. The second set of bit lines are used when a larger number of memory tiles are concatenated to form a memory array. Typically, when a multiple of four memory tiles are to be concatenated, the second set of bit lines are used. The second set of bit lines introduce less signal delay than the first set of bit lines. In one embodiment, one pass transistor delay per memory tile is introduced by the first set of bit lines and one pass transistor delay per four memory tiles is introduced by the second set of bit lines.

Address bit selection circuits 1901–1904, memory tile selection circuit 1905, and bit line selection circuits 1911–1918 determine whether memory tile 1802 operates as an initial memory tile or as a concatenated memory tile. An initial memory tile is a memory tile which either operates independently of the other memory tiles, or operates as the first memory tile in a chain of concatenated memory tiles. Thus, memory tile 1802 would be an initial memory tile in a 16-byte memory which includes only memory tile 1802. Likewise, memory tile 1802 would be an initial memory tile in a 64-byte memory which includes the series combination of memory tile 1802 and subsequent memory tiles 1803–1805. Memory tile 1802 would be considered a concatenated memory tile in any memory which includes the series combination of previous memory tile 1801 and memory tile 1802.

Address bit selection circuits 1901–1904, memory tile selection circuit 1905 and bit line selection circuits 1911–1918 are described in more detail below.

Figure 20A:
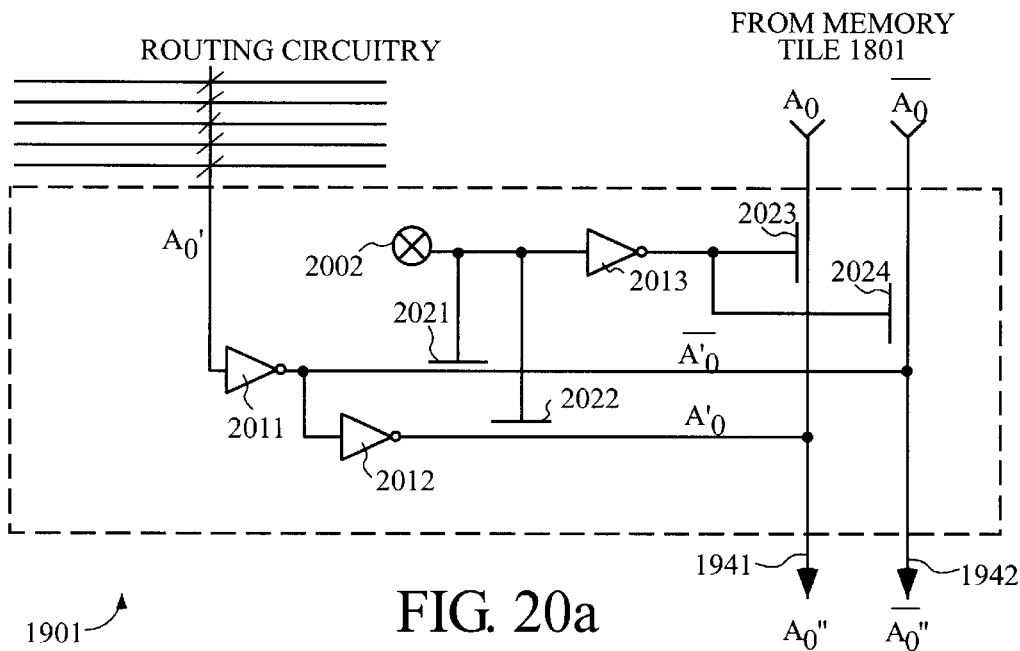
FIGS. 20a and 20b are schematic diagrams of address bit selection circuits in accordance with two embodiments of the invention.

FIG. 20a is a schematic diagram of address bit selection circuit 1901. Address bit selection circuits 1902–1904 are identical to address bit selection circuit 1901. Address bit selection circuit 1901 includes configurable bit latch 2002, inverters 2011–2013, pass transistors 2021–2024 and word select lines 2031 and 2032.

To program memory tile 1802 to operate as a concatenated memory tile, address bit selection circuit 1901 is programmed to provide address signals $A_0$ and $A_0\#$ from previous memory tile 1801 to word select lines 1941 and 1942, respectively. To do this, configurable bit latch 2002 is programmed to provide a logic "0" value to the gates of pass transistors 2021 and 2022. As a result, pass transistors 2021 and 2022 are turned off, thereby preventing the address signal $A_0'$ (received from the routing circuitry) from being routed to word select line 1941 and preventing address signal $A_0'\#$ from being routed to word select line 1942. The logic "0" value provided by configurable bit latch 2002 is also provided to inverter 2013, causing a logic "1" signal to be provided to the gates of pass transistors 2023 and 2024. As a result, pass transistors 2023 and 2024 are turned on and the address signals $A_0$ and $A_0\#$ from previous memory tile 1801 are provided to word select lines 1941 and 1942 as address signals $A_0"$ and $A_0"\#$, respectively.

To program memory tile 1802 to operate as an initial memory tile, address bit selection circuit 1901 is programmed to provide address signal $A_0'$ and the inverse of address signal $A_0'$ (i.e., $A_0'\#$) from the routing circuitry to word select lines 1941 and 1942, respectively. To accomplish this, address signal $A_0'$ is routed from the routing circuitry to the input terminal of inverter 2011 (using, for example, conventional pass transistors and/or multiplexers), and configurable bit latch 2002 is programmed to provide a logic "1" value to the gates of pass transistors 2021 and 2022. The logic "1" value provided by configurable bit latch 2002 causes pass transistors 2021 and 2022 to turn on. In this manner, address signal $A_0'$ is routed through inverters 2011–2012 and pass transistor 2022 to word select line 1941 as address signal $A_0"$. In addition, by routing address signal $A_0'$ through inverter 2011 and pass transistor 2021, the inverse of address signal $A_0'$ is provided to word select line 1942 as address signal $A_0"\#$.

In the initial memory tile configuration, configurable bit latch 2002 also provides a logic "1" value to inverter 2013. As a result, a logic "0" value is provided to the gates of pass transistors 2023 and 2024, thereby turning off pass transistors 2023 and 2024. As a result, address signals $A_0$ and $A_0\#$ are prevented from being transmitted to word select lines 1941 and 1942.

Figure 20B:
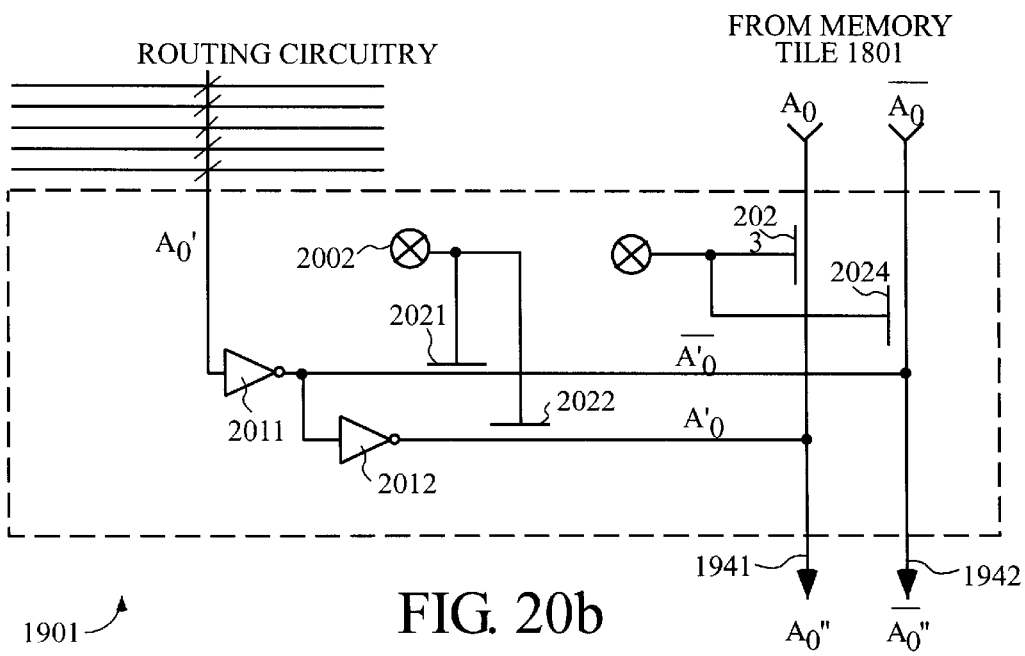

FIG. 20b is a schematic diagram of address bit selection circuit 1901 in accordance with an alternative embodiment. Similar elements in FIGS. 20a and 20b are labeled with similar reference numbers. The address bit selection circuit 1901 of FIG. 20b includes an additional configurable bit latch 2003 which is coupled to the gates of pass transistors 2023 and 2024. Configurable bit latch 2003 thereby allows pass transistors 2023 and 2024 to be controlled independently. The address bit selection circuit 1901 of FIG. 20b allows the same modes of operation as the address bit selection circuit 1901 of FIG. 20a, and also provides one additional mode. If configurable bit latches are both programmed to provide logic "1" values, then pass transistors 2021–2024 are all turned on. This allows address signal $A_0'$ and its inverse ($A_0'\#$) to be transmitted to subsequent memory tile 1803 as address signals $A_0''$ and $A_0''\#$, and also to previous memory tile 1801 as address signals $A_0$ and $A_0\#$. If configurable bit latches 2002 and 2003 are both programmed to provide logic "0" values, then pass transistors 2021–2024 are all turned off, thereby disconnecting tile 1802 from memory tile 1801 above, permitting memory tile 1801 to be used independently. Thus, tile 1802 is driven from tile 1803 or some other lower tile. In this manner, the address bit selection circuit 1901 of FIG. 20b provides additional flexibility in routing address signals.

Address bit selection circuits 1902–1904 operate in the same manner as address bit selection circuit 1901. As a result, four address signals $A_0''-A_3''$ and their complements $A_0''\#-A_3''\#$ are provided to word select lines 1941–1948. Address signals $A_0''-A_3''$ and $A_0''\#-A_3''\#$ are used to address the 16 bytes of memory tile 1802 by selectively providing these address signals to NOR gates 1921–1936. The interconnections made between word select lines 1941–1948 and NOR gates 1921–1936 for this addressing scheme are illustrated in FIG. 19. Thus, if signals $A_0''-A_3''$ are all logic "0" values (and signals $A_0''\#-A_3''\#$ are all logic "1" values), then the output signal of NOR gate 1921 is a logic "1" value, and the output signals of NOR gates 1922–1936, are all logic "0" values. As described in more detail below, this allows access to the first row of memory cells $MC_0-MC_7$ of memory tile 1802 (assuming that memory tile 1802 is selected by memory tile selection circuit 1905).

Address signals $A_0''-A_3''$ and $A_0''\#-A_3''\#$ are provided to subsequent memory tile 1803 (FIG. 18). If memory tile 1803 is to operate as a concatenated memory tile, address bit selection circuits (not shown) in memory tile 1803 are programmed to select these address signals $A_0''-A_3''$ and $A_0''\#-A_3''\#$ for use within memory tile 1803. Alternatively, if memory tile 1803 is to operate as an initial memory tile, the address bit selection circuits of memory tile 1803 are programmed to select address signals $A_0'''-A_3'''$ for use within memory tile 1803.

Figure 21:
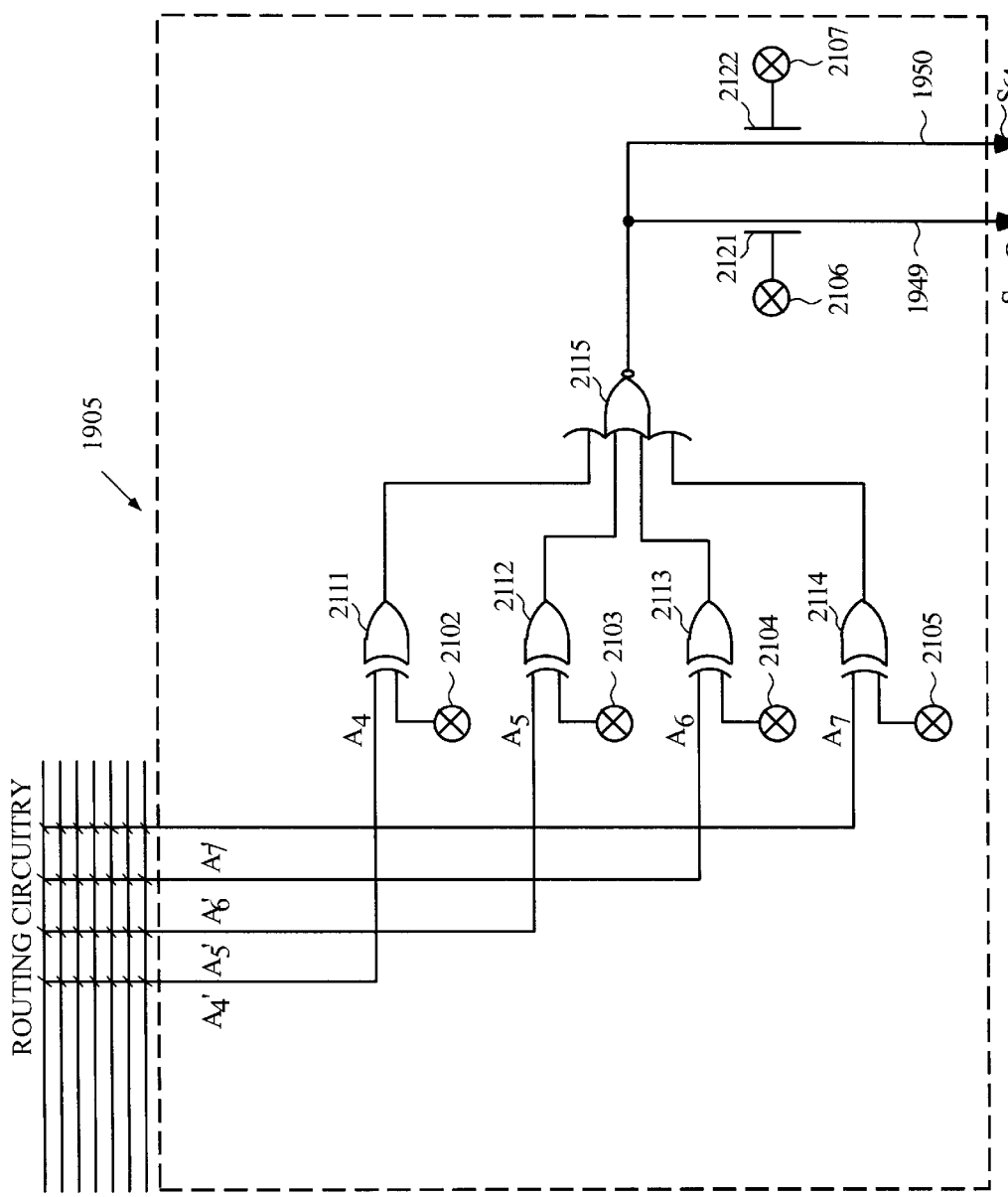
FIG. 21 is a schematic diagram of a memory tile selection circuit in accordance with one embodiment of the invention.

FIG. 21 is a schematic diagram of memory tile selection circuit 1905 which includes configurable bit latches 2102–2107, exclusive OR gates 2111–2114, Four-input NOR gate 2115 and pass transistors 2121 and 2122. The routing circuitry is programmed (using, for example, conventional pass transistors and/or multiplexers) to provide upper address signals $A_4'-A_7'$ from the routing circuitry to input terminals of exclusive OR gates 2111–2114, respectively. If memory tile 1802 is to be operated as a concatenated memory tile, the routing circuitry is configured such that each of the concatenated memory tiles receive the same upper address signals.

Configurable bit latches 2102–2105 are programmed to provide signals which are representative of the particular address selected for memory tile 1802. For example, if memory tile 1802 is assigned an address of 0001 (i.e., $A_7'=0$, $A_6'=0$, $A_5'=0$, and $A_4'=1$), configurable bit latch 2102 is programmed to provide a logic "1" value to exclusive OR gate 2111 and configurable bit latches 2103–2105 are programmed to provide logic "0" values to exclusive OR gates 2112–2114, respectively. Thus, when address signals $A_7'$, $A_6'$, $A_5'$ and $A_4'$ have logic "0", "0", "0" and "1" values, respectively, the output signals from exclusive OR gates 2111–2114 are all logic "0" values. Four-input NOR gate 2115 receives these logic "0 values, and in response, provides an output signal having a logic "1" value. The NOR gate 2115 will only provide a logic "1" value when address signals $A_4'-A_7'$ correspond to the values programmed in configurable bit latches 2102–2105. The four address signals $A_4'-A_7'$ are capable of addressing each of the sixteen memory tiles 1801–1816 in composable RAM stripe 1701.

The output signal from NOR gate 2115 is either routed through pass transistor 2121 to port select line 1949 as port select signal S16, or routed through pass transistor 2122 to port select line 1950 as port select signal S64. Pass transistors 2121 and 2122 are controlled by configurable bit latches 2106 and 2107, respectively. Port select line 1949 is coupled to the gates of a first group of pass transistors 1961–1976 (FIG. 19) and port select line 1950 is coupled to the gates of a second group of pass transistors 1981–1996 (FIG. 19). When memory tile select circuit 1905 is programmed to provide port select signal S16, and port select signal S16 has a logic "1" value, pass transistors 1961–1976 are turned on. When pass transistors 1961–1976 are turned on, the word select signals generated by NOR gates 1921–1936 (FIG. 19) are provided to enable the first ports of memory cells $MC_0-MC_{127}$.

Similarly, when memory tile select circuit 1905 is programmed to provide port select signal S64, and port select signal S64 has a logic "1" value, pass transistors 1981–1996 are turned on. As a result, the word select signals generated by NOR gates 1921–1936 (FIG. 19) are provided to enable the second ports of memory cells $MC_0-MC_{127}$.

Figure 22:
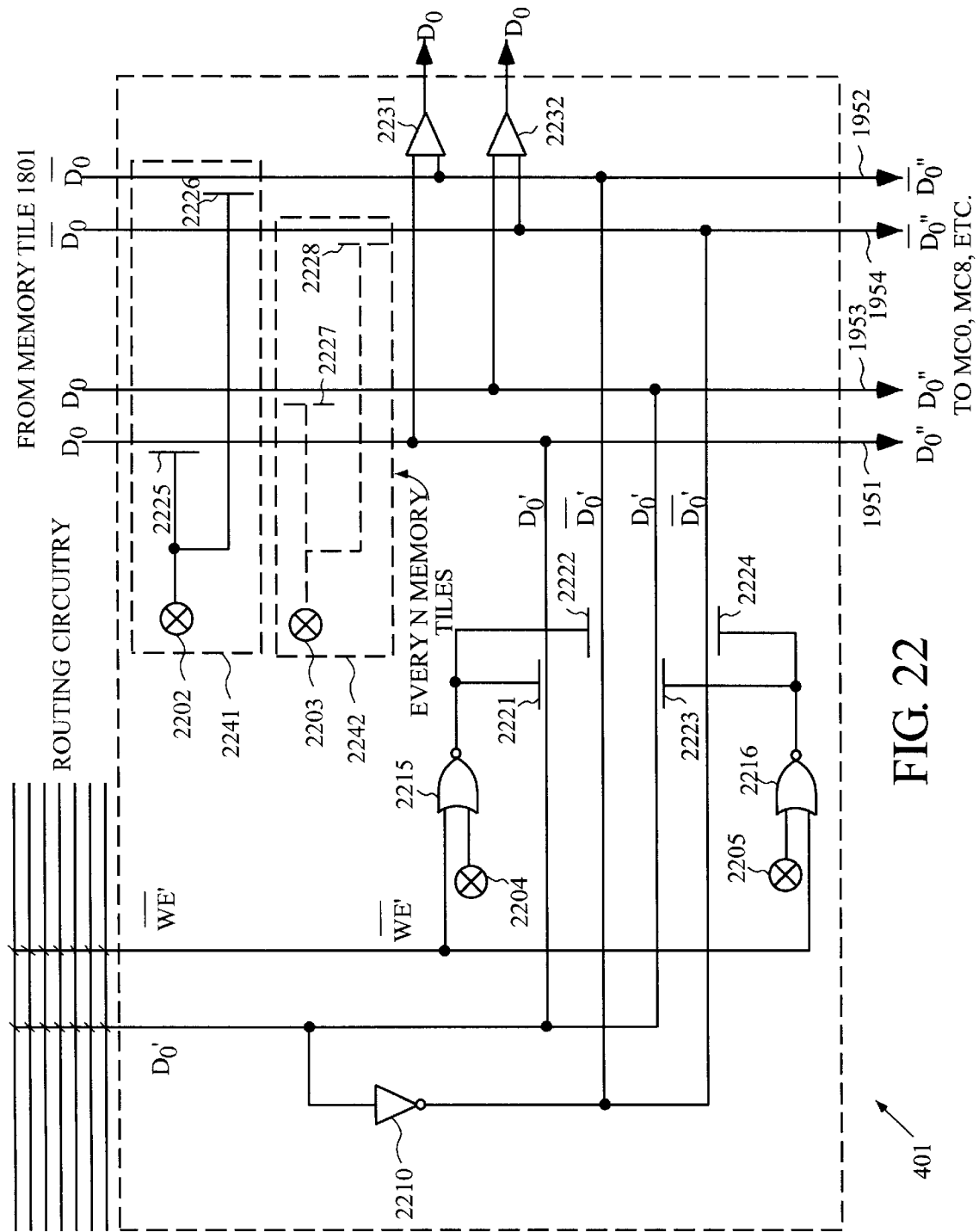
FIG. 22 is a schematic diagram of a bit line select circuit in accordance with one embodiment of the invention.

FIG. 22 is a schematic diagram of bit line select circuit 1911. Bit line select circuits 1912–1918 are substantially identical to bit line select circuit 1911. Bit line select circuit 1911 includes configurable bit latches 2202–2205, inverter 2210, NOR gates 2215–2216, pass transistors 2221–2228, sense amplifiers 2231–2232 and bit lines 1951–1954. Configurable bit latch 2202 and pass transistors 2225 and 2226 form a first configuration circuit 2241 and configurable bit latch 2203 and pass transistors 2227 and 2228 form a second configuration circuit 2242. Bit line select circuit 1911 receives data signal $D_0'$ and write enable signal WE'# from the routing circuitry and data signals $D_0$ and $D_0\#$ from previous memory tile 1801.

Bit line select circuit 1911 is programmed to determine (1) whether data signals $D_0$ and $D_0\#$ or data signals $D_0'$ and $D_0'\#$ are transmitted through bit line selection circuit 1911 as data signals $D_0''$ and $D_0''\#$, and (2) whether data signals $D_0''$ and $D_0''\#$ are transmitted on first bit lines 1951 and 1952 or on second bit lines 1953 and 1954. The first bit lines include the bit lines, such as bit lines 1951 and 1952, which are coupled to the first ports of memory cells $MC_0-MC_{127}$. The second bit lines include bit lines, such as bit lines 1953 and 1954, which are coupled to the second ports of memory cells $MC_0-MC_{127}$. As described in more detail below, the first or second set of bit lines are selected based on the number of memory tiles 1801–1816 that are to be concatenated.

Bit line select circuits 1911–1918 must be programmed in a manner consistent with memory tile select circuit 1905. For example, if bit line select circuits 1911–1918 are programmed to select the first bit lines (which are coupled to the first ports of memory cells $MC_0-MC_{127}$), then memory tile select circuit 1905 must be programmed to provide port select signal S16 (which provides access to the first ports of memory cells $MC_0-MC_{127}$ by enabling pass transistors 1961–1976).

Memory tile 1802 can be programmed to be an initial memory tile in a series concatenation which also includes any consecutive number of memory tiles 1803–1816. If memory tile 1802 is to operated as an initial memory tile, configurable bit latch 2202 and optional configurable bit latch 2203 (if present) are programmed to provide logic "0" values to the gates of pass transistors 2225–2228, thereby preventing bit line selection circuit 1911 from passing data signals $D_0$ and $D_0\#$ from previous memory tile 1801. Although data signal $D_0$ is shown as existing on both bit line 1951 (a first bit line) and bit line 1953 (a second bit line) and data signal $D_0\#$ is shown as existing on both bit line 1952 (a first bit line) and bit line 1954 (a second bit line), it is understood that data signal $D_0$ exists on either bit line 1951 or bit line 1953, but not on both of these bit lines. Similarly, data signal $D_0\#$ exists on either bit line 1952 or bit line 1954, but not on both. Moreover, if data signal $D_0$ exists on bit line 1951, then data signal $D_0\#$ exists on bit line 1952. Similarly, if data signal $D_0$ exists on bit line 1953, then data signal $D_0\#$ exists on bit line 1954.

Still assuming that memory tile 1802 is to be configured as an initial memory tile, one of configurable bit latches 2204 and 2205 is programmed to provide a logic "0" value and the other is programmed to provide a logic "1" value. If first bit lines 1951 and 1952 are to be selected, configurable bit latch 2204 is programmed to provide a logic "0" value to NOR gate 2215 and configurable bit latch 2205 is programmed to provide a logic "1" value to NOR gate 2216. The logic "1" value provided by configurable bit latch 2205 forces the output signal of NOR gate 2216 to a logic "0" value, thereby turning off pass transistors 2223 and 2224 and preventing data signal $D_0'$ and its inverse from being transmitted to bit lines 1953 and 1954.

In addition to receiving a logic "0" value from configurable bit latch 2204, NOR gate 2215 also receives write enable signal WE'#. Thus, write enable signal WE'# controls the output signal of NOR gate 2215, which in turn, controls pass transistors 2221 and 2222. When write enable signal WE has a logic "0" value, the output signal of NOR gate 2215 goes high, thereby turning on pass transistors 2221 and 2222. As a result, data signals $D_0'$ and $D_0'\#$ are transmitted to bit lines 1951 and 1952 as data signals $D_0''$ and $D_0''\#$, respectively.

Data signals $D_0''$ and $D_0''\#$ are transmitted to the first port each of the memory cells in the first column of the memory array in memory tile 1802 (e.g., memory cells $MC_0$, $MC_8$, $MC_{16}$, $MC_{24}$, etc.) Data signals $D_0''$ and $D_0''\#$, are also transmitted through memory tile 1802 to memory tile 1803. Memory tile 1803 can be configured to operate as a concatenated memory tile. Configuration as a concatenated memory tile is described in more detail below in connection with memory tile 1802.

If write enable signal WE'# has a logic "1" value, pass transistors 2221 and 2222 are turned off. Under these conditions, data signals $D_0''$ and $D_0''\#$ can be read out of an addressed memory cell to sense amplifier 2231, which is coupled across bit lines 1951 and 1952.

Memory tile 1802, when operated as an initial memory tile, can also be programmed to utilize second bit lines 1953 and 1954, instead of first bit lines 1951 and 1952. To do this, configurable bit latches 2204 and 2205 are programmed to provide logic "1" and logic "0" values, respectively.

If memory tile 1802 is to be operated as a concatenated memory tile with previous memory tile 1801, configurable bit latches 2204 and 2205 are programmed to provide logic "0" values to NOR gates 2215 and 2216, respectively. As a result, pass transistors 2221–2224 are turned off and data signals $D_0'$ and $D_0'\#$ are prevented from being passed to bit lines 1951–1954. If previous memory tile 1801 is programmed to provide data signals $D_0$ and $D_0\#$ on first bit lines 1951 and 1952, configurable bit latch 2202 is programmed to provide a logic "1" value to the gates of pass transistors 2225 and 2226, thereby turning these pass transistors on. Consequently, transistors 2225 and 2226 pass data signals $D_0$ and $D_0\#$ to first bit lines 1951 and 1952 as data signals $D_0''$ and $D_0''\#$, respectively.

Each of the bit line select circuits in memory tiles 1801–1816 includes circuitry which corresponds to first configuration circuit 2241 of bit line select circuit 1911. Thus, the first bit lines advantageously provide flexibility to concatenate any number of memory tiles 1801–1816. When the first bit lines are selected, each concatenated memory tile introduces a delay on the bit lines equal to the delay introduced by one pass transistor. For example, if memory tiles 1801–1803 are concatenated and the first bit lines are selected, a bit line delay corresponding to one pass transistor would be introduced by each of memory tiles 1802 and 1803 (for a total delay corresponding to two pass transistors). If all sixteen memory tiles 1801–1816 are concatenated and the first bit lines are selected, a total bit line delay corresponding to fifteen pass transistors would be introduced. Thus, while the first bit lines provide flexibility by allowing any number of the memory tiles to be concatenated, the bit line selection circuits which provide this flexibility causes non-trivial signal delay on the first bit lines.

Thus, in accordance with one embodiment of present invention, the second bit lines include circuitry which allows a larger number of memory tiles to be concatenated with less bit line delay. This circuitry is illustrated in FIG. 22 as second configuration circuit 2242. However, second configuration circuit 2242 operates in a manner similar to first configuration circuit 2241. Second configuration circuit 2242 is not present in every memory tile, but rather in non-consecutive memory tiles. Although second configuration circuit 2242 would typically not be included in memory tile 1802, circuit 2242 is shown in connection with memory tile 1802 for ease of illustration. In one embodiment, memory tiles 1805, 1809, and 1813 (FIG. 17) include a second configuration circuit 2242. In such an embodiment, the second bit lines are used to form memory arrays which include groups of four memory tiles. For example, the second bit lines can be used to connect memory tiles 1801–1804 without introducing bit line delay due to pass transistors. In another example, the second bit lines can be used to connect memory tiles 1805–1812 and only introduce a bit line delay corresponding to the delay associated with a single pass transistor (present in memory tile 1809). In yet another example, the second bit lines can be used to connect all of memory tiles 1801–1816 and only introduce a bit line delay corresponding to the delay associated with three pass transistors (present in memory tiles 1805, 1809 and 1813). In the foregoing manner, the second bit lines are used to reduce the bit line delay (compared to the first bit lines) of larger concatenated memories.

Figure 23:
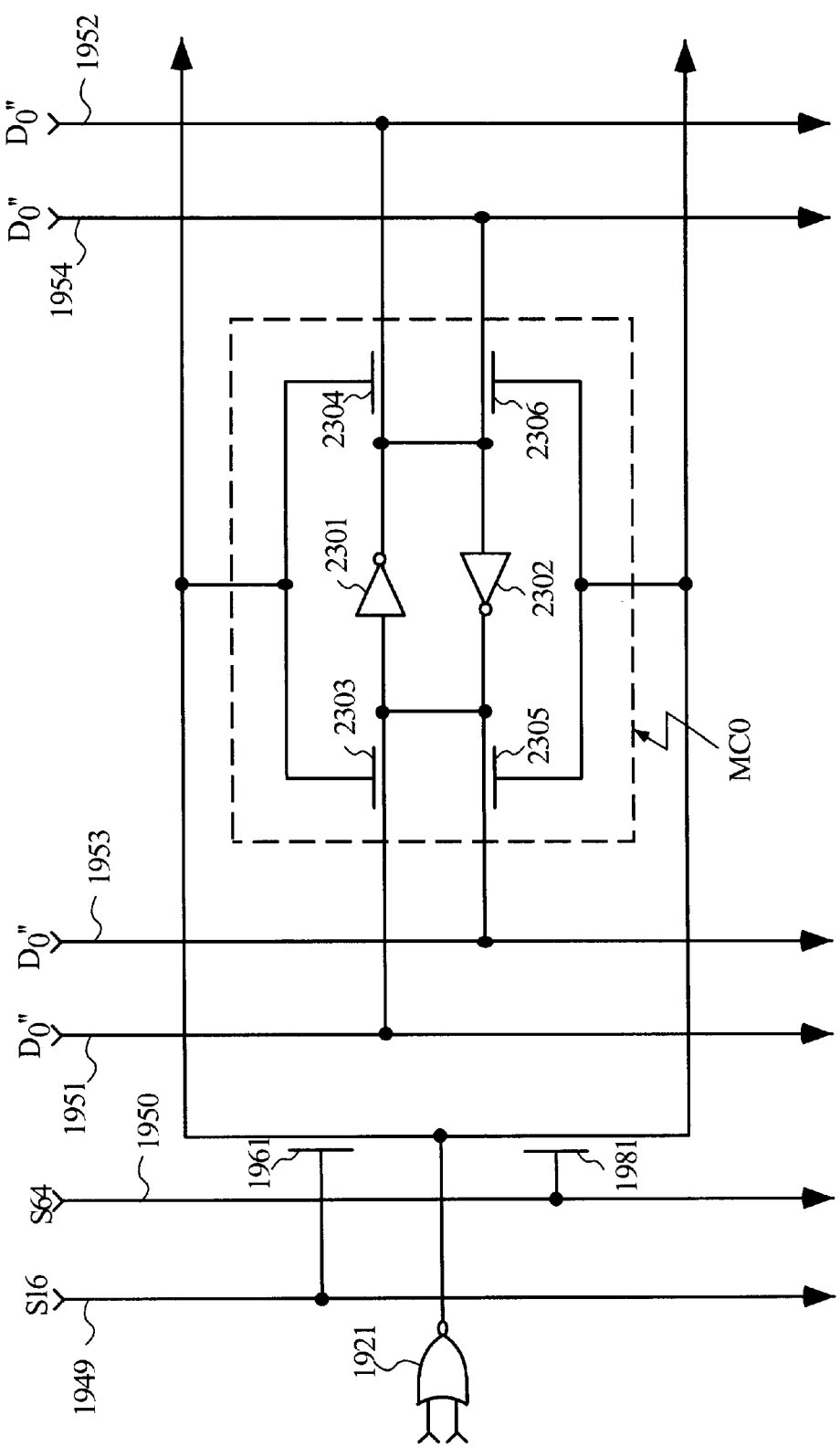
FIG. 23 is a schematic diagram of a dual-port SRAM memory cell connected in accordance with one embodiment of the invention.

FIG. 23 is a schematic diagram of dual-port SRAM memory cell $MC_0$, wherein memory cells $MC_1$–$MC_{127}$ are identical to memory cell $MC_0$. Memory cell $MC_0$ includes inverters 2301 and 2302 which are coupled to form a latch Memory cell $MC_0$ also includes pass transistors 2303–2305. The gates of pass transistors 2303 and 2304 are selectively connected to the output terminal of NOR gate 1921 through pass transistor 1961. The gates of pass transistors 2305 and 2306 are selectively connected to the output terminal of NOR gate 1921 through pass transistor 1981. Pass transistors 1961 and 1981 are controlled by port select signals S16 and S64, respectively.

As previously described in connection with FIG. 21, only one of port select signals S16 and S64 is selected for use by memory tile select circuit 1905. The following example assumes that port select signal S16 is selected. If port select signal S16 has a logic "1" value, pass transistor 1961 is turned on and the word select signal from NOR gate 1921 is provided to pass transistors 2303 and 2304. When the word select signal from NOR gate 1921 has a logic "1" value (i.e., when memory cell $MC_0$ is being addressed), pass transistors 2303 and 2304 are turned on. During a write operation, this causes the data signals on bit lines 1951 and 1952 to be applied to memory cell $MC_0$ and stored in the latch formed by inverters 2301 and 2302. During a read operation, this causes the data signals stored in memory cell $MC_0$ to be provided to sense amplifier 2231 (FIG. 22). The port of memory cell $MC_0$ which is accessed by pass transistors 2303 and 2304 is arbitrarily defined as the first port of dual-port memory cell $MC_0$.

Conversely, when port select signal S64 is selected for use, data signals on bit lines 1953 and 1954 are provided to cell $MC_0$ and stored in the latch formed by inverters 2301 and 2302 during a write operation. During a read operation, the data signals stored in memory cell $MC_0$ is provided to sense amplifier 2232 (FIG. 2). The port of memory cell $MC_0$ which is accessed by pass transistors 2305 and 2305 is defined as the second port of dual-port memory cell $MC_0$.

When port select signal S16 is selected for use, bit line select circuit 1911 must be programmed to provide data values on first bit lines 1951 and 1952 (rather than on second bit lines 1953 and 1954). Moreover, when port select signal S64 is selected for use, bit line select circuit 1911 must be programmed to provide data values on second-bit lines 1953 and 1954 (rather than on first bit lines 1951 and 1952).

Figure 24:
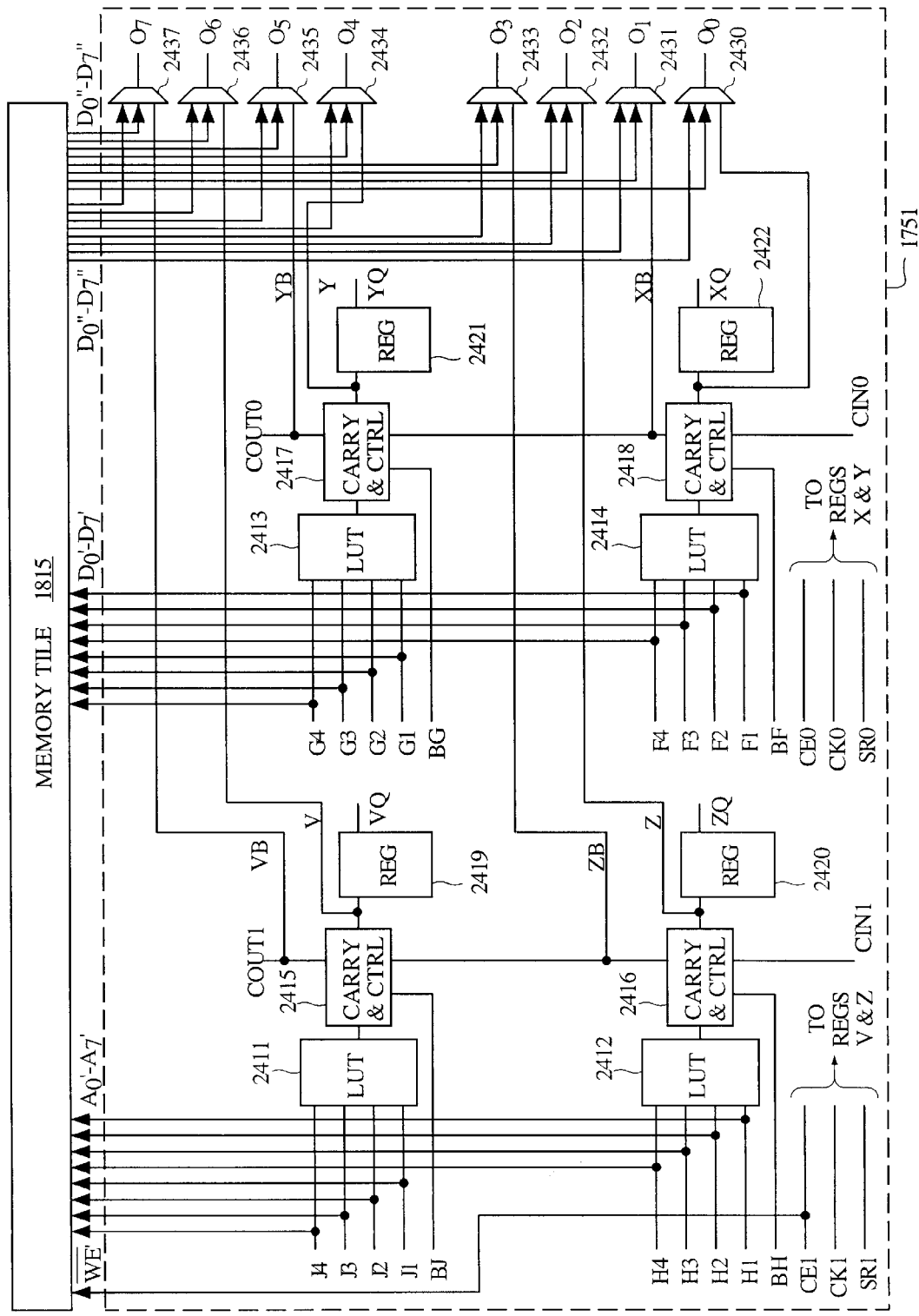
FIG. 24 is a block diagram illustrating a memory tile and a CLE of the structure of FIG. 17 in accordance with one embodiment of the present invention.

FIG. 24 is a block diagram illustrating CLE 1751 and memory tile 1815 in accordance with one embodiment of the present invention. CLE 1751 includes look-up tables (LUTs) 2411–2414, carry/control circuits 2415–2418 and registers 2419–2422, which are connected as illustrated. LUTs 2411, 2412, 2413 and 2414 receive input signals J1–J4, H1–H4, G1–G4 and F1–F4, respectively, from the routing circuitry (not shown) of the programmable logic device. LUTs 2411–2414 are typically programmed to provide corresponding output signals to carry/control circuits 2415–2418, respectively, in response to these received input signals. Carry/control circuits 2415–2418 are also coupled to receive input signals BJ, BH, BG and BF, respectively, from the routing circuitry. Carry/control circuits 2416 and 2418 are coupled to receive carry input signals CIN1 and CIN0, respectively, from the routing circuitry. Carry/control circuits 2415 and 2417 are coupled to receive carry input signals from carry/control circuits 2416 and 2418, respectively, and to provide carry output signals COUT1 and COUT0, respectively, to the routing circuitry.

The carry output signals provided by carry/control circuits 2415–2418 are also routed to multiplexers 2437, 2433, 2435 and 2431, respectively, as output signals VB, ZB, YB and XB, respectively. Carry and control circuits 2415–2418 also provide output signals V, Z, Y and X, respectively, to registers 2419, 2420, 2421 and 2422, respectively, and to multiplexers 2436, 2432, 2434, and 2430, respectively. Registers 2419–2422, in turn, provide output signals VQ, ZQ, YQ and XQ, respectively, to the routing circuitry. Registers 2419 and 2420 are controlled by clock enable signal CE1, clock signal CK1 and set/reset signal SR1. Similarly, registers 2421 and 2422 are controlled by clock enable signal CE0, clock signal CK0 and set/reset signal SR0. These signals are received from the routing circuitry of the programmable logic device. LUTs 2411–2414, carry and control circuits 2415–2418 and registers 2419–2422 are described in more detail in commonly owned U.S. Pat. No. 5,914,616, which is hereby incorporated by reference in its entirety.

In accordance with the present invention, the clock enable signal CE1 is routed to memory tile 1815 as the write enable signal WE'#. The input signals J1–J4 and H1–H4 are routed to memory tile 1815 as the address signals $A_0'$–$A_7'$. In addition, the input signals G1–G4 and F1–F4 are routed to memory tile as the input data signals $D_0'$–$D_7'$. In this manner, memory tile 1815 receives the input signals necessary to operate in the manner described above.

In other embodiments, the input signals can be provided to memory tile 1815 in other manners. For example, in another embodiment, the SRO signal can be routed to memory tile 1815 as the write enable signal WE'#ar. Similarly, the J1–J4 and G1–G4 signals can be routed to memory tile 1815 as the address signals $A_0'$–$A_7'$ and the H1–H4 and F1–F4 signals can be routed to memory tile 1815 as the input data signals $D_0'$–$D_7'$.

Also in accordance with the present invention, the data output signals $D_0''$–$D_7''$ from memory tile 1815 are provided to multiplexers 2430–2437, respectively, of CLE 1751. Multiplexers 2430–2437 can be configured to pass either the output signals X, XB, Z, ZB, Y, YB, V and VB from CLE 1751, or the data output signals $D_0''$–$D_7''$ from memory tile 1815. In this manner, CLE 1751 is capable of routing the data output signals received from memory tile 1815 to the routing circuitry of the programmable logic device.

It is noted that memory tile 1815 (like above-described memory tile 1802) is capable of providing two sets of output data signals, namely, a first set of output data signals on the first set of bit lines and a second set of output data signals on the second set of bit lines. Thus, multiplexers 2430–2437 are 3-to-1 multiplexers which are configured to selectively route either the first set of output data signals provided by memory tile 1815, the second set of output data signals provided by memory tile 1815, or the output signals provided by CLE 1751.

Figure 25:
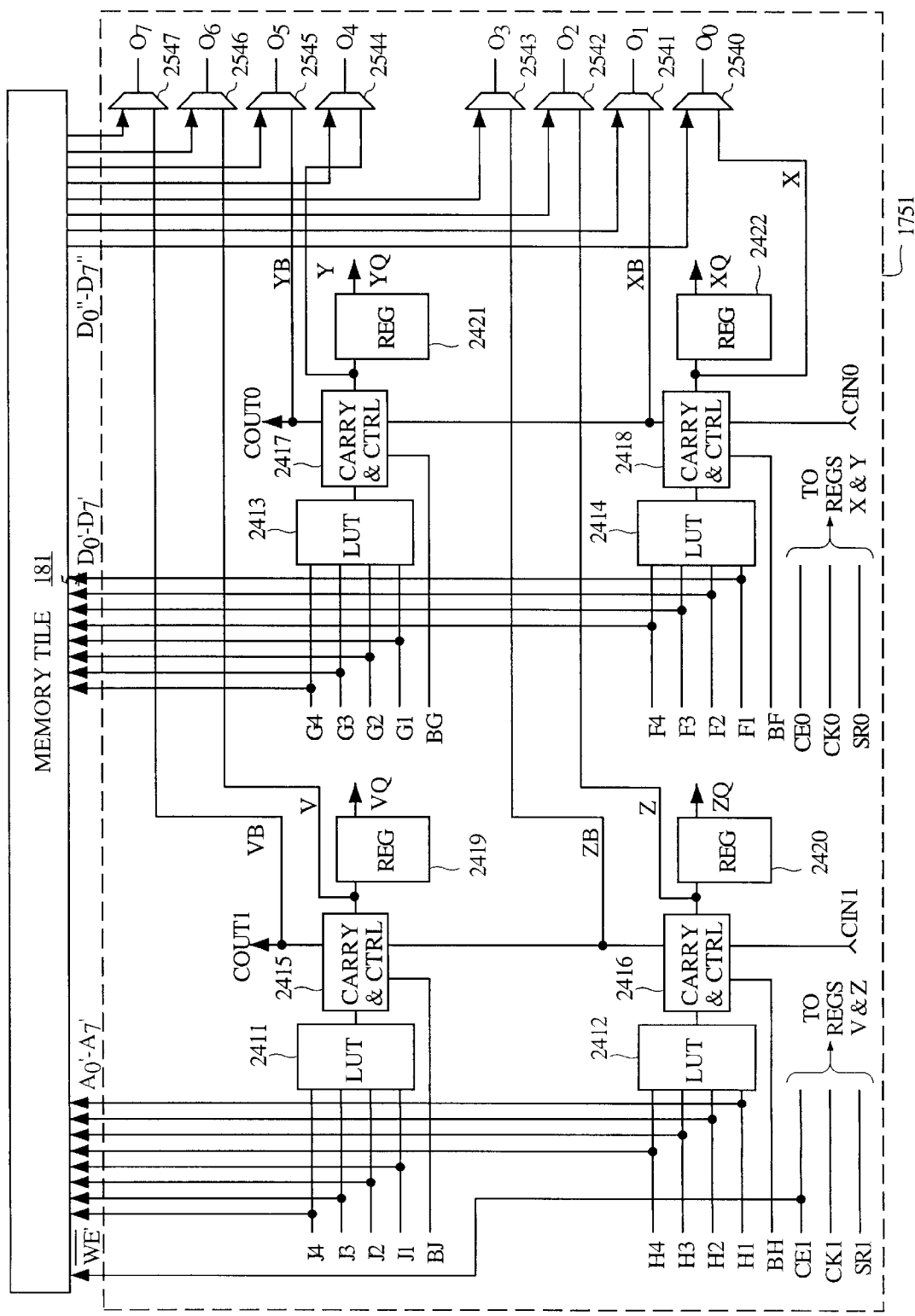
FIG. 25 is a block diagram illustrating a memory tile and a CLE of the structure of FIG. 17 in accordance with another embodiment of the present invention.

In another embodiment of the present invention, the dual-port memory cells in memory tile 1815 (and each of the other memory tiles) are replaced with single-port memory cells, such that each memory tile has are only one set of bit lines and one set of output data signals. FIG. 25 is a block diagram illustrating memory tile 1815 and CLE 1751 in accordance with this embodiment. Similar reference numbers refer to similar elements in FIGS. 24 and 25. Note that in FIG. 25, there is only one set of connections for the output data signals $D_0''$–$D_7''$. Also note that in FIG. 25, the output multiplexers 2540–2547 are 2-to-1 multiplexers.

The modifications to the memory tiles required to support single-port memory cells are trivial, given that the more difficult embodiment, which uses dual-port memory cells, has been described in detail above. When using single-port memory cells, the circuitry that supports the second port of the memory cells is simply eliminated. In this embodiment, there are pass transistors for coupling (or de-coupling) the bit lines in the adjacent memory tiles.

Figure 26:
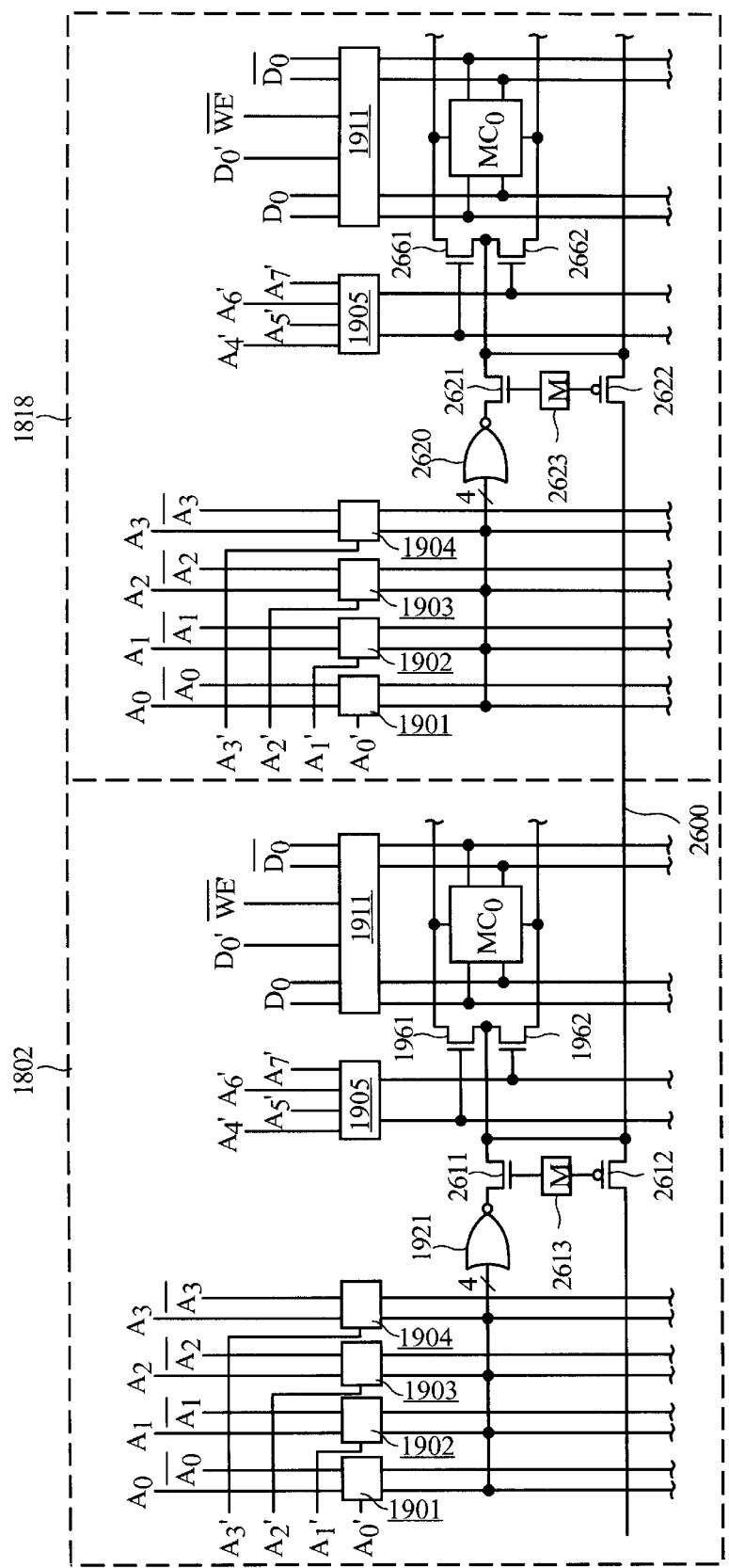
FIG. 26 is a schematic diagram of portions of horizontally adjacent memory tiles in accordance with an embodiment which enables memory expansion along the horizontal axis.

In the above-described embodiment, the composable RAM stripes 1701–1716 are not expandable along the horizontal axis. However, in other embodiments, the composable RAM stripes 1701–1716 are modified such that expansion along the horizontal axis is possible. FIG. 26 is a schematic diagram of portions of horizontally adjacent memory tiles 1802 and 1818 in accordance with one embodiment, which enables memory expansion along the horizontal axis. One of memory tiles 1802 and 1818 is configured to receive input signals $A_0$–$A_3$, while both tiles 1802 and 1818 are configured to receive input signals $A_4$–$A_7$, in the manner described above. Memory tile 1802 is configured to receive data signals $D_0$–$D_7$ and memory tile 1818 is configured to receive data signals $D_8$–$D_{15}$. Note that both tiles receive the write enable signal WE#. FIG. 26 illustrates only one memory cell in each of memory tiles 1802 and 1818. However, it is understood that in the described embodiment, each of memory tiles 1802 and 1818 includes eight columns and sixteen rows of memory cells. Memory tile 1802 has been described above in connection with FIG. 19. In addition to the previously described elements, memory tile 1802 includes horizontal expansion line 2600, n-channel pass transistor 2611, p-channel pass transistor 2612 and configuration memory cell 2613. The gates of pass transistors 2611 and 2612 are coupled to configuration memory cell 2613. As a result, pass transistors 2611 and 2612 are controlled by the configuration data value stored by configuration memory cell 2613. Because pass transistors 2611 and 2612 have different conductivity types, only one of these pass transistors will be turned on at any given time. The drain of n-channel pass transistor 2611 is coupled to the output terminal of NOR gate 1921. The source of n-channel pass transistor 2611 is coupled to the common node of transistors 1961 and 1962, to the drain of p-channel pass transistor 2612, and to horizontal expansion line 2600.

Horizontal extension line 2600 extends to memory tile 1818 (as well as to all of the other memory tiles which are horizontally adjacent to memory tile 1802). Memory tile 1818, which is present in memory stripe 1702, is substantially identical to memory tile 1802. Thus, similar elements in memory tiles 1802 and 1818 are labeled with similar reference numbers. However, NOR gate 2620, n-channel pass transistor 2621, p-channel pass transistor 2622, configuration memory cell 2623, and transistors 2661 and 2662 (which are similar to NOR gate 1921, n-channel pass transistor 2611, p-channel pass transistor 2612, configuration memory cell 2613, and transistors 1961 and 1962, respectively) are given unique reference numbers to simplify the following discussion.

Horizontal memory expansion is accomplished as follows. Configuration memory cell 2613 is programmed to store a logic high value, and configuration memory cell 2623 is programmed to store a logic low value. As a result, n-channel pass transistor 2611 is turned on and p-channel pass transistor 2612 is turned off, thereby routing the output signal provided by NOR gate 1921 to horizontal expansion line 2600 (and to the common node of transistors 1961 and 1962).

In addition, p-channel transistor 2622 is turned on, thereby routing the signal on horizontal expansion line 2600 to the common node of transistors 2661 and 2662. N-channel transistor 2621 is turned off, thereby isolating the output terminal of NOR gate 2620 from the common node of transistors 2661 and 2662.

As described above, the output signal provided by NOR gate 1921 is routed to both the common node of transistors 1961 and 1962, as well as to the common node of transistors 2661 and 2662. As a result, both memory tiles 1802 and 1818 are addressed in response to the address signals received by address bit selection circuits 1901–1904 in memory tile 1802. Because both memory tiles 1802 and 1818 are addressed simultaneously, the resulting memory structure has a width of 16 bits (i.e., the combined width of memory tiles 1802–1818), rather than 8 bits. Note that the memory tile selection circuits 1905 in memory tiles 1802 and 1818 are programmed with the same configuration address, such that access to both of these memory tiles is enabled by the same configuration address.

Although only one of the sixteen rows of memory tiles 1802 and 1818 is illustrated in FIG. 26, it is understood that each of the remaining fifteen rows include circuitry similar to the illustrated row. That is, each of the remaining fifteen rows include horizontal expansion lines that are similar to horizontal expansion line 2600, pass transistors that are similar to pass transistors 2611–2612 and 2621–2622, and configuration memory cells that are similar to configuration memory cells 2613 and 2623.

In one embodiment, each of the composable RAM stripes 1701–1716 includes the above-described circuitry to enable horizontal expansion. If all sixteen composable RAM stripes 1701–1716 are used, horizontal expansion can yield a word length of 128 bits (8 bits per stripe×16 stripes). Alternatively, composable RAM stripes 1701–1708 can be horizontally expanded to provide a first memory structure having a word length of 64 bits, while composable RAM stripes 1709–1716 can be horizontally expanded to provide a second memory structure having a word length of 64 bits.

Figure 27:
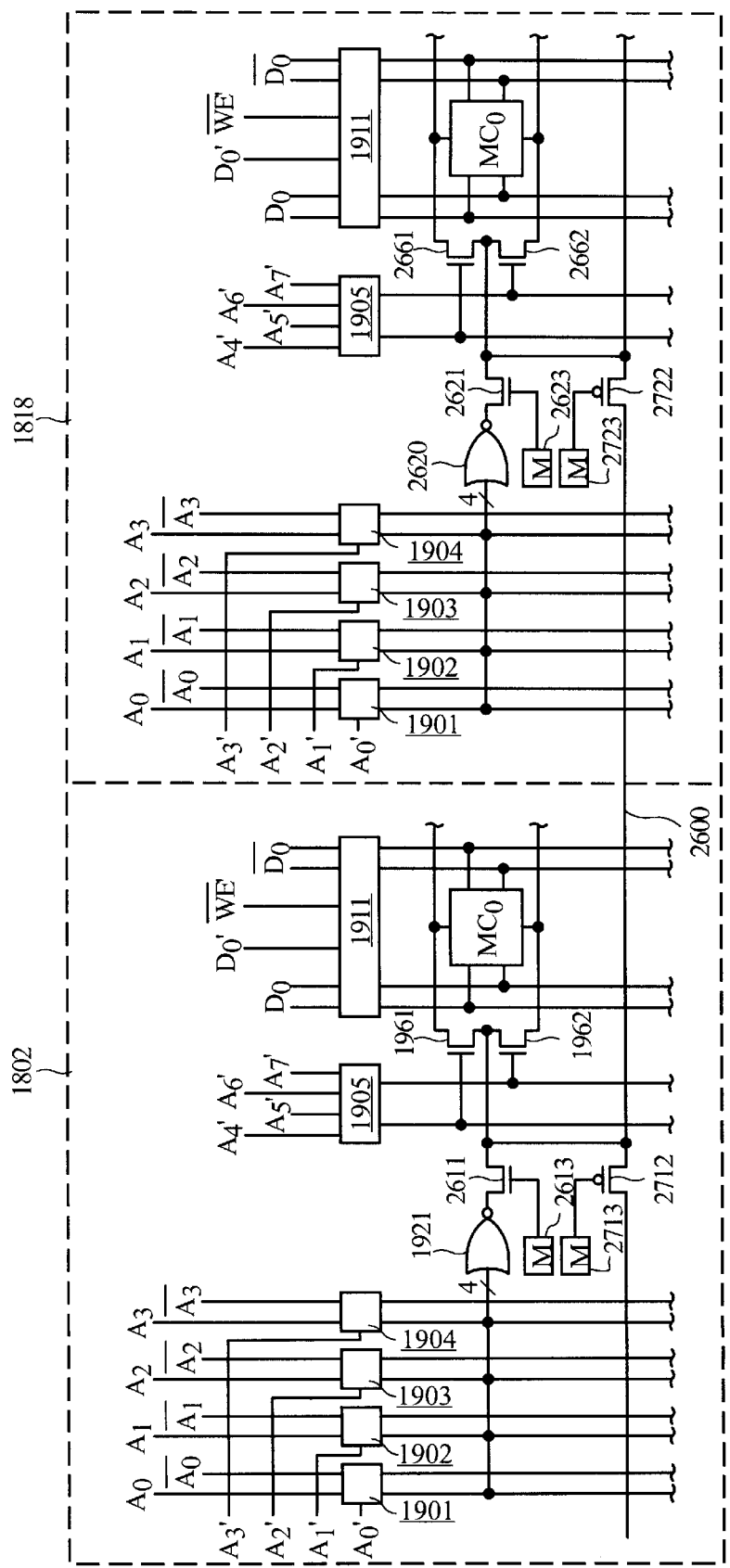
FIG. 27 is a schematic diagram illustrating portions of horizontally adjacent memory tiles which enable horizontal memory expansion in accordance with an alternative embodiment of the invention.

FIG. 27 is a schematic diagram illustrating portions of memory tiles 1802 and 1818 in accordance with an alternative embodiment of the invention. Because the memory structures illustrated in FIGS. 26 and 27 are substantially identical, similar elements in FIGS. 26 and 27 are labeled with similar reference numbers. In the memory structure of FIG. 27, memory cells 2613 and 2623 are dedicated to controlling n-channel pass transistors 2611 and 2621, respectively. P-channel pass transistors 2612 and 2622 are replaced with n-channel pass transistors 2712 and 2722, respectively. Two additional configuration memory cells 2713 and 2723 are provided to control n-channel pass transistors 2712 and 2722, respectively.

The memory structure of FIG. 27 operates in the same manner as the memory structure of FIG. 26, with one notable exception. N-channel pass transistors 2611, 2621 2712 and 2723 of FIG. 27 are independently controlled by their associated configuration memory cells 2613, 2623, 2713 and 2723. As a result, either NOR gate 1921 or NOR gate 2620 can be selected to drive horizontal expansion line 2600. For example, if configuration memory cells 2613 and 2723 are programmed to store logic high values, and configuration memory cells 2713 and 2623 are programmed to store logic low values, then NOR gate 1921 will drive horizontal expansion line 2600 (and the common node of transistors 2661 and 2662) in the manner previously described in connection with FIG. 26.

However, if configuration memory cells 2613 and 2723 are programmed to store logic low values, and configuration memory cells 2713 and 2623 are programmed to store logic high values, then NOR gate 2623 will drive horizontal expansion line 2600 (and the common node of transistors 1961 and 1962). Thus, the structure of FIG. 27 allows horizontal expansion line 2600 to be driven in two directions (i.e., from right-to-left or from left-to-right). The structure of FIG. 27 therefore simplifies signal routing within the composable RAM array. This structure also adds some redundancy to the composable RAM array, such that even if the address bit selection circuits 1901–1904 of memory tile 1802 are defective, horizontal expansion can be achieved by driving horizontal expansion line 2600 with NOR gate 2620.

Figure 28:
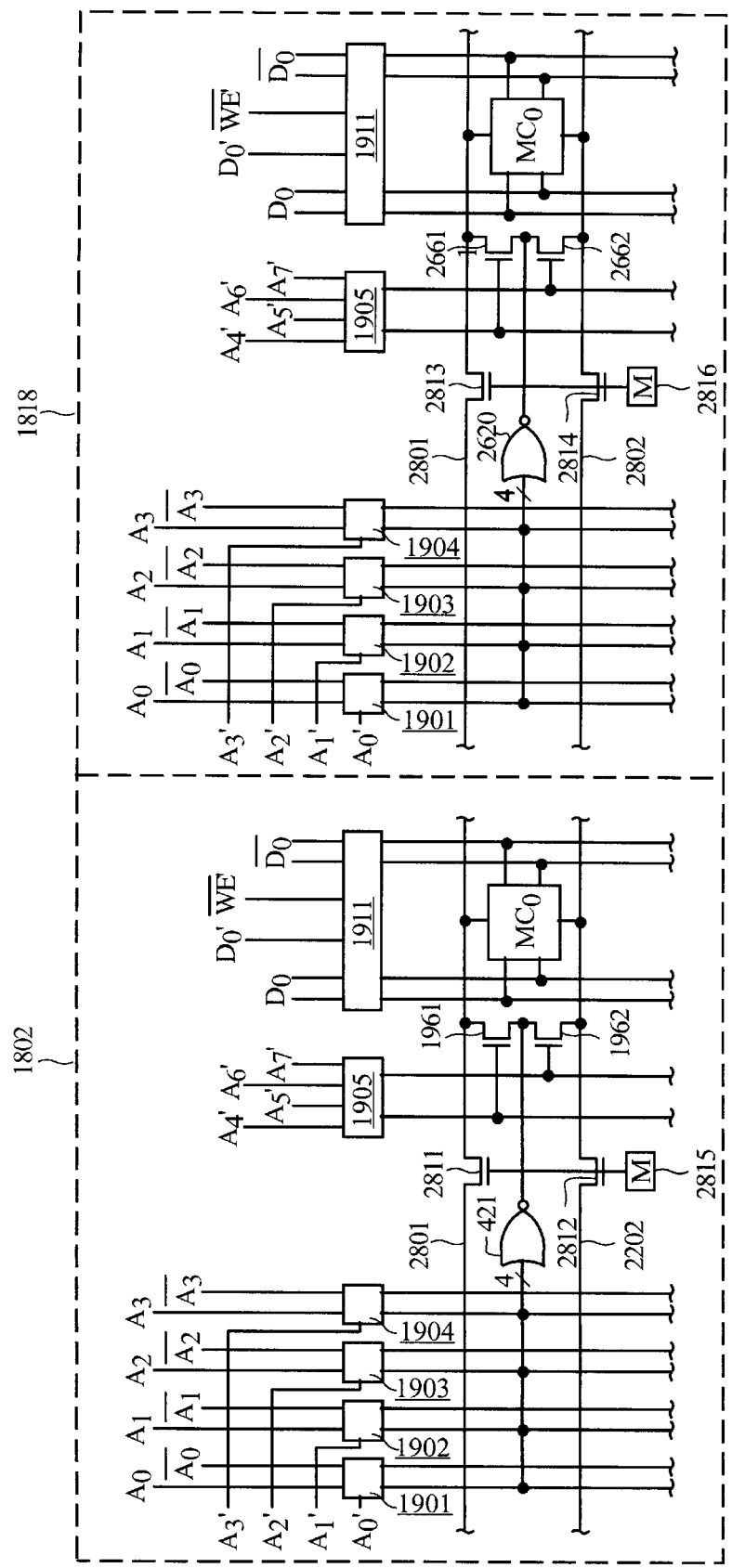
FIG. 28 is a schematic diagram illustrating portions of horizontally adjacent memory tiles which enable horizontal memory expansion in accordance with yet another embodiment of the invention.

FIG. 28 is a schematic diagram illustrating portions of memory tiles 1802 and 1818 in accordance with an alternative embodiment of the invention. Because the memory structures illustrated in FIGS. 26 and 28 are similar, similar elements in FIGS. 26 and 28 are labeled with similar reference numbers. In the memory structure of FIG. 28, word lines 2801 and 2802 extend across horizontally adjacent memory tiles 1802 and 1818. N-channel pass transistors 2811 and 2813 are located along word line 2801, and n-channel pass transistors 2812 and 2814 are located along word line 2802. The configuration data value stored in memory cell 2815 controls pass transistors 2811 and 2812. Similarly, the configuration data value stored in memory cell 2816 controls pass transistors 2813 and 2814.

The memory structure of FIG. 28 operates as follows. First, one of the memory tiles 1802 and 1818 is selected to receive address signals (e.g., address signals $A_0'$–$A_7'$). Even if there are more than two horizontally adjacent memory tiles, only one of these memory tiles needs to be selected to receive address signals. For example, memory tile 1818 can be selected to receive address signals $A_7'$–$A_0'$. These address signals $A_7'$–$A_0'$ have been described above in connection with FIGS. 18–27. In this example, the memory tile selection circuit 1905 in memory tile 1818 is programmed with the desired configuration address. In addition, one of the configuration memory cells 2106–2107 in this memory tile selection circuit 1905 is programmed in the manner described above in connection with FIG. 21. In the described example, configuration memory cell 2106 is programmed, thereby causing the port select line coupled to the gate of transistor 2661 to be enabled. Because configuration memory cell 2107 is not programmed, the port select line coupled to the gate of transistor 2662 is disabled. As a result, when the address signals $A_7'$–$A_4'$ match the programmed configuration address, a logic high signal is applied to the gate of transistor 2662. At this time, NOR gate 2620 drives word line 2801.

Memory cell 2616 is programmed to provide a logic high signal to the gate electrodes of transistors 2813 and 2814. As a result, the signal provided by NOR gate 2620 is routed from memory tile 1818 to memory tile 1802 on word line 2801. Note that word lines 2801 and 2802 are continuous between memory tiles 1802 and 1818. Neither of the configuration memory cells 2106–2107 present in the memory tile selection circuit 1905 of memory tile 1802 is programmed. As a result, the gates of transistors 1961 and 1962 are left floating, thereby turning off transistors 1961 and 1962. Word lines 2801 and 2802 are thereby isolated from the output terminal of NOR gate 1921. The memory cells located in memory tiles 1802 and 1818 are driven by the output of NOR gate 2620. The desired data values are applied to (or read from) both memory tiles 1802 and 1818.

Configuration memory cell 2815 can be programmed, thereby turning on transistors 2811 and 2812 and enabling further horizontal expansion to the left of memory tile 1802. Alternatively, configuration memory cell 2815 can be unprogrammed, thereby turning off transistors 2811 and 2812, and stopping the leftward horizontal expansion at memory tile 1802. Horizontal expansion can also extend to memory tiles located to the right of memory tile 1818 by programming these memory tiles in the same manner as described above for memory tile 1802.

Although the invention has been described in connection with several embodiments, it is understood that this invention is not limited to the embodiments disclosed, but is capable of various modifications which would be apparent to a person skilled in the art. For example, the present invention is applicable to multipliers which use different numbers of bits, as well as different types of multiplication algorithms (e.g., Booth's Algorithm). In other embodiments, multiplier tiles can be replaced with divider tiles that perform a division operation. Thus, the invention is limited only by the following claims.

What is claimed is:

1. A programmable logic device comprising:

an array of configurable logic elements (CLEs);

an array of dedicated function blocks; and programmable interconnect resources for selectively coupling each of the dedicated function blocks to a corresponding one of the CLEs and to adjacent dedicated function blocks.

2. The programmable logic device of claim 1, further comprising programmable interconnect resources for selectively coupling the CLEs.

3. The programmable logic device of claim 1, wherein the programmable interconnect resources comprise a plurality of programmable multiplexers for selectively connecting or isolating the dedicated function blocks and the corresponding CLEs.

4. The programmable logic device of claim 1, wherein the programmable interconnect resources comprise a plurality of programmable multiplexers for selectively connecting or isolating adjacent dedicated function blocks.

5. The programmable logic device of claim 1, wherein each of the CLEs comprises:

a programmable function generator; and a programmable carry logic circuit.

6. A method of operating a programmable logic device, the method comprising the steps of:

providing an array of configurable logic elements (CLEs) and an array of dedicated function blocks;

selectively coupling a first set of the dedicated function blocks to form a circuit;

coupling a first subset of dedicated function blocks within the first set of dedicated function blocks to a first subset of associated CLEs;

routing signals from the first subset of CLEs to the first subset of dedicated function blocks;

coupling a second subset of dedicated function blocks within the first set of dedicated function blocks to a second subset of associated CLEs; and routing signals from second subset of dedicated function blocks to the second subset of CLEs.

7. The programmable logic device of claim 1, wherein each of the CLEs comprises a programmable function generator and a register.

\* \* \* \* \*